(12) United States Patent
Steudel et al.

(10) Patent No.: US 8,981,354 B2
(45) Date of Patent: Mar. 17, 2015

(54) ORGANIC LIGHT-EMITTING POLYMER AND DEVICE

(75) Inventors: Annette Steudel, Cambridge (GB); Richard Owoare, London (GB)

(73) Assignees: Cambridge Display Technology Limited, Cambridgeshire (GB); Sumitomo Chemical Company Limited, Tokyo (JP)

( * ) Notice: Subject to any disclaimer, the term of this patent is extended or adjusted under 35 U.S.C. 154(b) by 2 days.

(21) Appl. No.: 13/698,047

(22) PCT Filed: May 12, 2011

(86) PCT No.: PCT/GB2011/000737
§ 371 (c)(1),
(2), (4) Date: Feb. 27, 2013

(87) PCT Pub. No.: WO2011/141714
PCT Pub. Date: Nov. 17, 2011

(65) Prior Publication Data
US 2013/0146852 A1    Jun. 13, 2013

(30) Foreign Application Priority Data

May 14, 2010 (GB) .................................. 1008095.0

(51) Int. Cl.
*H01L 35/24* (2006.01)
*H01L 51/00* (2006.01)
(Continued)

(52) U.S. Cl.
CPC ........ *H01L 51/0035* (2013.01); *H01L 51/0043* (2013.01); *H01L 51/56* (2013.01);
(Continued)

(58) Field of Classification Search
CPC ............ H01L 51/0541; H01L 51/0545; H01L 51/0036; B82Y 10/00
USPC .............................................. 257/40, E51.001
See application file for complete search history.

(56) References Cited

U.S. PATENT DOCUMENTS

| 4,539,507 A | 9/1985 | VanSlyke et al. |
| 5,150,006 A | 9/1992 | Van Slyke et al. |

(Continued)

FOREIGN PATENT DOCUMENTS

| CN | 1743406 A | 3/2006 |
| EP | 0 880 303 A1 | 11/1998 |

(Continued)

OTHER PUBLICATIONS

Bernius et al., "Progress with Light-Emitting Polymers," *Adv. Mat.*, 12(23):1737-1750 (2000).

(Continued)

*Primary Examiner* — Anthony Ho
(74) *Attorney, Agent, or Firm* — Marshall, Gerstein & Borun LLP

(57) ABSTRACT

Light-emitting and/or charge transporting polymers, methods of making the same, and organic light emitting devices comprising such polymers, the polymers comprising a repeat unit of formula (I):

$$-(Ar)_q\text{-Sp-CT-Sp-}(Ar)_q- \quad (I)$$

in which CT represents a conjugated charge-transporting group, each Ar independently represents an optionally substituted aryl or heteroaryl group, q is at least 1, and each Sp independently represents a spacer group forming a break in conjugation between Ar and CT.

22 Claims, 1 Drawing Sheet

(51) Int. Cl.
*H01L 51/56* (2006.01)
*H01L 51/50* (2006.01)

(52) U.S. Cl.
CPC ......... *H01L51/0085* (2013.01); *H01L 51/5012* (2013.01); *H01L 51/5016* (2013.01); *H01L 51/5048* (2013.01); *H01L 2251/552* (2013.01)
USPC .................................. 257/40; 257/E51.001

(56) References Cited

U.S. PATENT DOCUMENTS

| | | | |
|---|---|---|---|
| 5,432,014 | A | 7/1995 | Sano et al. |
| 5,723,873 | A | 3/1998 | Yang |
| 5,798,170 | A | 8/1998 | Zhang et al. |
| 6,083,634 | A | 7/2000 | Shi |
| 6,268,072 | B1 | 7/2001 | Zheng et al. |
| 6,268,695 | B1 | 7/2001 | Affinito |
| 6,953,628 | B2 | 10/2005 | Kamatani et al. |
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 7,238,435 | B2 | 7/2007 | Kamatani et al. |
| 7,527,879 | B2 | 5/2009 | Kamatani et al. |
| 2002/0117662 | A1 | 8/2002 | Nii |
| 2002/0182441 | A1 | 12/2002 | Lamansky et al. |
| 2004/0189190 | A1 | 9/2004 | Suzuri et al. |
| 2005/0187411 | A1 | 8/2005 | Herron et al. |
| 2008/0315757 | A1 | 12/2008 | McKiernan et al. |
| 2009/0066238 | A1 | 3/2009 | Chen et al. |
| 2009/0227765 | A1 | 9/2009 | Towns et al. |
| 2010/0013377 | A1 | 1/2010 | Male et al. |

FOREIGN PATENT DOCUMENTS

| | | |
|---|---|---|
| EP | 0 901 176 A2 | 3/1999 |
| EP | 0 947 123 A1 | 10/1999 |
| EP | 0 949 850 A1 | 10/1999 |
| EP | 1 245 659 A1 | 10/2002 |
| GB | 2 348 316 A | 9/2000 |
| GB | 2 456 298 A | 7/2009 |
| GB | 2 463 077 A | 3/2010 |
| JP | 2002-324679 A | 11/2002 |
| TW | I265968 | 11/2006 |
| WO | WO-90/13148 A1 | 11/1990 |
| WO | WO-98/10621 A1 | 3/1998 |
| WO | WO-98/57381 A1 | 12/1998 |
| WO | WO-99/54385 A1 | 10/1999 |
| WO | WO-00/48258 A1 | 8/2000 |
| WO | WO-00/53656 A1 | 9/2000 |
| WO | WO-01/19142 A1 | 3/2001 |
| WO | WO-01/81649 A1 | 11/2001 |
| WO | WO-02/31896 A2 | 4/2002 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/018653 A1 | 3/2003 |
| WO | WO-03/022908 A1 | 3/2003 |
| WO | WO-2005/013386 A2 | 2/2005 |
| WO | WO-2005/049689 A2 | 6/2005 |
| WO | WO-2006/043681 A1 | 4/2006 |
| WO | WO-2008/025997 A1 | 3/2008 |
| WO | WO-2010/013006 A2 | 2/2010 |

OTHER PUBLICATIONS

Chen et al., "Recent Developments in Molecular Organic Electroluminescent Materials," *Macromol. Sym.*, 125:1-48 (1997).

Kreyenschmidt et al., "Thermally Stable Blue-Light-Emitting Copolymers of Poly(alkylfluorene)," *Macromolecules*, 31(4):1099-1103 (1998).

Lo et al., "Blue Phosphorescence from Iridium(III) Complexes at Room Temperature," *Chem. Mater.*, 18(21):5119-5129 (2006).

Michaelson, "The work function of the elements and its periodicity", *J. Applied Physics*, 48(11):4729-4733 (1977).

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

Shirota et al., "Charge Carrier Transporting Molecular Materials and Their Applications in Devices," *Chem. Rev.*, 107(4):953-1010 (2007).

Tokito et al., "Metal oxides as a hole-injecting layer for an organic electroluminescent device", *J. Phys. D: Appl. Phys.*, 29:2750-2753 (1996).

Yamaguchi et al., "Effects of B and C on the Ordering of L10-CoPt Thin Films," *Appl. Phys. Lett.*, 79(5):2001-2003 (2001).

Yamamoto, "Electrically Conducting and Thermally Stable π-Conjugated Poly(Arylene)s Prepared by Organometallic Processes," *Prog. Polym. Sci.*, 17:1153-1205 (1993).

International Preliminary Report on Patentability for Application No. PCT/GB2011/000737, dated Nov. 20, 2012.

International Search Report and Written Opinion for Application No. PCT/GB2011/000737, dated Aug. 4, 2011.

Search Report for Application No. GB1008095.0, dated Sep. 27, 2010.

ORGANIC LIGHT-EMITTING POLYMER AND DEVICE

SUMMARY OF THE INVENTION

This invention relates to light-emitting and/or charge transporting polymers, methods of making the same and organic light emitting devices comprising said polymers.

BACKGROUND OF THE INVENTION

Electronic devices comprising active organic materials are attracting increasing attention for use in devices such as organic light emitting diodes, organic photovoltaic devices, organic photosensors, organic transistors and memory array devices. Devices comprising organic materials offer benefits such as low weight, low power consumption and flexibility. Moreover, use of soluble organic materials allows use of solution processing in device manufacture, for example inkjet printing or spin-coating.

A typical organic light-emissive device ("OLED") is fabricated on a glass or plastic substrate coated with a transparent anode such as indium-tin-oxide ("ITO"). A layer of a thin film of at least one electroluminescent organic material is provided over the first electrode. Finally, a cathode is provided over the layer of electroluminescent organic material. Charge transporting, charge injecting or charge blocking layers may be provided between the anode and the light-emitting layer and/or between the cathode and the light-emitting layer.

In operation, holes are injected into the device through the anode and electrons are injected into the device through the cathode. The holes and electrons combine in the organic light-emitting layer to form an excitons which then undergo radiative decay to give light.

In WO90/13148 the organic light-emissive material is a conjugated polymer such as poly(phenylenevinylene). In U.S. Pat. No. 4,539,507 the organic light-emissive material is of the class known as small molecule materials, such as tris-(8-hydroxyquinoline) aluminium ("Alq$_3$").

WO 99/54385 discloses polymers comprising triphenylamine repeat units and fluorene repeat units.

US 2005/187411 discloses amine-containing charge-transporting materials.

OLEDs have great potential for display and lighting applications. However, there remains a need to improve performance of these devices.

SUMMARY OF THE INVENTION

In a first aspect, the invention provides a polymer comprising a repeat unit of formula (I):

$$—(Ar)_q\text{-Sp-CT-Sp-}(Ar)_q— \qquad (I)$$

wherein CT represents a conjugated charge-transporting group; each Ar independently represents an optionally substituted aryl or heteroaryl group; each q is independently at least 1; and each Sp independently represents a spacer group forming a break in conjugation between Ar and CT.

Optionally, CT represents a hole-transporting group.

Optionally, CT represents an optionally substituted arylamine group.

Optionally, CT represents an optionally substituted repeat unit of formula (V):

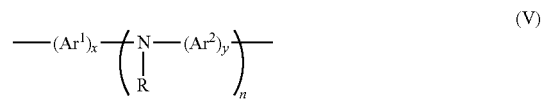

wherein $Ar^1$ and $Ar^2$ in each occurrence are independently selected from optionally substituted aryl or heteroaryl groups, n is greater than or equal to 1, preferably 1 or 2, R in each occurrence is independently selected from H or a substituent, preferably a substituent, x and y are each independently 1, 2 or 3 and any of $Ar^1$, $Ar^2$ and R may be linked by a direct bond or a divalent linking group.

Optionally, CT represents an electron-transporting group.

Optionally, CT comprises a heteroaryl group with high electron affinity (in particular 3 eV or higher, preferably 3.2 eV or higher) and high ionisation potential (in particular 5.8 eV or higher).

Optionally, CT represents a compound of formula (II): formula (II):

wherein $Ar^1$ and $Ar^2$ are the same or different and are as described above; each r is independently at least 1, preferably 1-3, and Het represents an optionally substituted heteroaryl group with high electron affinity and high ionisation potential, preferably triazine or oxadiazole.

Optionally, each Sp independently represents an alkyl chain wherein one or more non-adjacent C atoms may be replaced with O, S, N, C=O and —COO— and wherein one or more H atoms may be replaced with F, and wherein one or more non-terminal carbon atoms in the alkyl chain may be replaced with optionally substituted arylene or heteroarylene.

Optionally, each Ar independently represents optionally substituted phenylene, fluorene or pyridine.

Optionally, the polymer comprises a repeat unit of formula (Ia):

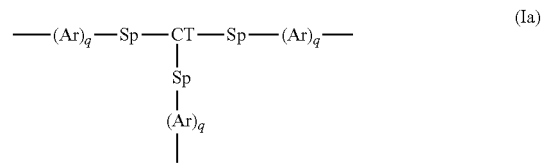

Optionally, the polymer comprises a repeat unit having at least three linking positions, the repeat unit not being a repeat unit according to formula (I).

In a second aspect the invention provides a composition comprising a polymer according to the first aspect and at least one light-emitting dopant.

In one arrangement, the at least one light-emitting dopant may be chemically bound to the polymer.

In another arrangement, the at least one light-emitting dopant may be bound in the main chain of the polymer or bound as a side group or end group of the polymer.

In a third aspect, the invention provides a composition comprising a solvent and a polymer according to the first aspect or a polymer composition according to the second aspect.

In a fourth aspect the invention provides an organic light-emitting device comprising an anode, a cathode and a light-emitting layer between the anode and cathode, wherein the light-emitting layer comprises a composition according to the second aspect.

In a fifth aspect the invention provides an organic light-emitting device comprising an anode, a cathode a light-emitting layer between the anode and cathode, and at least one charge transporting layer between the anode and cathode, wherein the at least one charge transporting layer comprises a polymer according to the first aspect In a sixth aspect the invention provides a method of forming an organic light-emitting device according to the fourth or fifth aspect comprising the steps of depositing the composition according to the third aspect and evaporating the solvent.

In a seventh aspect the invention provides a monomer of formula (Ib):

$$CT{-}(Sp{-}(Ar)_q{-}X)_p \quad (Ib)$$

wherein CT represents a conjugated charge-transporting group; each Ar independently represents an optionally substituted aryl or heteroaryl group; each q is independently at least 1; p is at least 2; each X independently represents a group suitable for metal-insertion reaction; and each Sp represents a spacer group forming a break in conjugation between Ar and CT.

Optionally according to the seventh aspect, each X is independently selected from halogen, boronic acid, optionally substituted boronic ester and optionally substituted sulfonic acid ester.

Optionally according to the seventh aspect, the terminal Ar group bound to X is substituted.

In an eighth aspect the invention provides a method of forming a polymer according to the first aspect comprising the step of polymerising a monomer according to the seventh aspect.

Optionally, the method comprises the step of polymerising two monomers of formula (Ib) wherein at least one of CT, Sp and (Ar)q are different between the two monomers.

Optionally, CT is different between the two monomers.

Optionally, the monomer is polymerised with an optionally substituted arylene or heteroarylene comonomer, preferably a comonomer comprising phenyl substituted with one or more alkyl groups.

"Aryl" and "heteroaryl" as used herein includes both fused and unfused aryl and heteroaryl groups respectively.

DETAILED DESCRIPTION OF THE INVENTION

Figure 1:
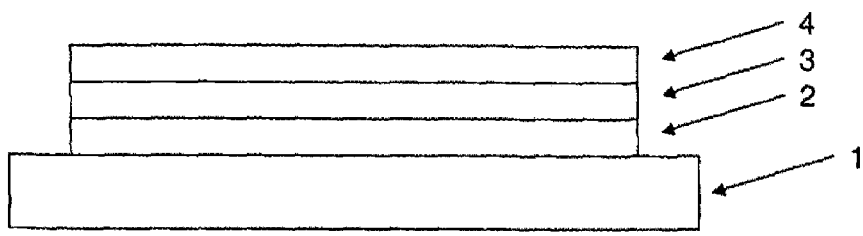
FIG. 1 illustrates an organic light-emitting device according to an embodiment of the invention.

FIG. 1 illustrates the structure of an OLED according to an embodiment of the invention. The OLED comprises a transparent glass or plastic substrate 1, an anode 2, a cathode 4 and a light-emitting layer 3 provided between anode 2 and the cathode 4. Further layers may be located between anode 2 and the cathode, such as charge transporting, charge injecting or charge blocking layers.

Light-emitting layer 3 may be patterned or unpatterned. A device comprising an unpatterned layer may be used as an illumination source, for example. A white light emitting device is particularly suitable for this purpose. A device comprising a patterned layer may be, for example, an active matrix display or a passive matrix display. In the case of an active matrix display, a patterned light-emitting layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

The polymer of the present invention may be provided in light-emitting layer 3. Additionally or alternatively, the polymer of the invention may be provided as a hole transporting polymer in a hole transporting layer of the device or as an electron transporting polymer in the electron transporting layer of the device. It will be appreciated that the suitability of the polymer for use in a hole or electron transporting layer will depend on the nature of the polymer, and in particular its charge-transporting unit.

If the polymer is provided in light-emitting layer 3 then it may itself emit light or it may be used in combination with a fluorescent or phosphorescent light-emitting dopant.

In the case where the polymer is a hole-transporting polymer it preferably has a highest occupied molecular orbital (HOMO) level that is the same as or more negative than that of the light-emitting material. Optionally, the polymer in this case has a HOMO level greater than 5.1 eV or greater than 5.3 eV.

In the case where the polymer is an electron-transporting polymer then it preferably has a lowest unoccupied molecular orbital (LUMO) level that is the same as or less negative than that of the light-emitting material. Optionally, the polymer in this case has a LUMO level greater than 3 eV. HOMO and LUMO levels may be measured by cyclic voltammetry (CV). The working electrode potential is ramped linearly versus time. When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinium counter electrode (donor or acceptor of electrons) and a reference glass electrode no leak Ag/AgCl. Ferrocene is added in the cell at the end of the experiment for calculation purposes. (Measurement of the difference of potential between Ag/AgCl/ferrocene and sample/ferrocene).

Method and Settings:
3 mm diameter glassy carbon working electrode
Ag/AgCl/no leak reference electrode
Pt wire auxiliary electrode
0.1 M tetrabutylammonium hexafluorophosphate in acetonitrile
LUMO=4.8−ferrocene (peak to peak maximum average)+onset
Sample: 1 drop of 5 mg/mL in toluene spun @3000 rpm
LUMO (reduction) measurement:
A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline.

Co-polymerisation of a monomer comprising a conjugated charge-transport group with other conjugated groups, such as polymerisation of a triphenylamine monomer with fluorene as disclosed in WO 99/54385, results in conjugation of the charge-transport group with the conjugated co-repeat units which typically results in a lowering of both the excited state singlet energy level ($S_1$) and excited state triplet energy level ($T_1$)) of the polymer as compared to the charge transporting group alone. In the case where the polymer is used as a light-emitting polymer, this has the effect of red-shifting the polymer's colour of emission. In the case where the polymer is used as a charge-transporting host in combination with a light-emitting dopant, this has the effect of limiting the range of dopants that can be used; in the case of a fluorescent dopant the $S_1$ level of the host must be higher than that of the dopant, and in the case of a phosphorescent dopant the $T_1$ level of the host must be higher than that of the dopant. For example, for use as a host for phosphorescent emitters the polymer $T_1$ level must be >2.4 eV for phosphorescent green and >2.7 eV for phosphorescent blue.

By inclusion of a spacer group providing a conjugation break as per the present invention, the charge transporting unit is isolated from further conjugated units present in the polymer chain, thus preventing reduction of $S_1$ and $T_1$ levels of the polymer.

Charge Transporting Group

Suitable hole transporting groups are materials which have low ionisation potentials together with low electron affinities. Typically hole transport materials have a electron affinity of 2.9 eV or lower and an ionisation potential of 5.8 eV or lower, preferably 5.7 eV or lower. Suitable charge-transporting groups include groups disclosed in, for example, Shirota and Kageyama, Chem. Rev. 2007, 107, 953-1010 and include, for example, arylamines, in particular triarylamines; and heteroaromatics, including fused and oligomeric heteroaromatics such as oligothiophene or fused thiophenes.

Preferred hole transport groups include arylamine repeat units, in particular repeat units of formula (V):

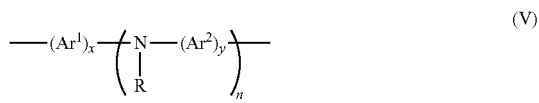

(V)

wherein $Ar^1$ and $Ar^2$ in each occurrence are independently selected from optionally substituted aryl or heteroaryl groups, n is greater than or equal to 1, preferably 1 or 2, R is H or a substituent, preferably a substituent, and x and y are each independently 1, 2 or 3.

R is preferably alkyl, $Ar^3$, or a branched or linear chain of $Ar^3$ groups, for example —$(Ar^3)_r$, wherein $Ar^3$ in each occurrence is independently selected from aryl or heteroaryl and r is at least 1, optionally 1, 2 or 3.

Any of $Ar^1$, $Ar^2$ and $Ar^3$ may independently be substituted with one or more substituents. Preferred substituents are selected from the group $R^3$ consisting of:

alkyl wherein one or more non-adjacent C atoms may be replaced with O, S, substituted N, C=O and —COO— and one or more H atoms of the alkyl group may be replaced with F or aryl or heteroaryl optionally substituted with one or more groups $R^4$, aryl or heteroaryl optionally substituted with one or more groups $R^4$, $NR^5_2$, $OR^5$, $SR^5$, fluorine, nitro and cyano;

wherein each $R^4$ is independently alkyl in which one or more non-adjacent C atoms may be replaced with O, S, substituted N, C=O and —COO— and one or more H atoms of the alkyl group may be replaced with F, and each $R^5$ is independently selected from the group consisting of alkyl and aryl or heteroaryl optionally substituted with one or more alkyl groups.

R may comprise a crosslinkable group, for example a group comprising a polymerisable double bond such and a vinyl or acrylate group, or a benzocyclobutane group.

Any of the aryl or heteroaryl groups in the repeat unit of Formula (V) may be linked by a direct bond or a divalent linking atom or group. Preferred divalent linking atoms and groups include O, S; substituted N; and substituted C.

Where present, substituted N or substituted C of $R^3$, $R^4$ or of the divalent linking group may independently in each occurrence be $NR^6$ or $CR^6_2$ respectively wherein $R^6$ is alkyl or optionally substituted aryl or heteroaryl. Optional substituents for aryl or heteroaryl groups $R^6$ may be selected from $R^4$ or $R^5$.

In one preferred arrangement, R is $Ar^3$ and each of $Ar^1$, $Ar^2$ and $Ar^3$ are independently and optionally substituted with one or more $C_{1-20}$ alkyl groups.

Particularly preferred units satisfying Formula 1 include units of Formulae 1-3:

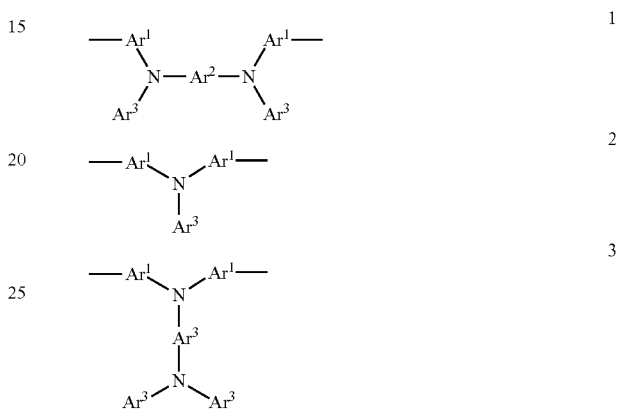

wherein $Ar^1$ and $Ar^2$ are as defined above; and $Ar^3$ is optionally substituted aryl or heteroaryl. Where present, preferred substituents for $Ar^3$ include substituents as described for $Ar^1$ and $Ar^2$, in particular alkyl and alkoxy groups.

$Ar^1$, $Ar^2$ and $Ar^3$ are preferably phenyl, each of which may independently be substituted with one or more substituents as described above.

In another preferred arrangement, aryl or heteroaryl groups of formula (V) are phenyl, each phenyl group being optionally substituted with one or more alkyl groups.

In another preferred arrangement, $Ar^1$, $Ar^2$ and $Ar^3$ are phenyl, each of which may be substituted with one or more $C_{1-20}$ alkyl groups, and r=1.

In another preferred arrangement, $Ar^1$ and $Ar^2$ are phenyl, each of which may be substituted with one or more $C_{1-20}$ alkyl groups, and R is 3,5-diphenylbenzene wherein each phenyl may be substituted with one or more alkyl groups.

In yet another preferred arrangement, $Ar^1$, $Ar^2$ and $Ar^3$ are phenyl, each of which may be substituted with one or more $C_{1-20}$ alkyl groups, r=1 and $Ar^1$ and $Ar^2$ are linked by an O or S atom.

Specific hole transporting units include the following:

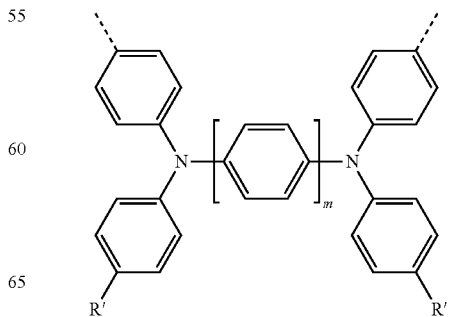

-continued
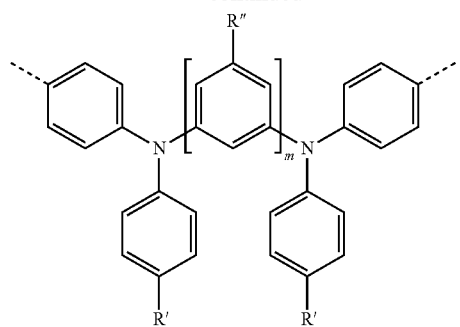
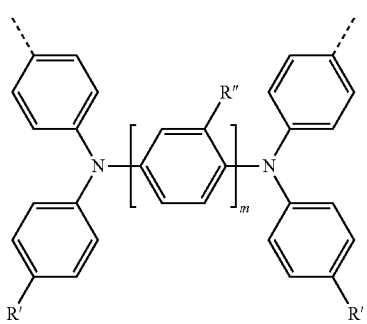
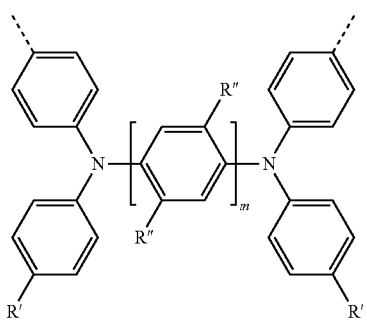
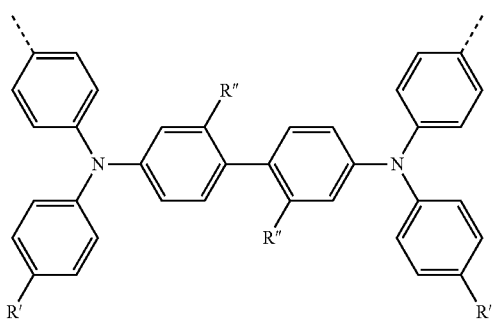
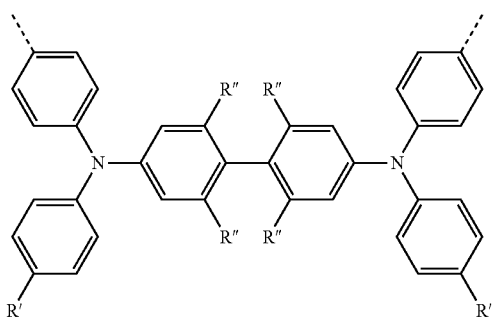
-continued
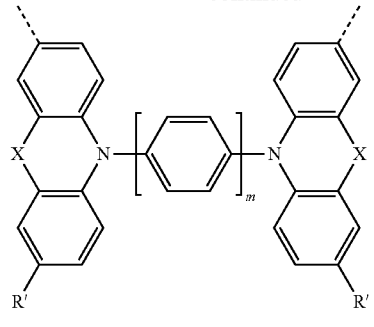
X = CR$_2$, NR, O, S
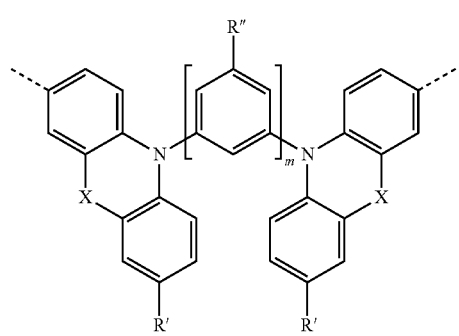
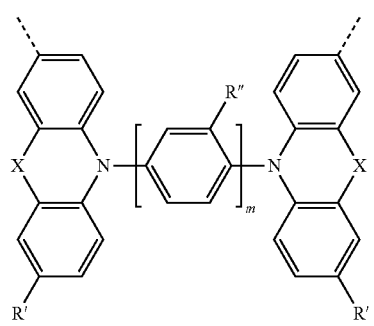
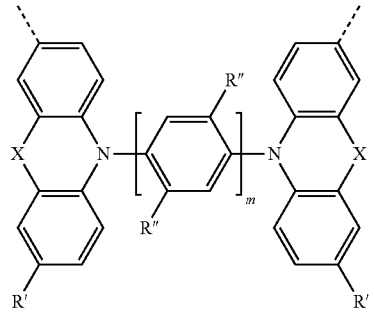
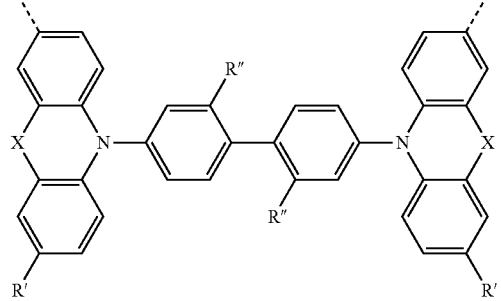

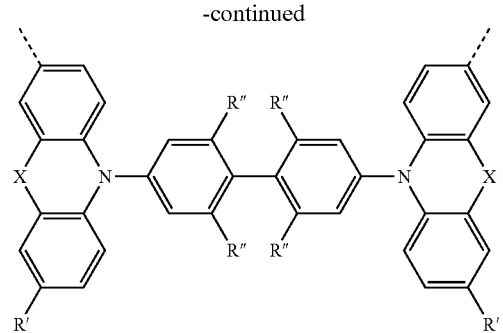
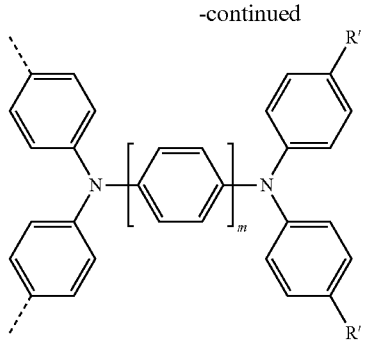
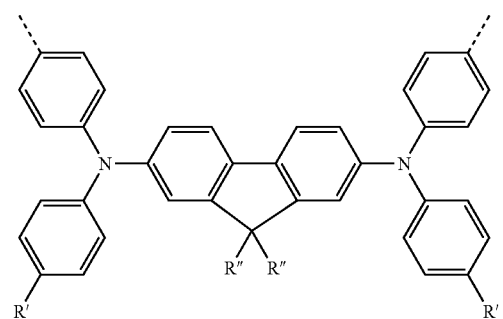
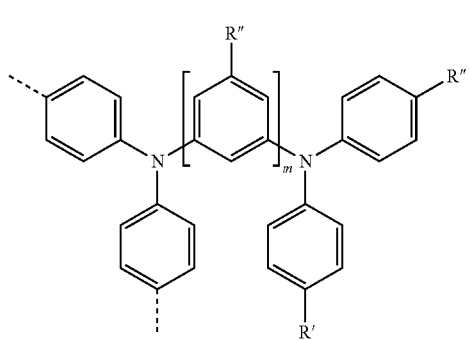
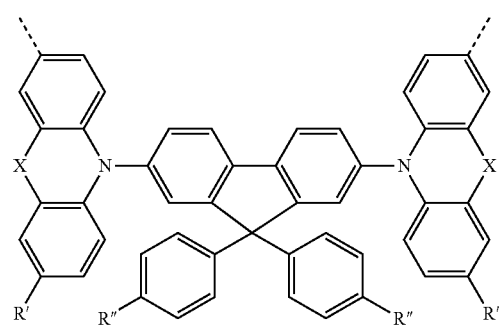
X = CR₂, NR, O, S
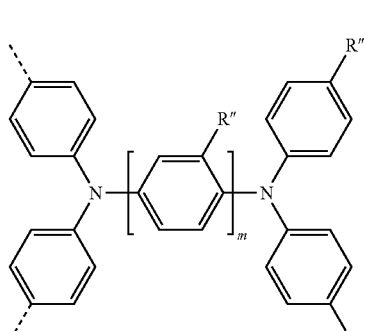
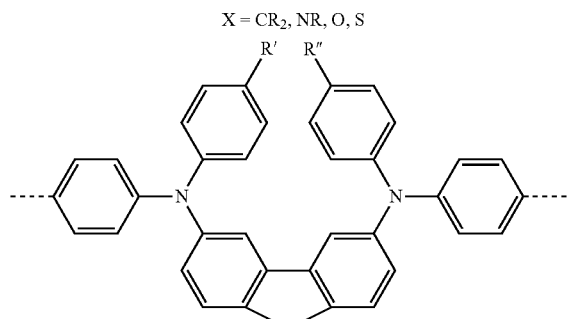
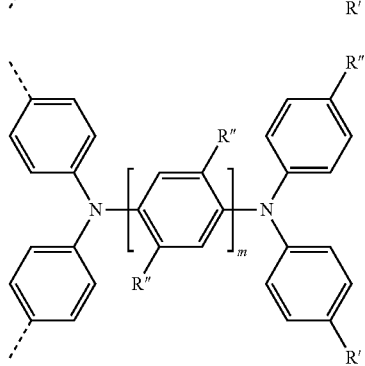
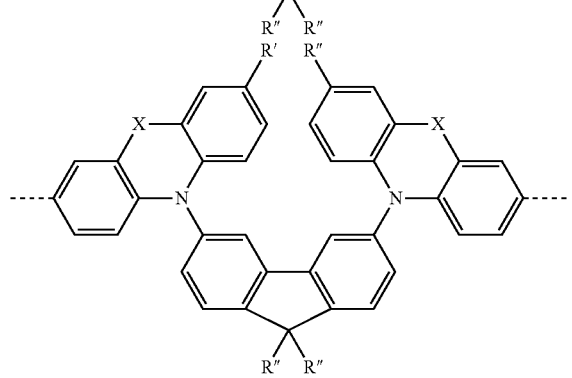
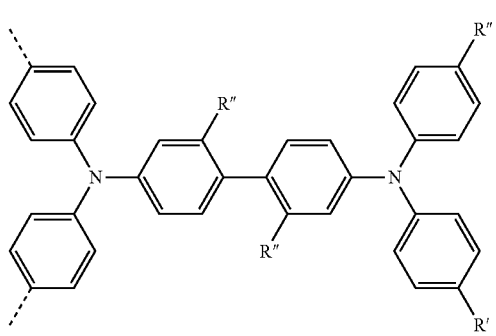

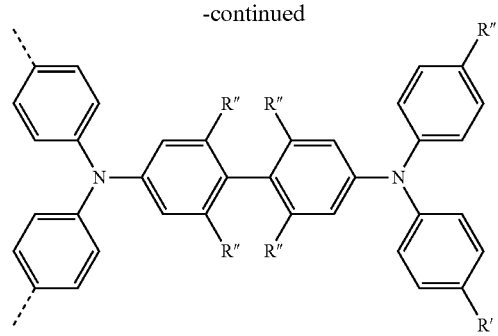
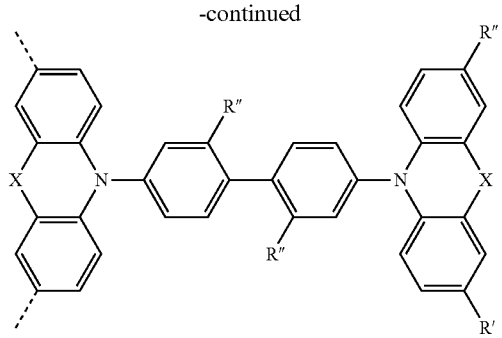
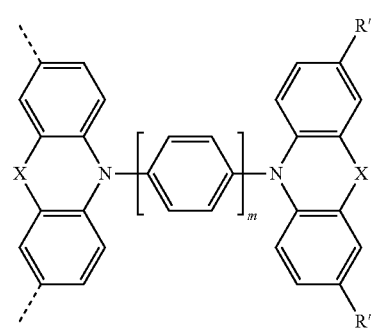
X = CR₂, NR, O, S
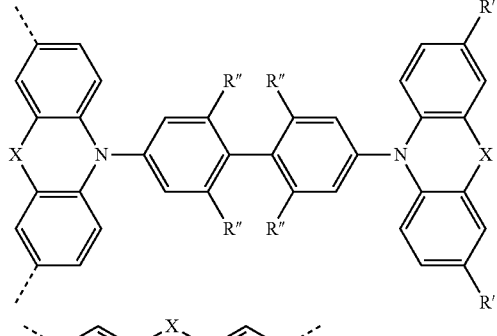
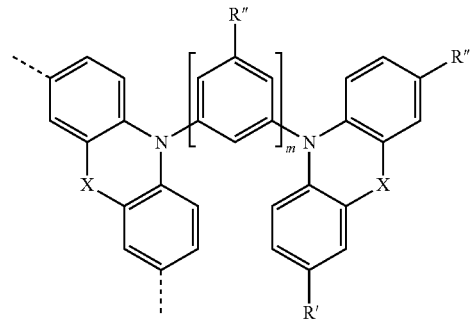
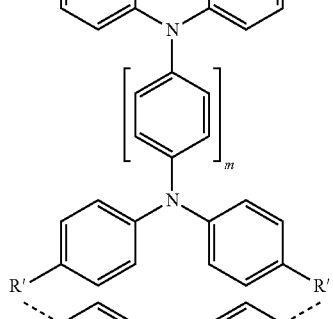
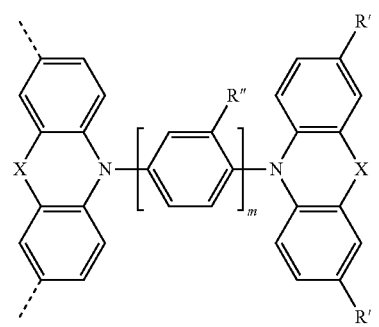
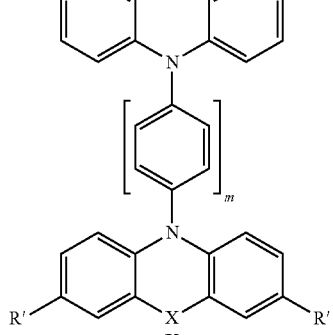
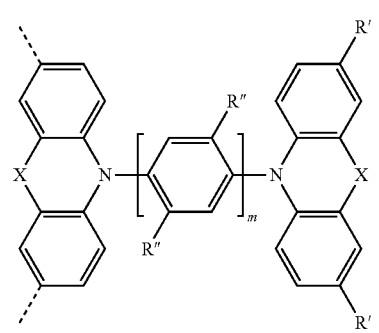
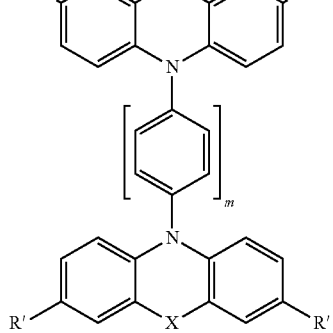

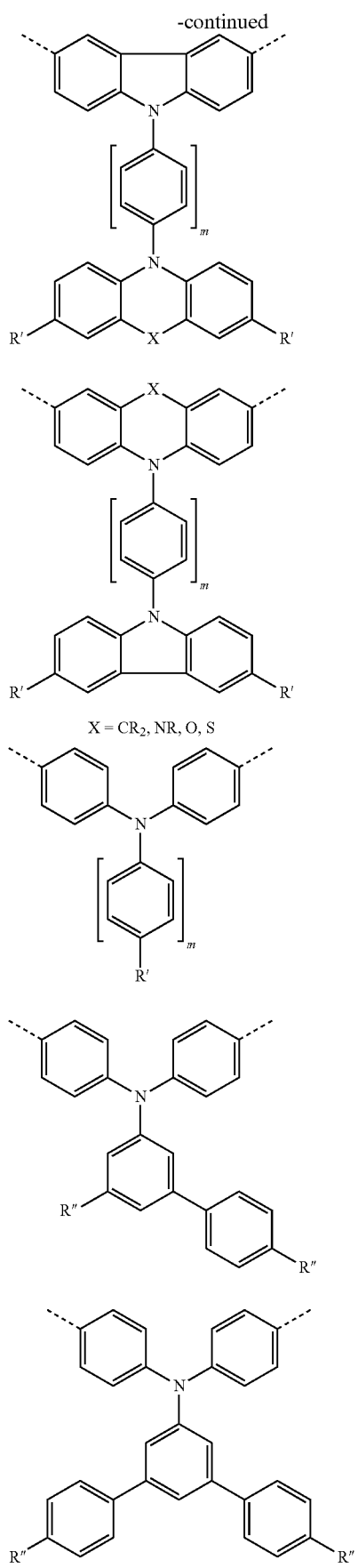
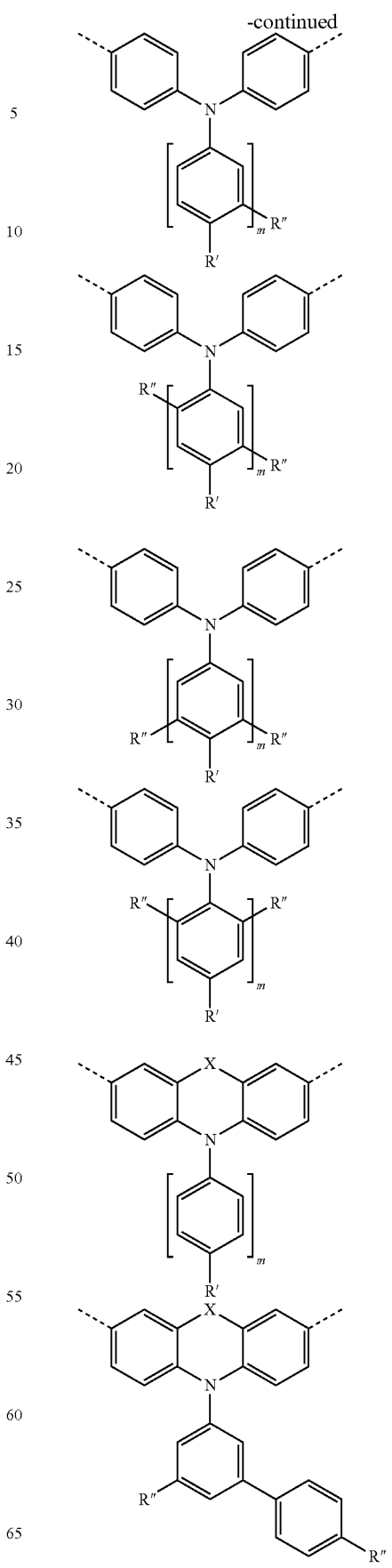

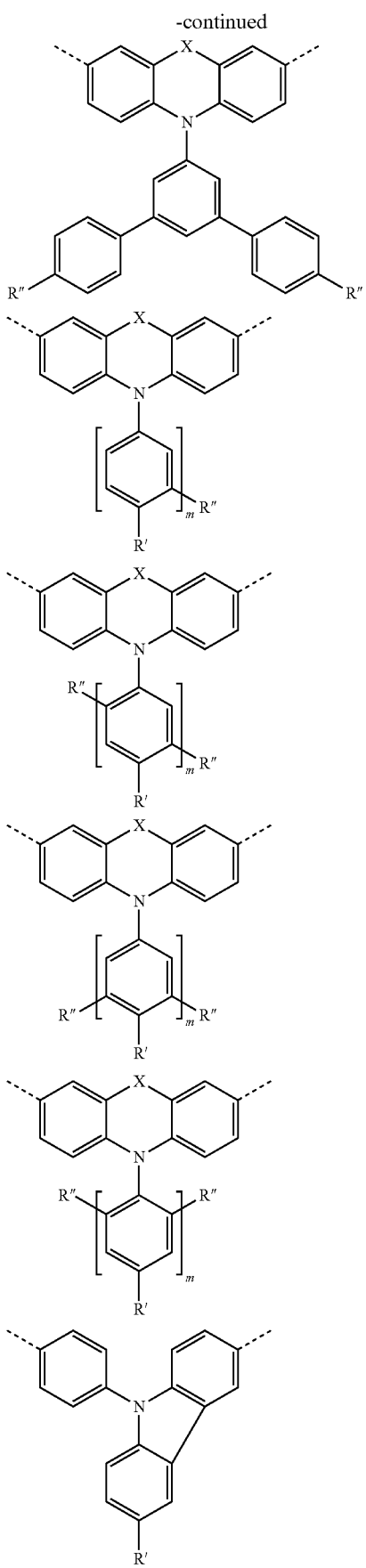

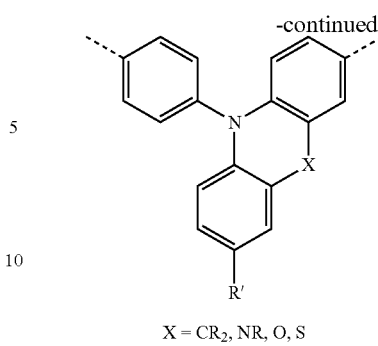

X = CR$_2$, NR, O, S wherein R' and R" in each occurrence independently represents aryl or heteroaryl optionally substituted with one or more substituents; or alkyl wherein one or more non-adjacent C atoms may be replaced with O, S, N, C=O and —COO— and m is 1 or 2. Preferred optional substituents in the case where R' or R" is aryl or heteroaryl is alkyl.

Suitable electron transport materials are materials which have high electron affinities together with high ionisation potentials. Typically electron transport materials have electron affinities of 3 eV or higher, preferably 3.2 eV or higher and ionisation potentials of 5.8 eV or higher. Suitable electron transport groups include groups disclosed in, for example, Shirota and Kageyama, Chem. Rev. 2007, 107, 953-1010.

Electron transport groups include groups comprising formula (II):

$$-(Ar^1)_r\text{-Het-}(Ar^2)_r-$$  (II)

wherein Ar$^1$ and Ar$^2$ are as defined above; r is at least 1, preferably 1-3, and Het represents an optionally substituted heteroaryl group with high electron affinity. Optional substituents for Het are as described with respect to R above. In the case where Het is substituted with an aryl or heteroaryl group, this may be a group —(Ar$^3$)r as described above.

Suitable heteroaryls with high electron affinity include triazine, pyrimidine, oxadiazole, pyridine, triazole, triarylborane, sulfoxide and silole. Exemplary electron-transporting groups include the following:

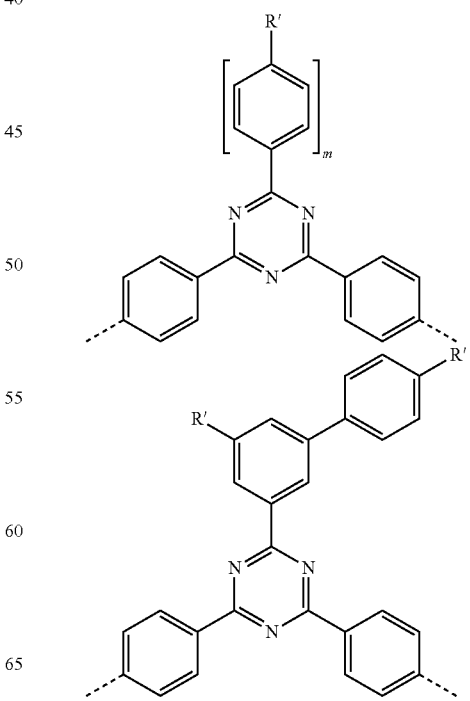

17
-continued
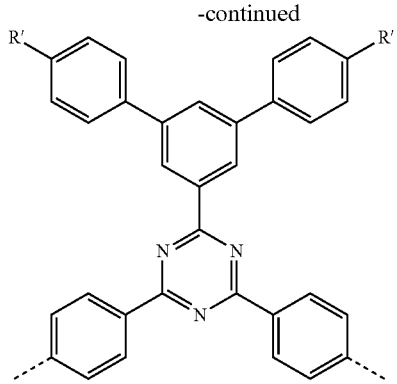
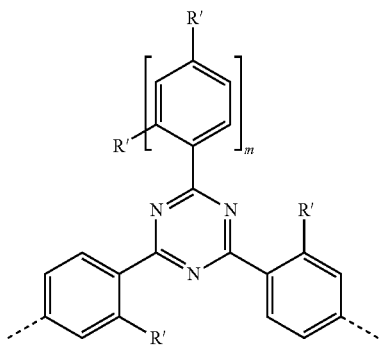
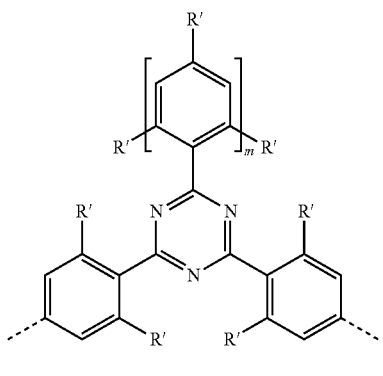
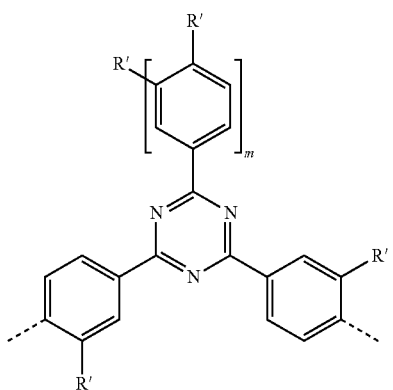
18
-continued
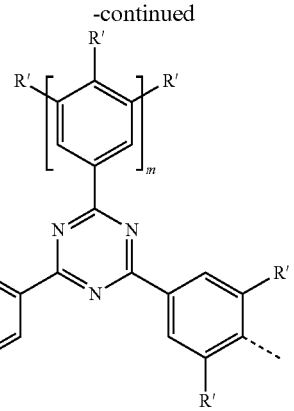
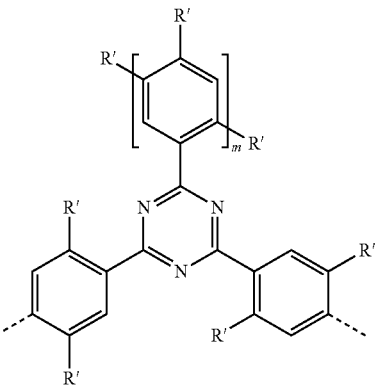
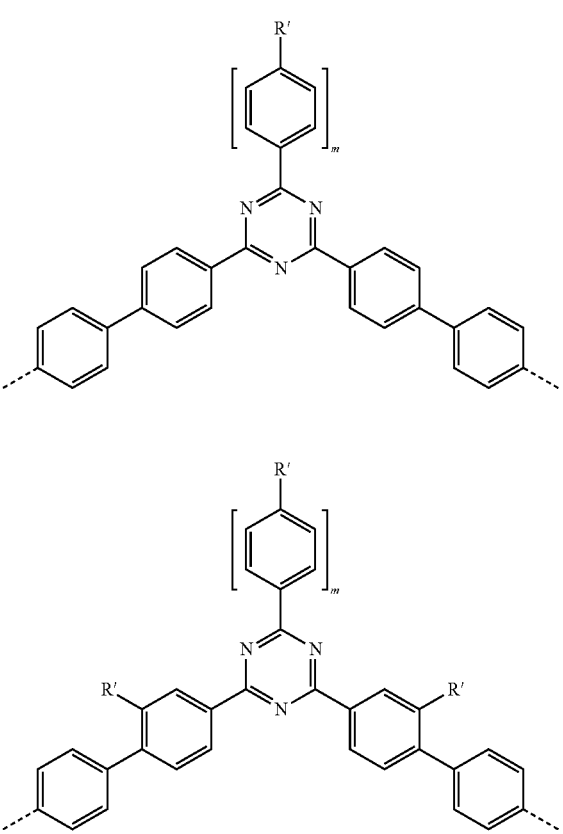

-continued
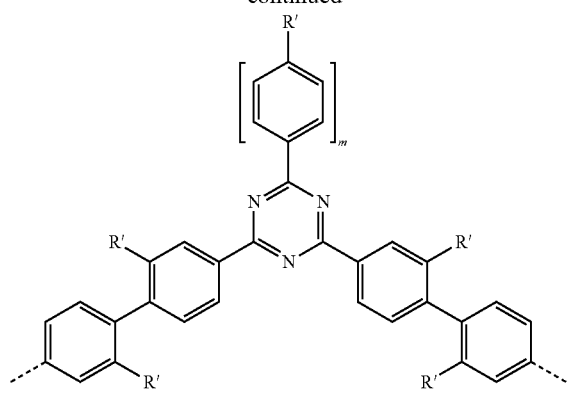
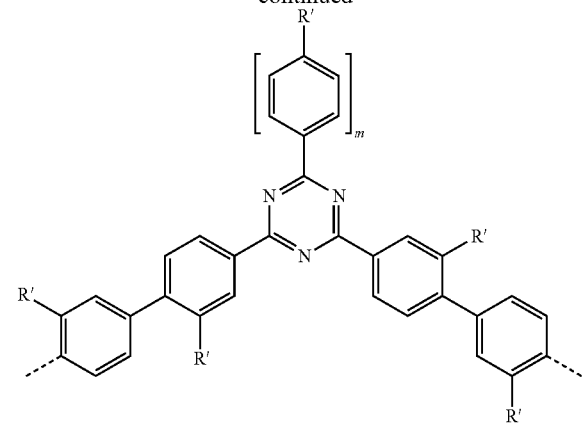
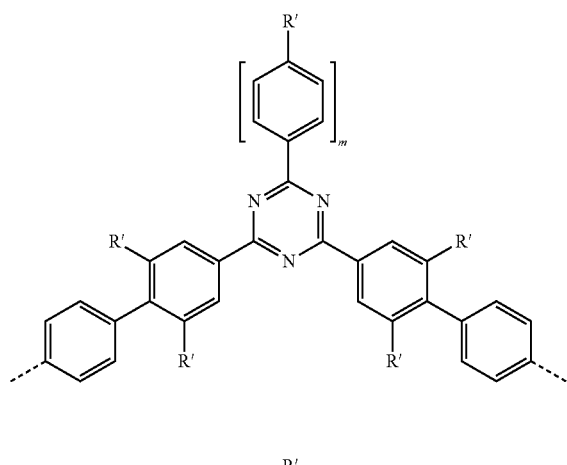
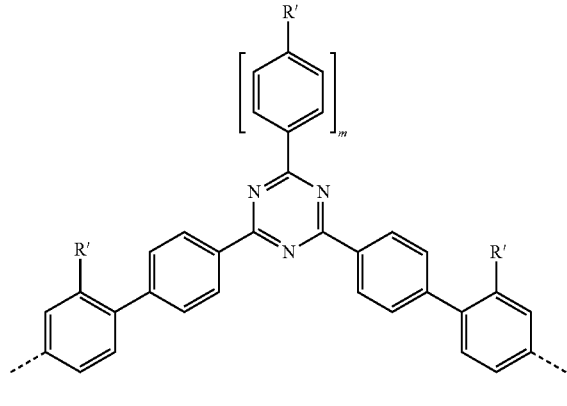
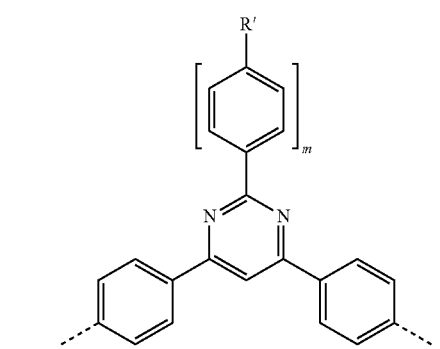
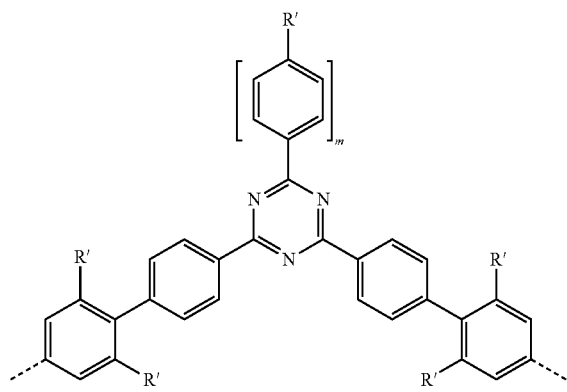
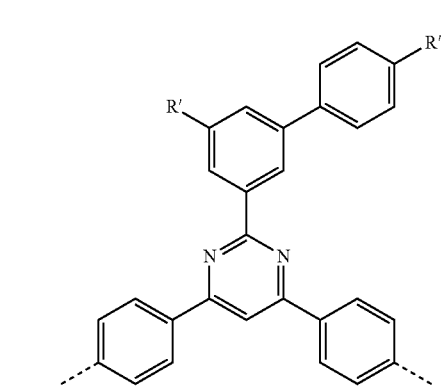

-continued
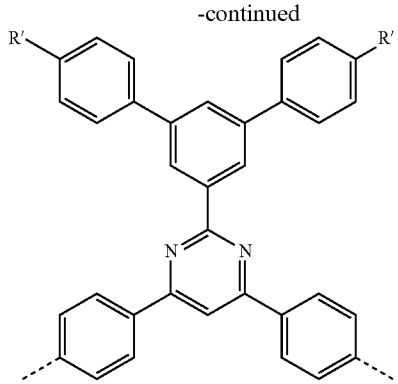
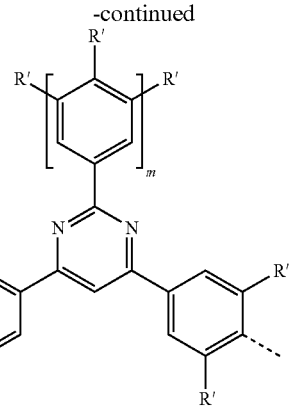
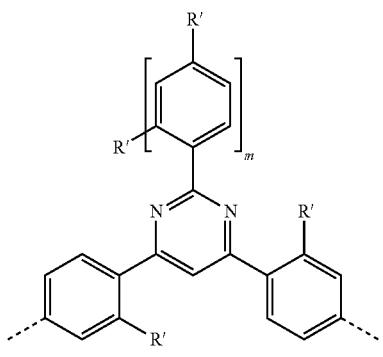
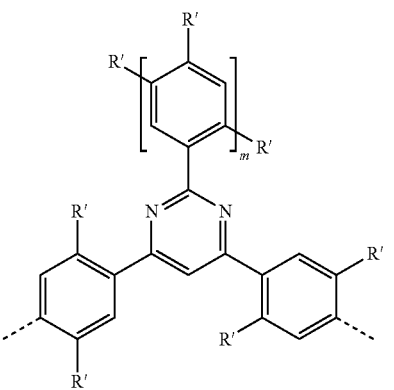
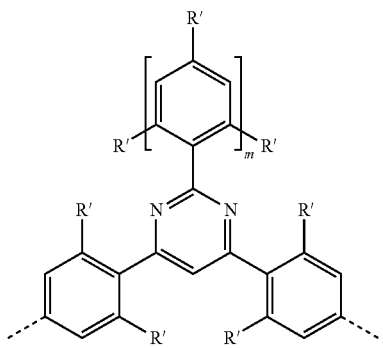
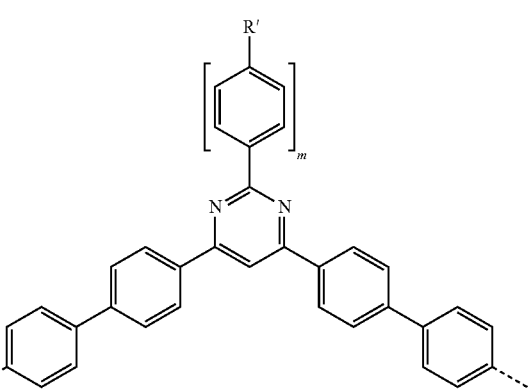
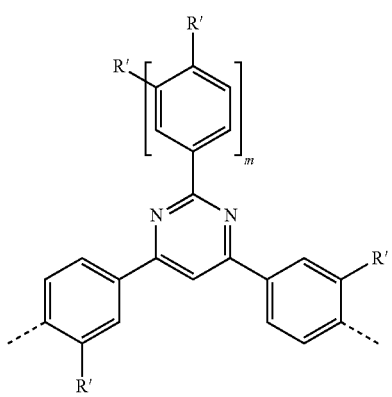
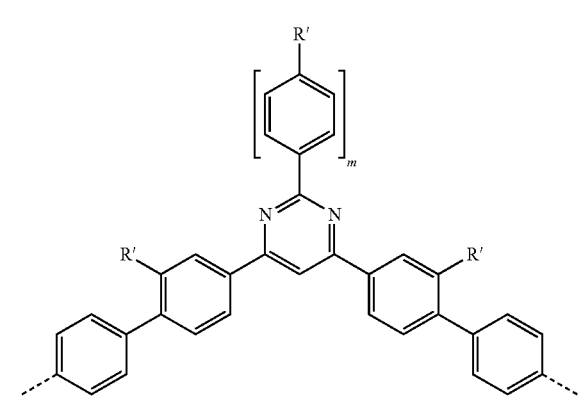

-continued
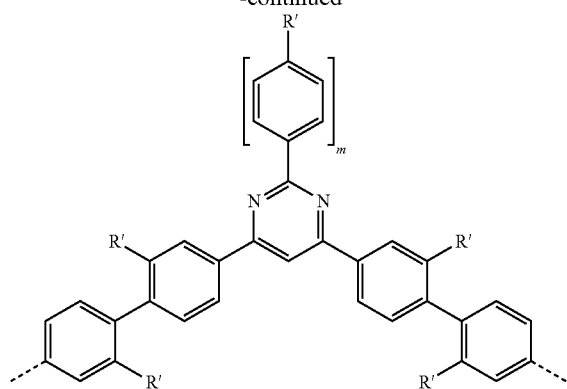
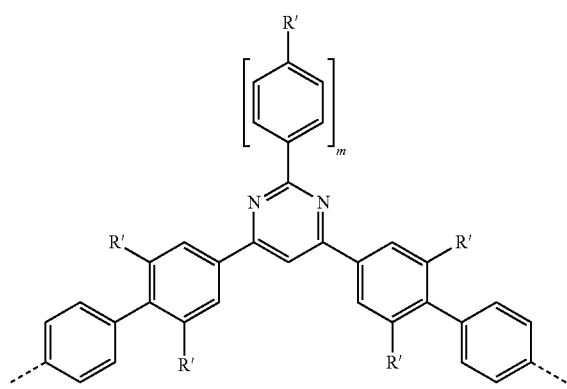
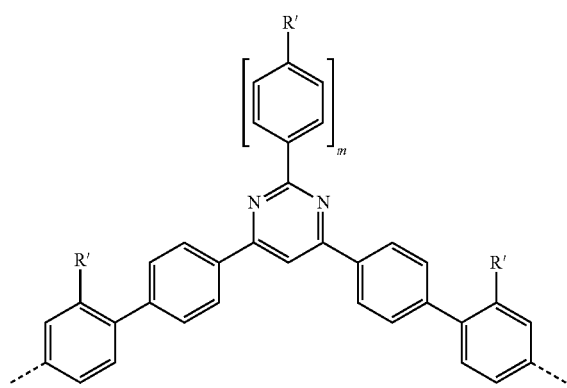
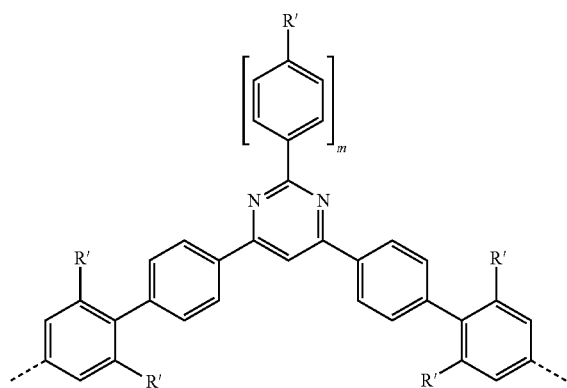
-continued
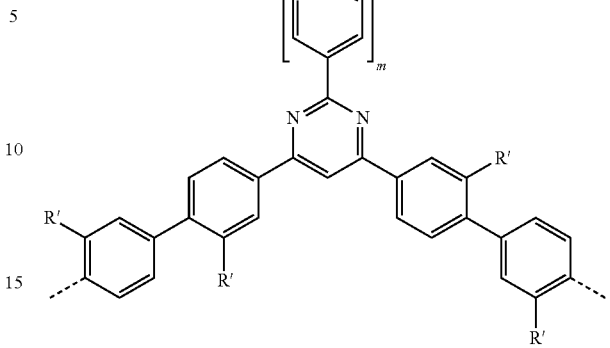
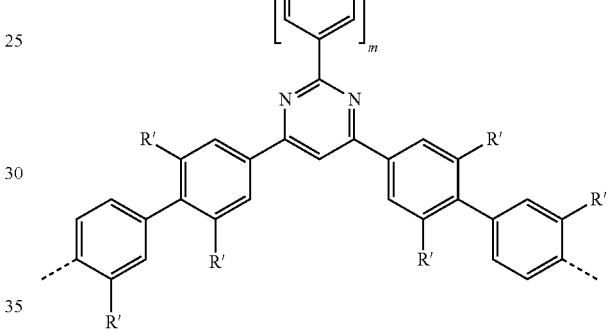
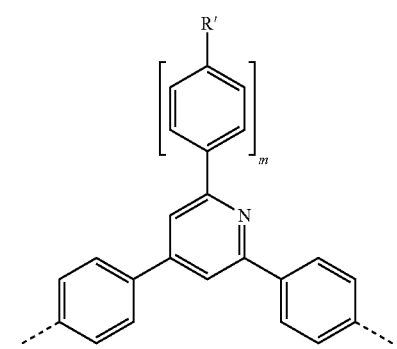
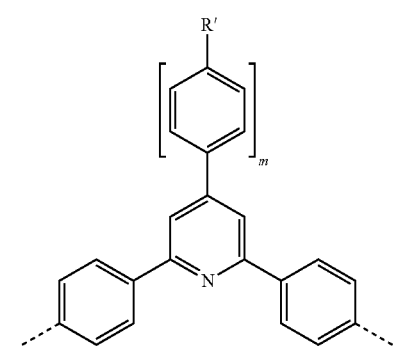

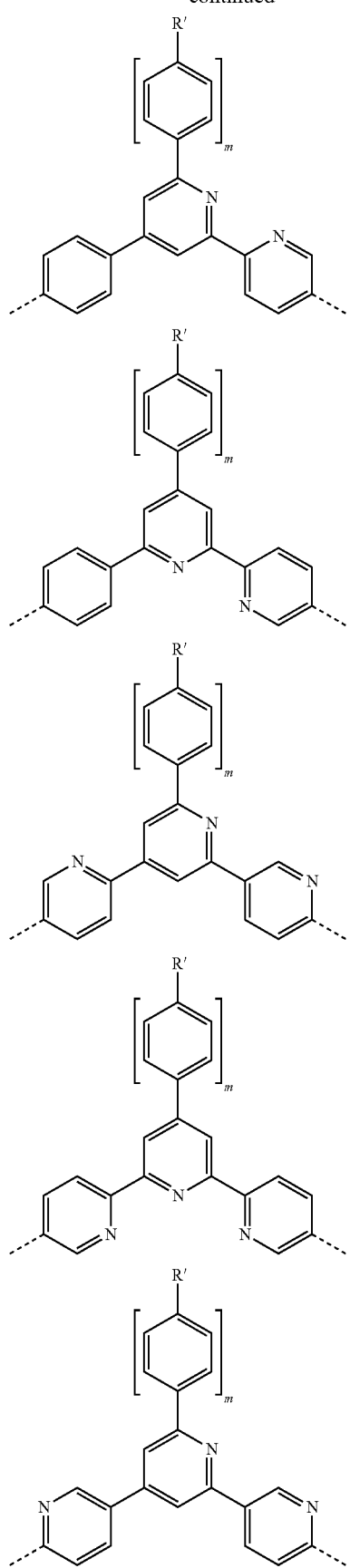
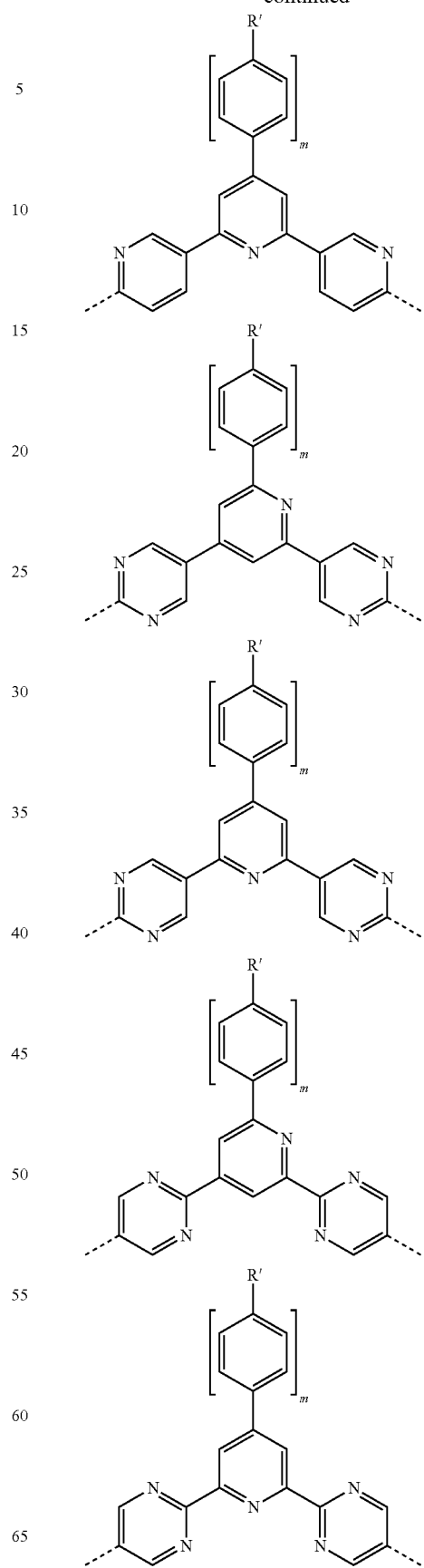

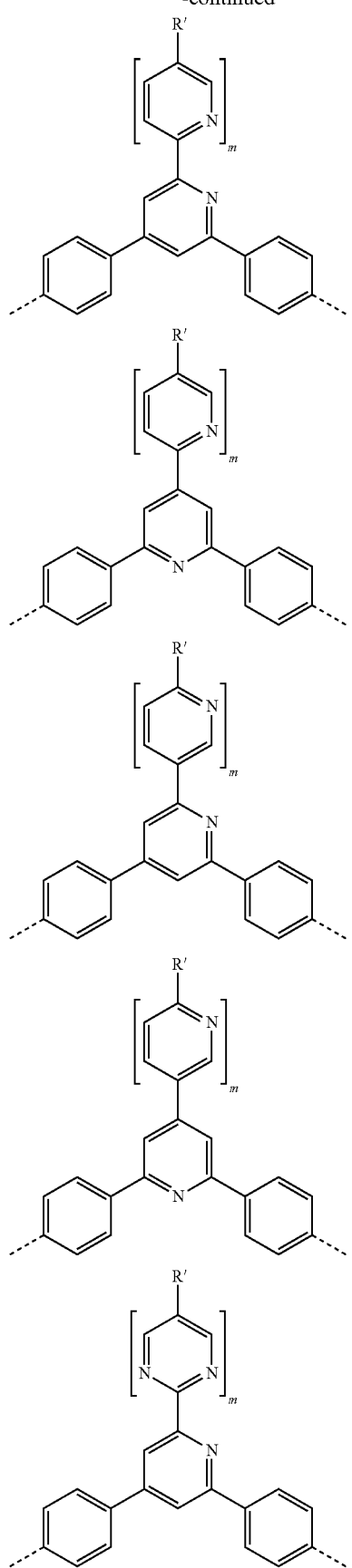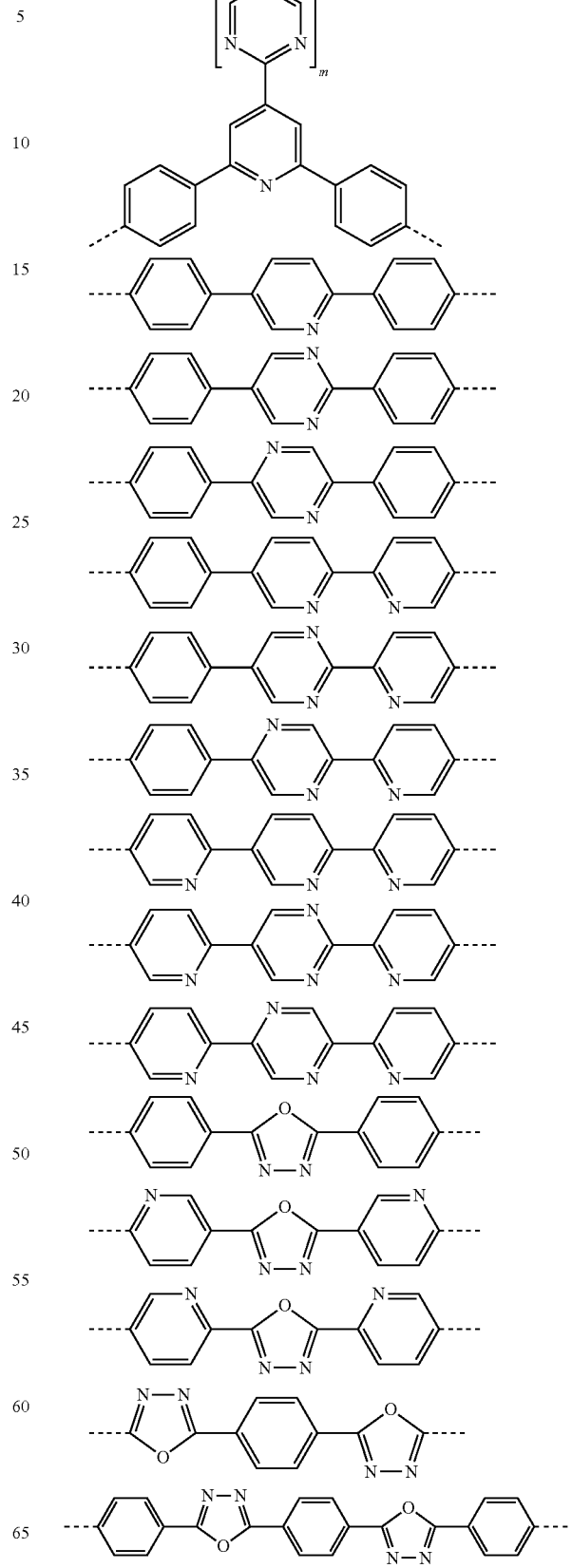

-continued

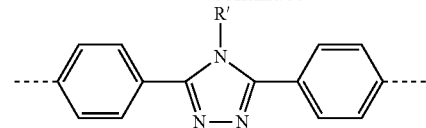
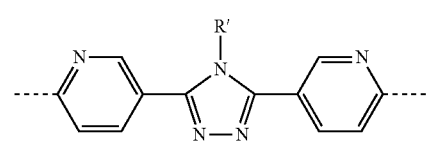
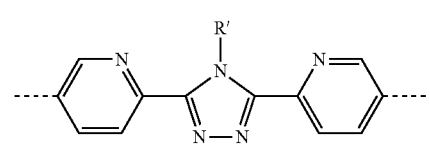
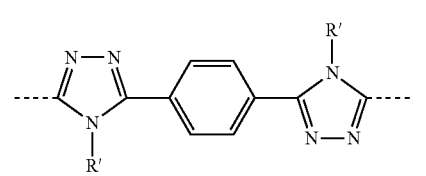
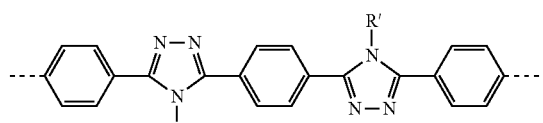
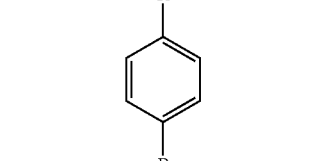
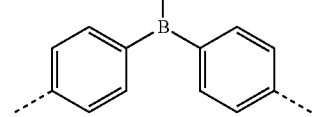
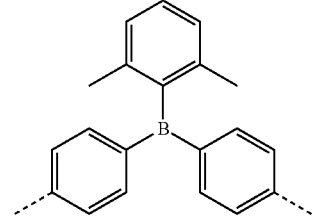

-continued

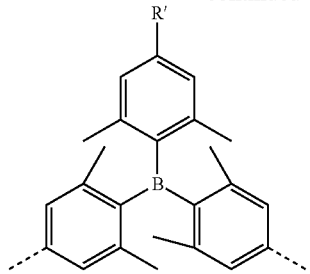
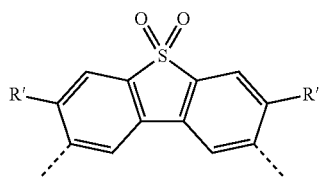
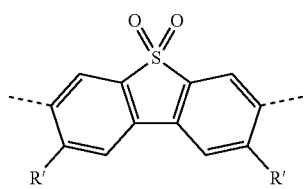
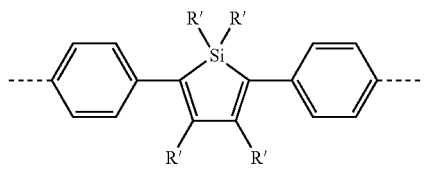

wherein R' is as described above.

Other suitable electron transport materials include ketones, diarylsulfoxides, and phosphine oxides, for example:

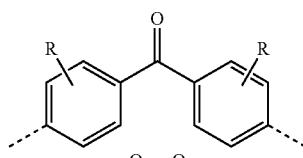
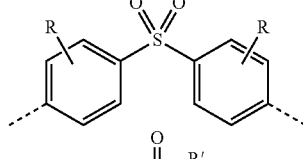
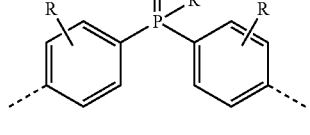

wherein each R is H or a substituent, preferably H or alkyl or aryl.

Certain groups may function as both hole- and electron-transporting groups. These are so-called bipolar groups and include carbazoles, in particular groups of formulae 1, 2 or 3 in which two of Ar$^1$, Ar$^2$ and Ar$^3$ are phenyl groups linked by a direct C—C bond. Bipolar groups typically have an electron affinity around 3 eV and ionisation potential around 5.8 eV.

Exemplary bipolar groups include the following:
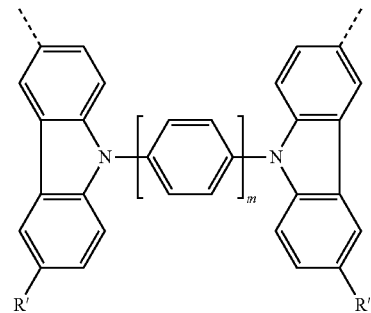
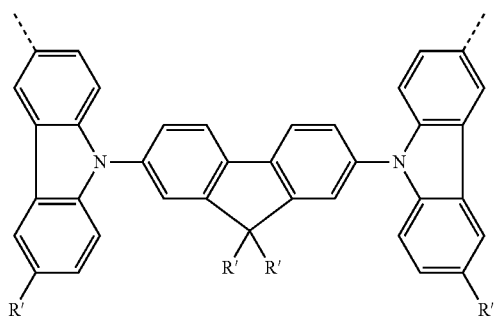
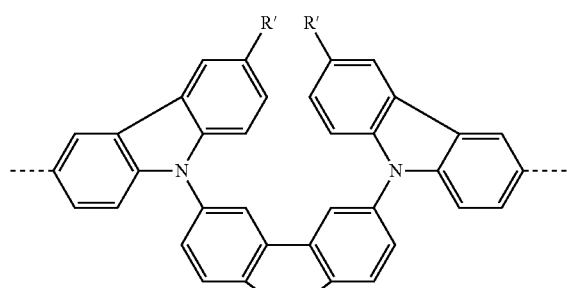
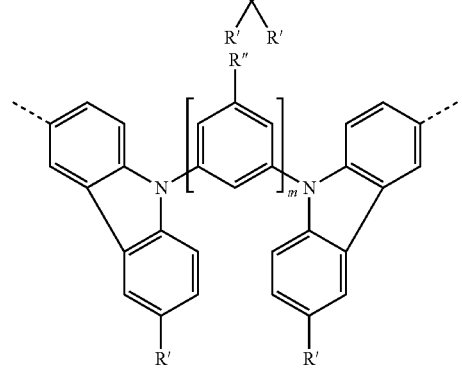
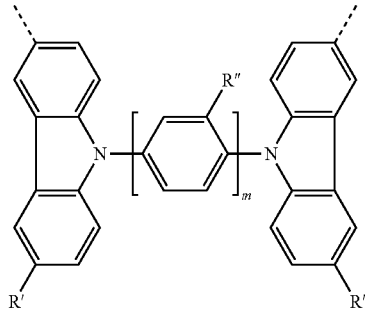
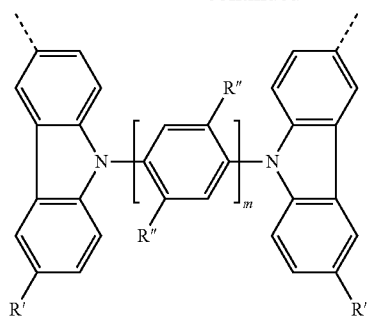
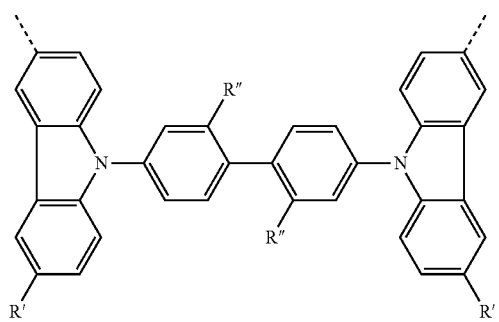
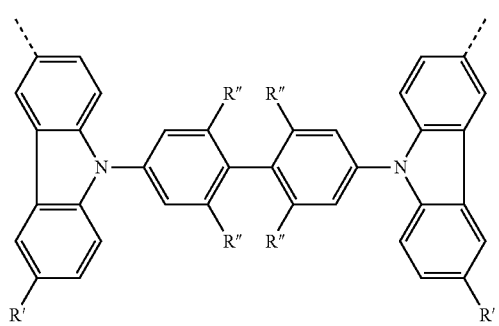
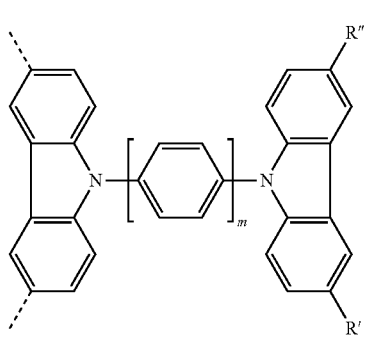
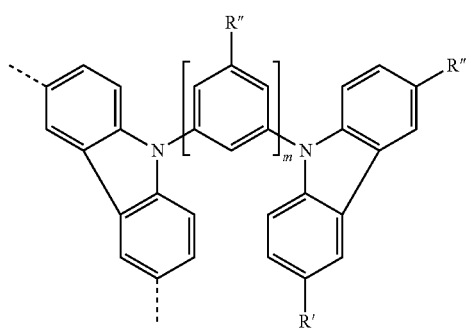

-continued
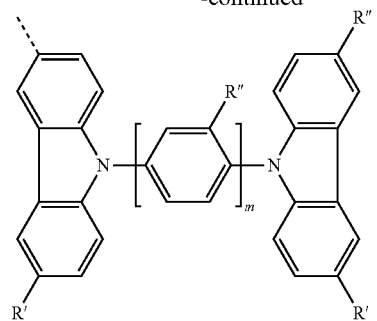
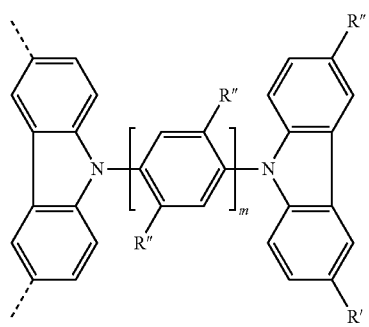
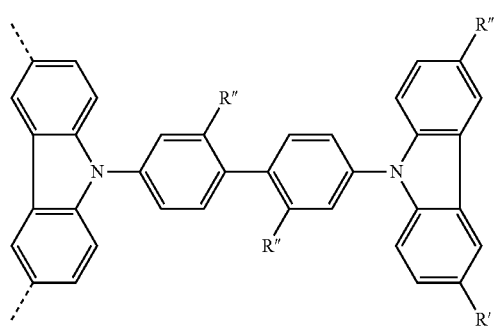
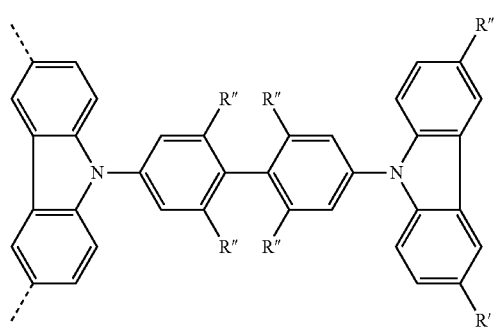
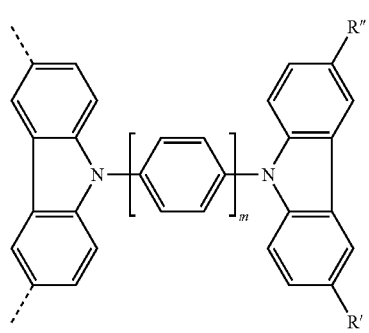
-continued
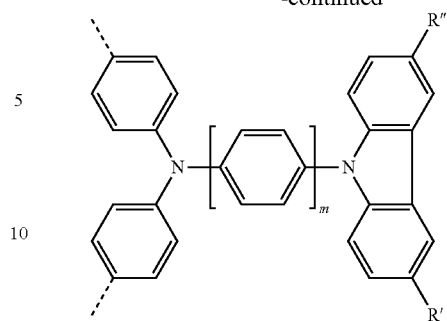
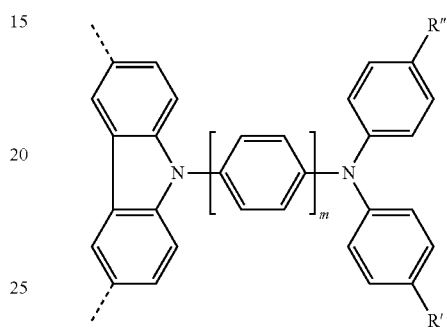
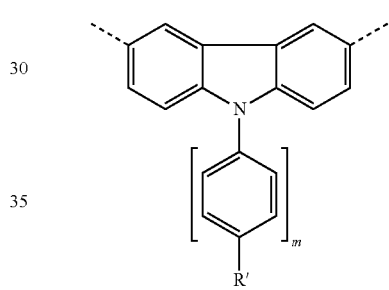
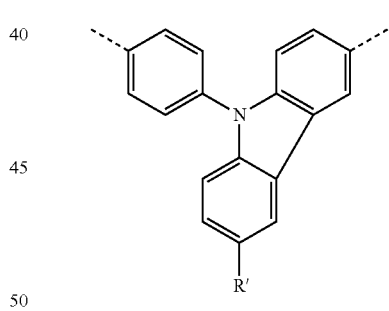
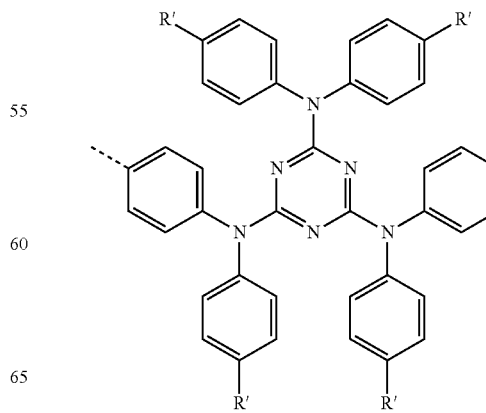

-continued
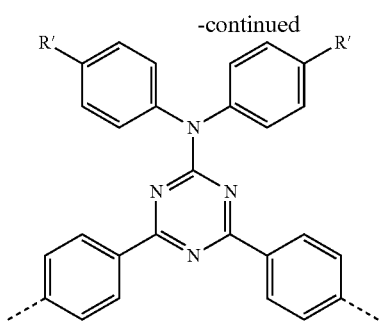
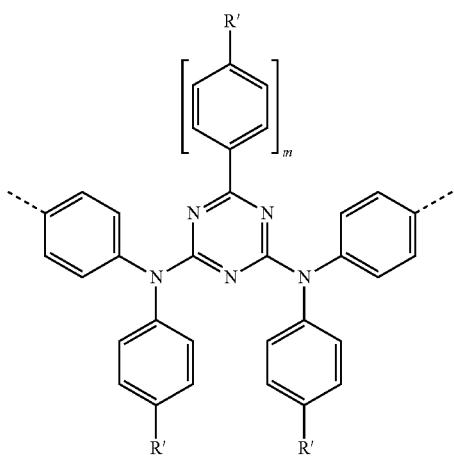
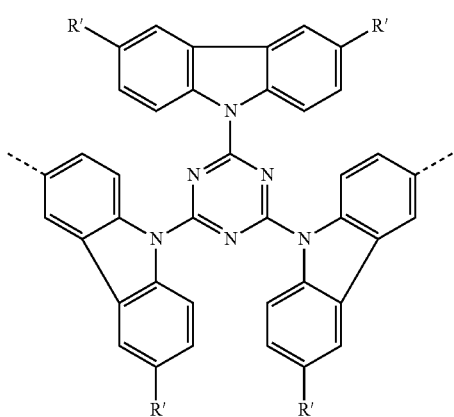
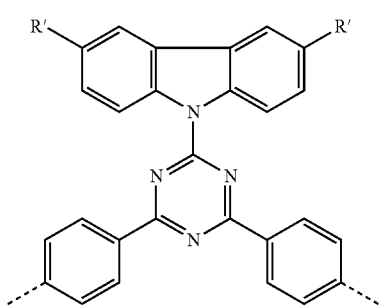
-continued
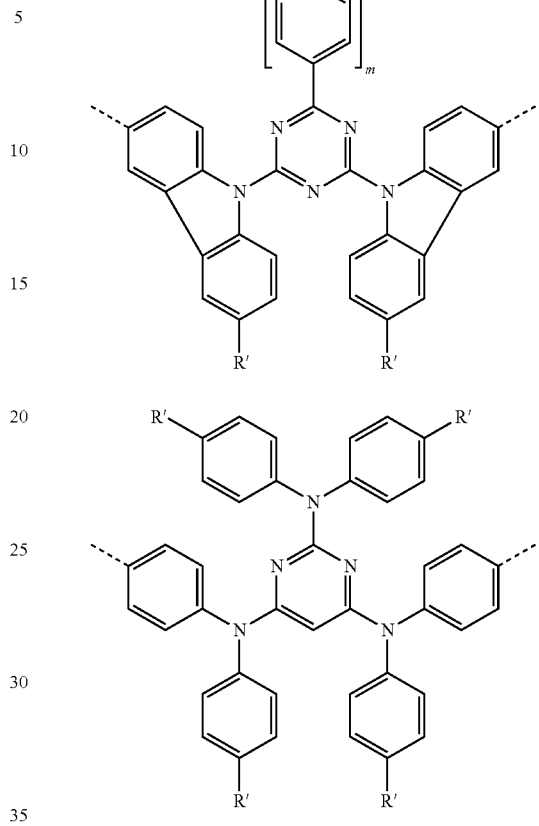
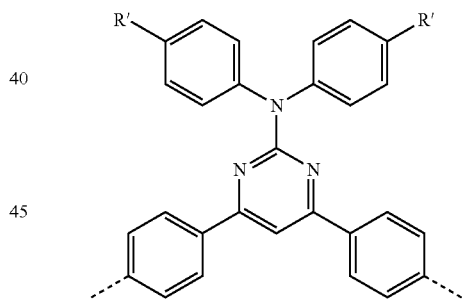
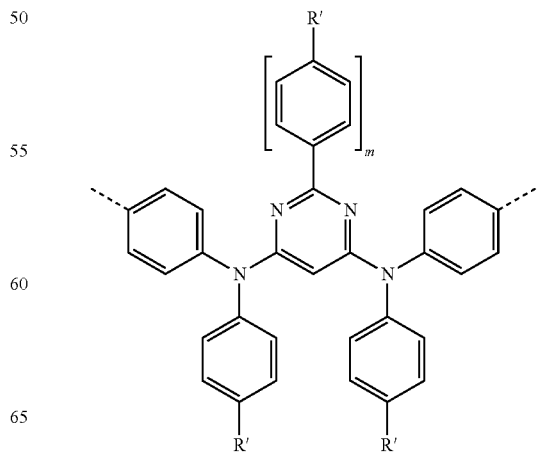

37
-continued
38
-continued
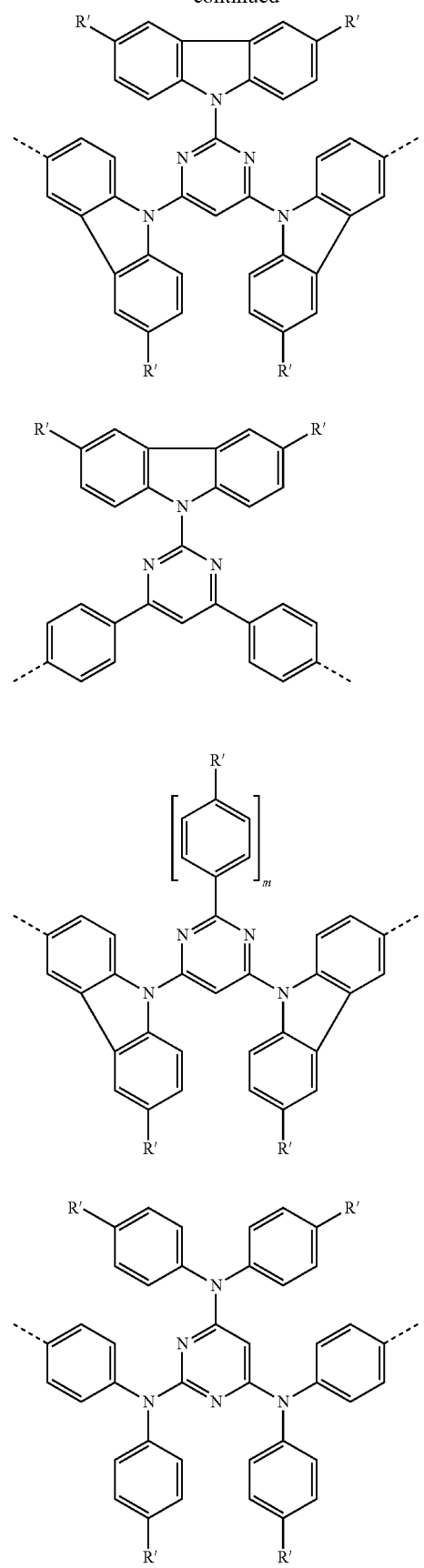
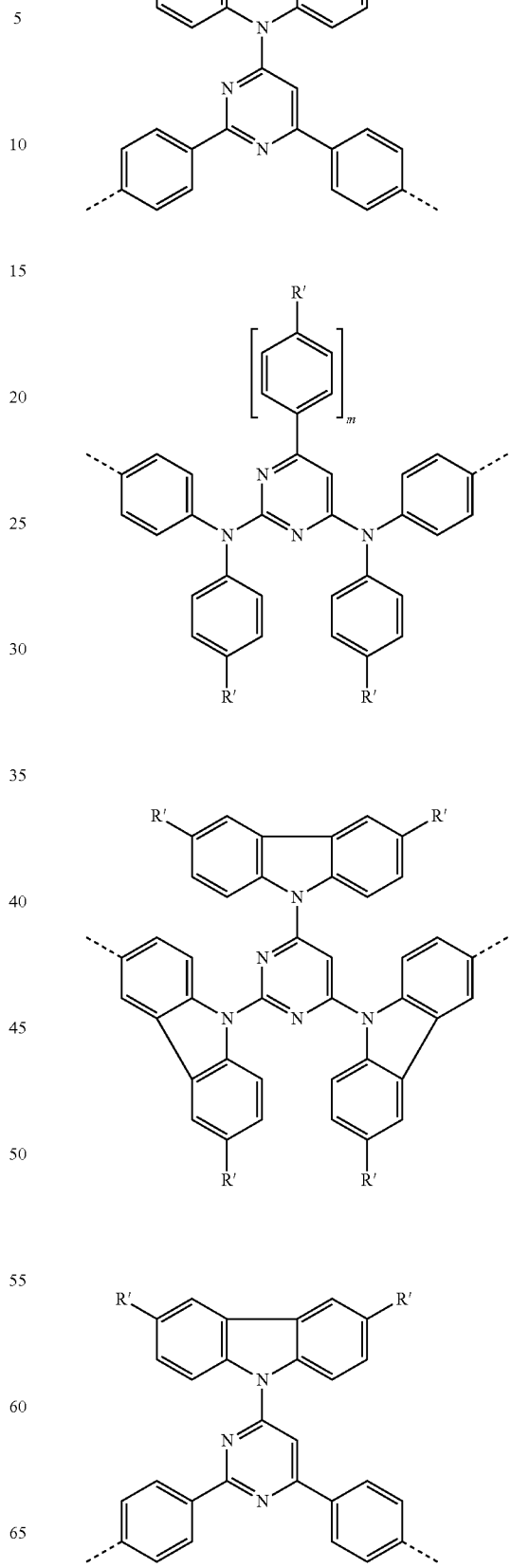

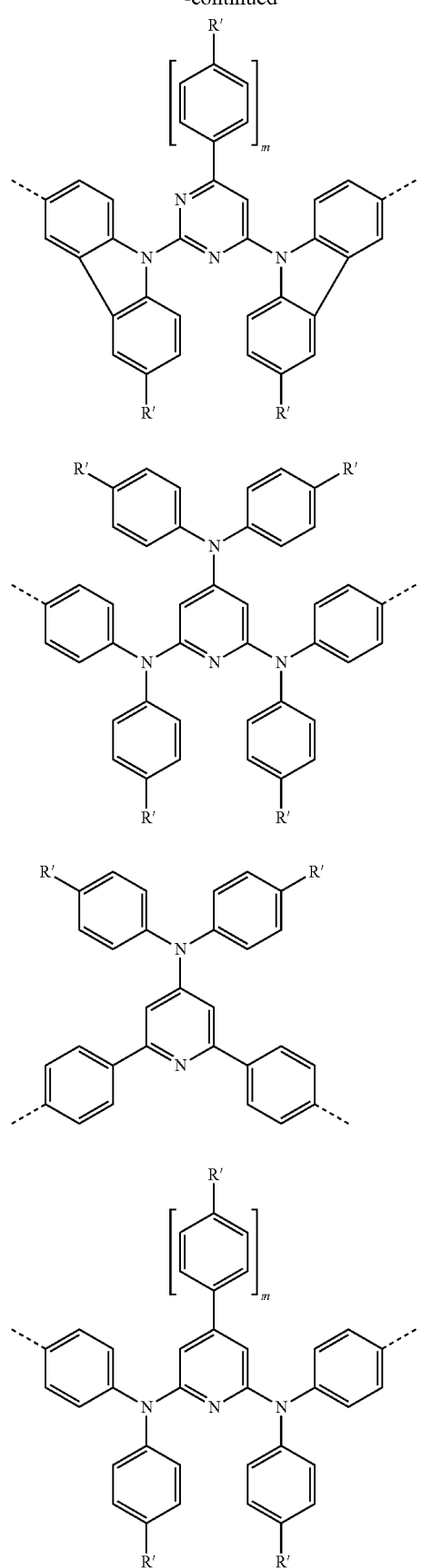
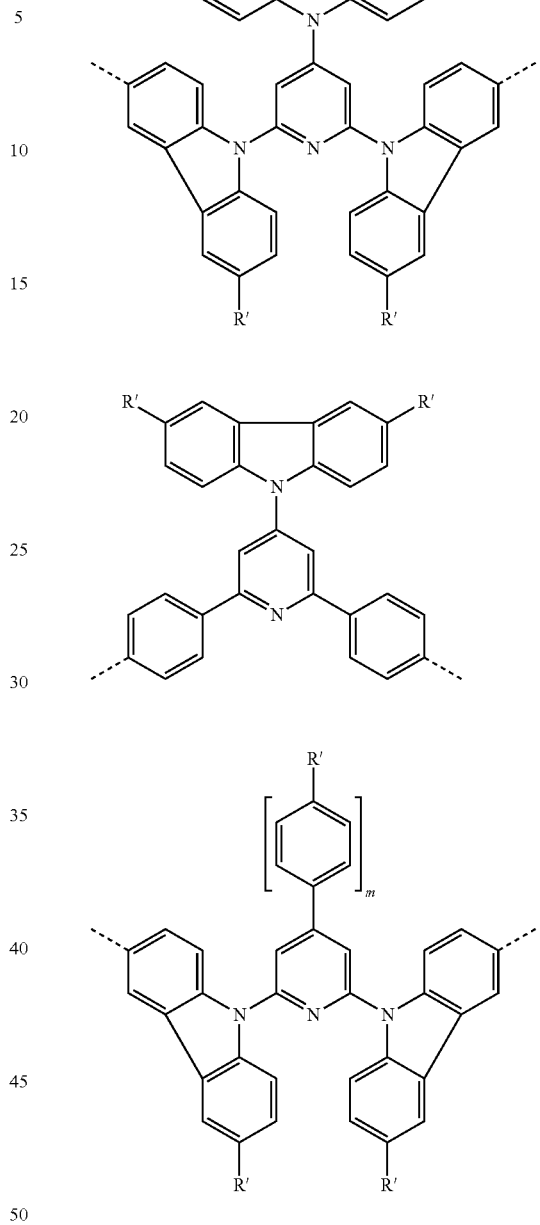

wherein R' and m are described above.

Exemplary repeat units described herein describe the case where the repeat units of formula (I) is linked through 2 positions. In this case, the repeat units of formula (I) form linear links within a polymer chain. However, it will be appreciated that any of these examples may readily be modified to provide repeat units in which the repeat unit of formula (I) comprises more than two linking positions. In the case where the repeat unit comprises three linking positions, the repeat unit of formula (I) may provide a branching point to form a branched polymer, in particular a dendritic or "starburst" polymer, comprising a core and branches radiating from the core.

Exemplary CT groups to form such a starburst polymer include the following:

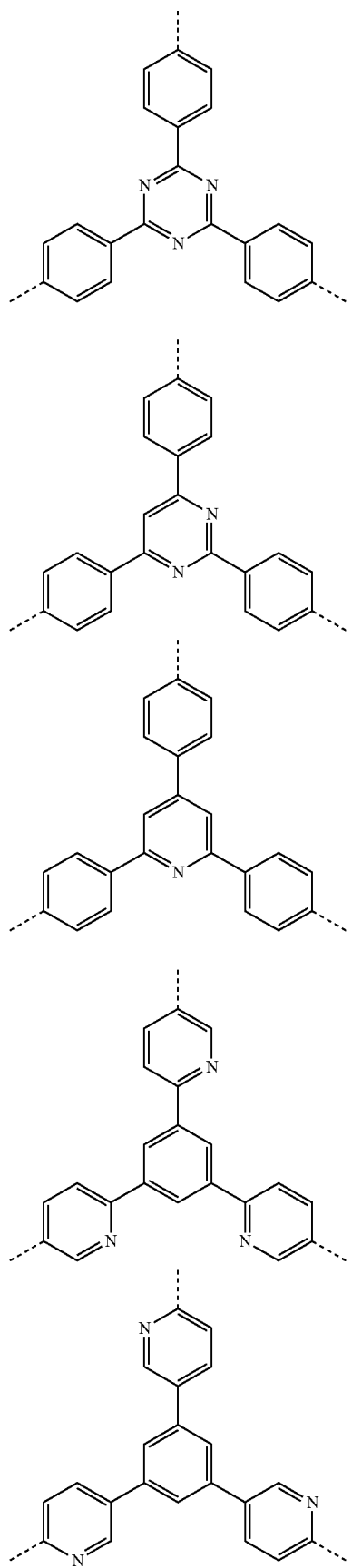
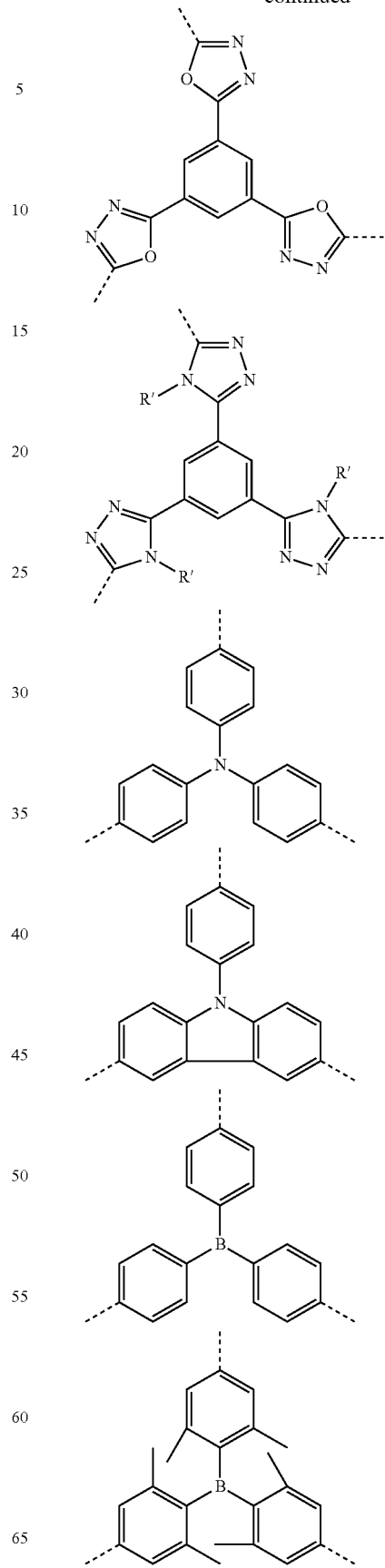

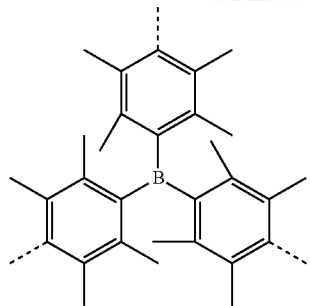

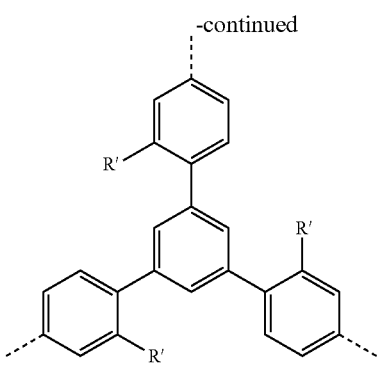

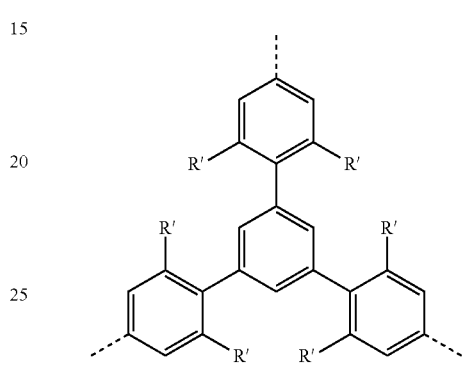

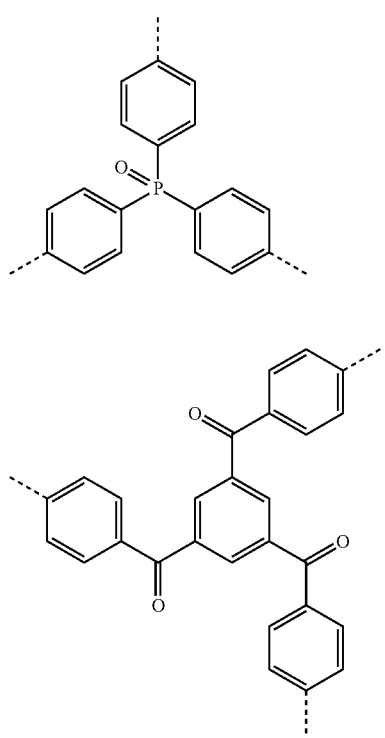

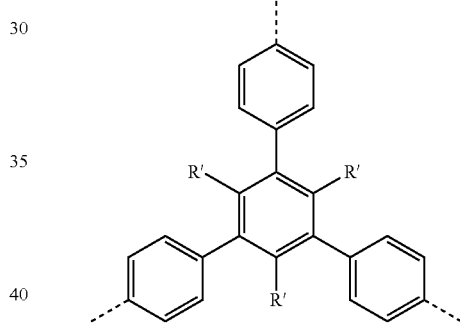

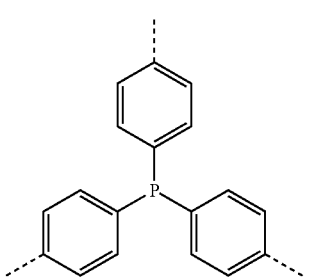

The polymer may include both repeat units of formula (I) having two linking positions and repeat units of formula (I) having more than 2, for example 3, linking positions.

Charge transporting groups may be provided in a core or branch of the starburst polymer. Provided below are examples of starburst cores that may be used in combination with repeat units of formula (I) in the starburst polymer's branches:

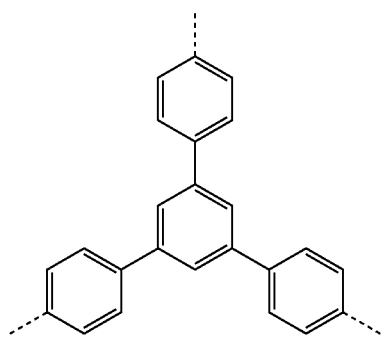

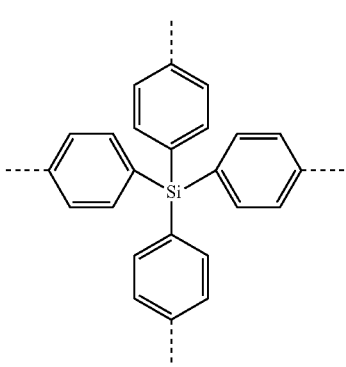

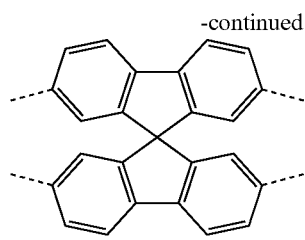

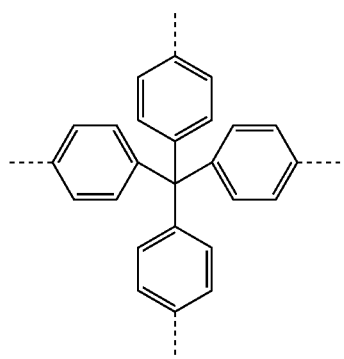

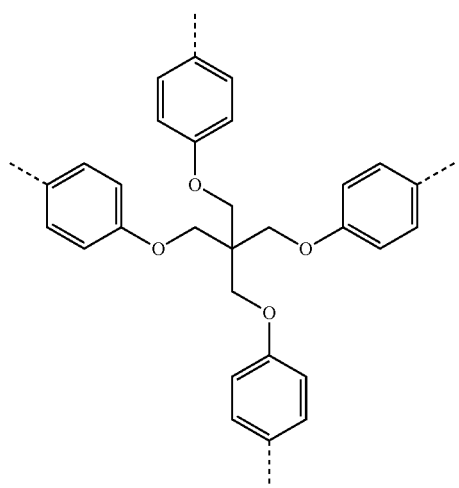

Spacer Group

The spacer group may be any group providing a break in conjugation between the charge-transporting group and Ar group and may be wholly or partially saturated.

Exemplary spacer groups include branched or straight-chain alkyl groups such as groups of formula —(CH$_2$)$_v$— wherein v is 1-10, preferably 2-4.

Another exemplary spacer group has formula (CH$_2$CH$_2$O)$_w$ in which w is 1-5, preferably 1-3.

Alkyl spacer chains may additionally serve to increase solubility of the polymer in common organic solvents.

The spacer group may contain conjugated groups. For example, the spacer group may contain an optionally substituted aryl or heteroaryl group such as optionally substituted phenyl. However, the spacer atom adjacent to CT and the spacer atom adjacent to Ar is not part of a conjugated system such that any such conjugated groups within the spacer are not conjugated with either the CT or Ar groups.

AR Group

In the case where polymers are formed from monomers by formation of direct Ar—Ar bonds, Ar groups from adjacent repeat units may link to form a conjugated chain of Ar groups. If q is 1, a chain of 2 Ar groups is present. If q is 2; a chain of 4 Ar groups is present.

If the polymer is to be used as a host for a dopant then the $T_1$ or $S_1$ level as appropriate must be maintained at a higher energy level than that of the dopant, and so the chain of conjugated Ar groups must have suitably high $T_1$ and/or $S_1$ levels.

Each Ar group may be a fused or unfused aromatic or heteroaromatic group. Exemplary Ar groups include optionally substituted phenylenes and fluorenes. Exemplary fluorene Ar groups include optionally substituted groups formula IV:

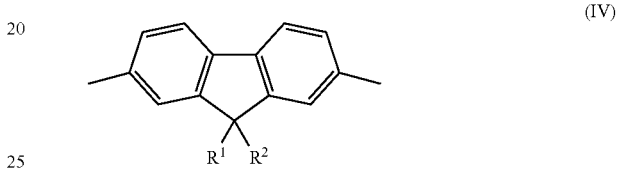

(IV)

wherein $R^1$ and $R^2$ are independently H or a substituent and wherein $R^1$ and $R^2$ may be linked to form a ring. $R^1$ and $R^2$ are preferably selected from the group consisting of hydrogen; optionally substituted alkyl wherein one or more non-adjacent C atoms may be replaced with O, S, N, C=O and —COO—; optionally substituted aryl or heteroaryl; and optionally substituted arylalkyl or heteroarylalkyl. More preferably, at least one of $R^1$ and $R^2$ comprises an optionally substituted $C_4$-$C_{20}$ alkyl or aryl, preferably phenyl, group.

In the case where $R^1$ or $R^2$ is aryl or heteroaryl, preferred optional substituents include alkyl groups wherein one or more non-adjacent C atoms may be replaced with O, S, N, C=O and —COO—.

$R^1$ and/or $R^2$ may comprise a crosslinkable-group, for example a group comprising a polymerisable double bond such and a vinyl or acrylate group, or a benzocyclobutane group.

Optional substituents for the fluorene unit, other than substituents $R^1$ and $R^2$, are preferably selected from the group consisting of alkyl wherein one or more non-adjacent C atoms may be replaced with O, S, N, C=O and —COO—, optionally substituted aryl, optionally substituted heteroaryl, alkoxy, alkylthio, fluorine, cyano and arylalkyl.

Exemplary phenylene Ar groups have formula (VI):

(VI)

wherein $R^1$ is as described above with reference to formula (IV) and p is 1, 2, 3 or 4, optionally 1 or 2. In one arrangement, the Ar group of formula (VI) is a 1,4-phenylene repeat unit. By selecting terminal Ar groups of the monomer that are substituted, a twist may be created along the Ar chain that is formed following polymerisation due to steric hindrance between substituents of adjacent Ar groups, reducing the extent of conjugation within the chain.

Monomers and Polymerisation

Preferred methods for preparation of polymers comprise "metal insertion" reactions of monomers comprising a reactive leaving group bound to the terminal Ar group of a unit of formula (I). Exemplary metal insertion methods are Suzuki polymerisation as described in, for example, WO 00/53656 and Yamamoto polymerisation as described in, for example, T. Yamamoto, "Electrically Conducting And Thermally Stable π—Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine. As alternatives to halides, other leaving groups capable of participating in metal insertion include groups include tosylate, mesylate and triflate.

It will therefore be appreciated that repeat units illustrated throughout this application may be derived from a monomer carrying suitable leaving groups Likewise, an end group or side group may be bound to the polymer by reaction of a suitable leaving group. Exemplary monomers include the following:

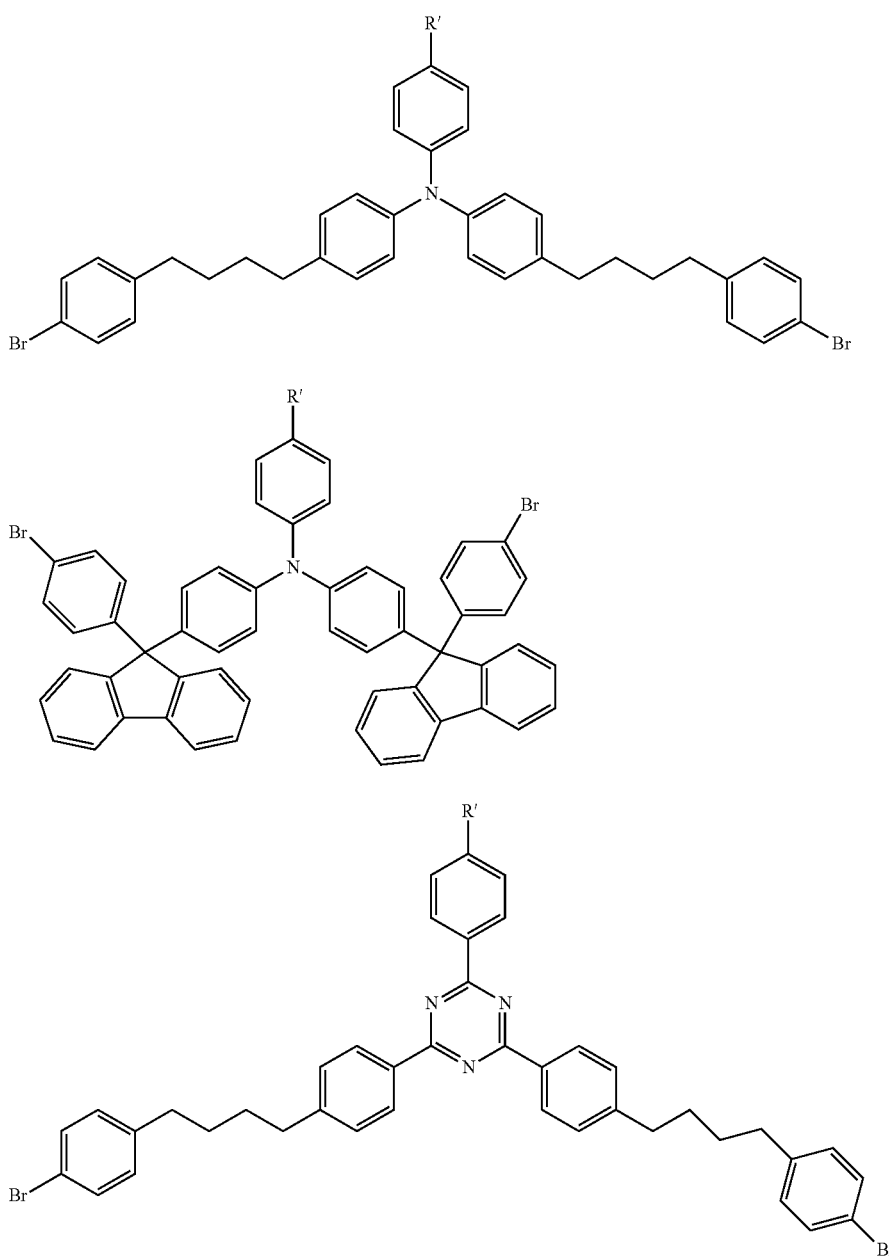

-continued

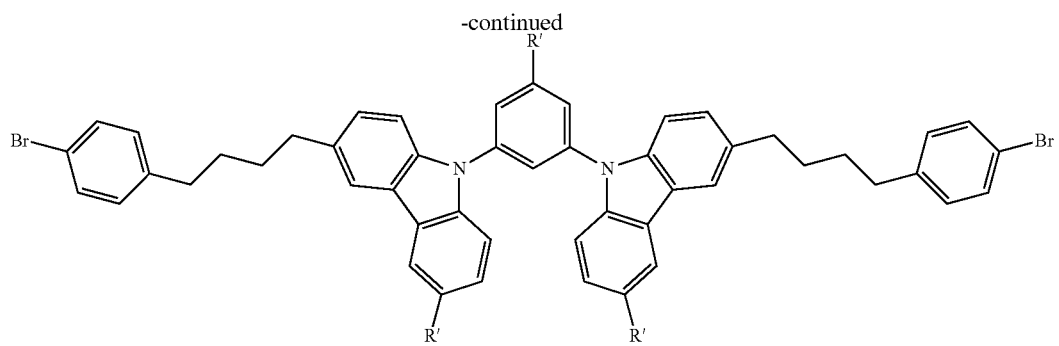

wherein R' is as described above.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

Exemplary polymers formed by polymerisation of these monomers include homopolymers, such as the following homopolymer in which two adjacent repeat units of formula (I) are illustrated:

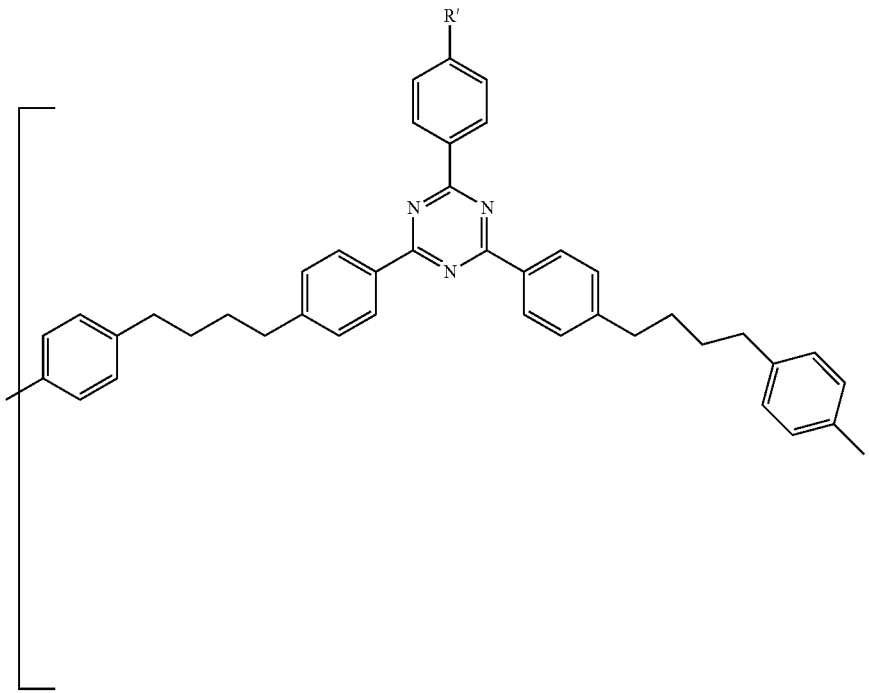

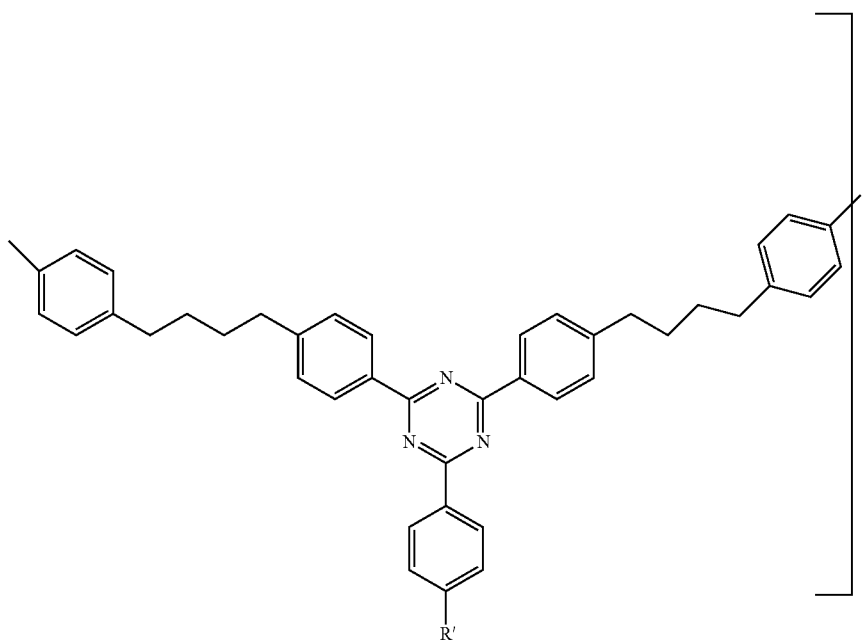
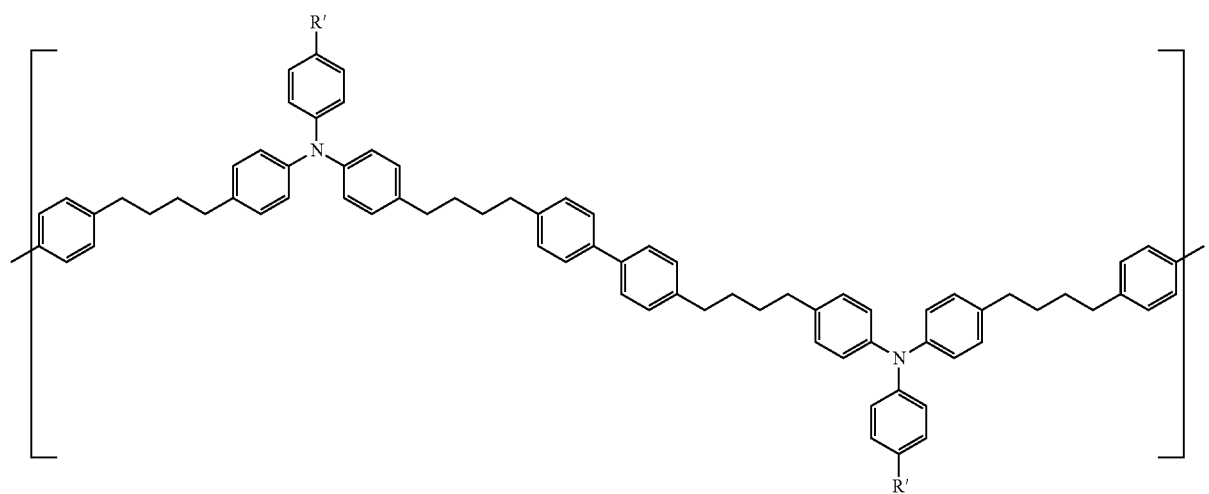
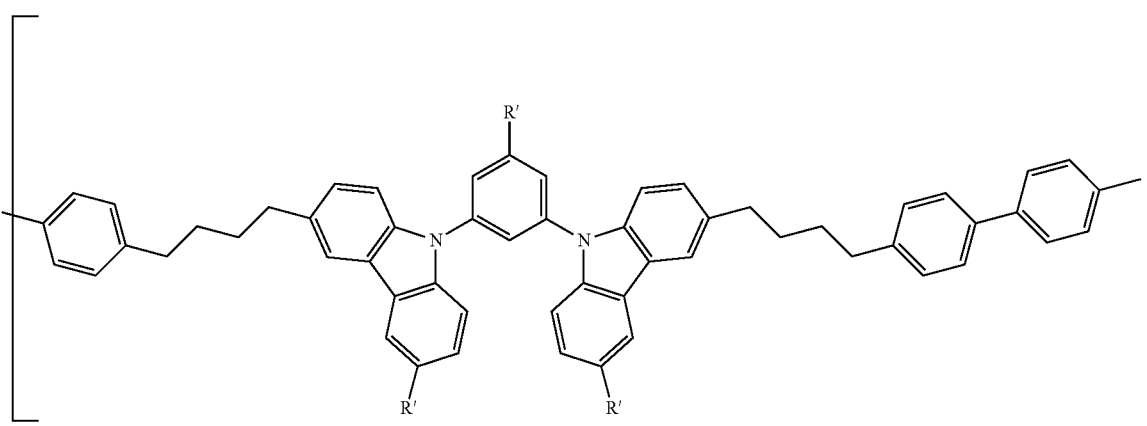

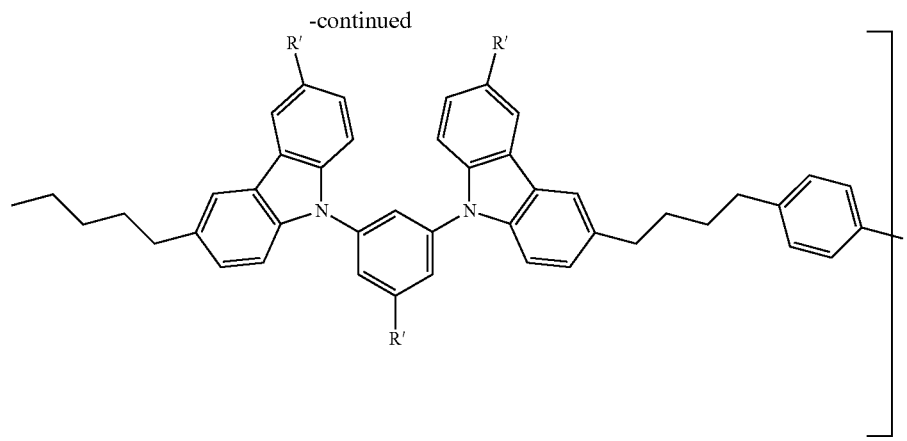
Co-polymers may contain two or more repeat units. For example, two charge transporting monomers can be co-polymerised:
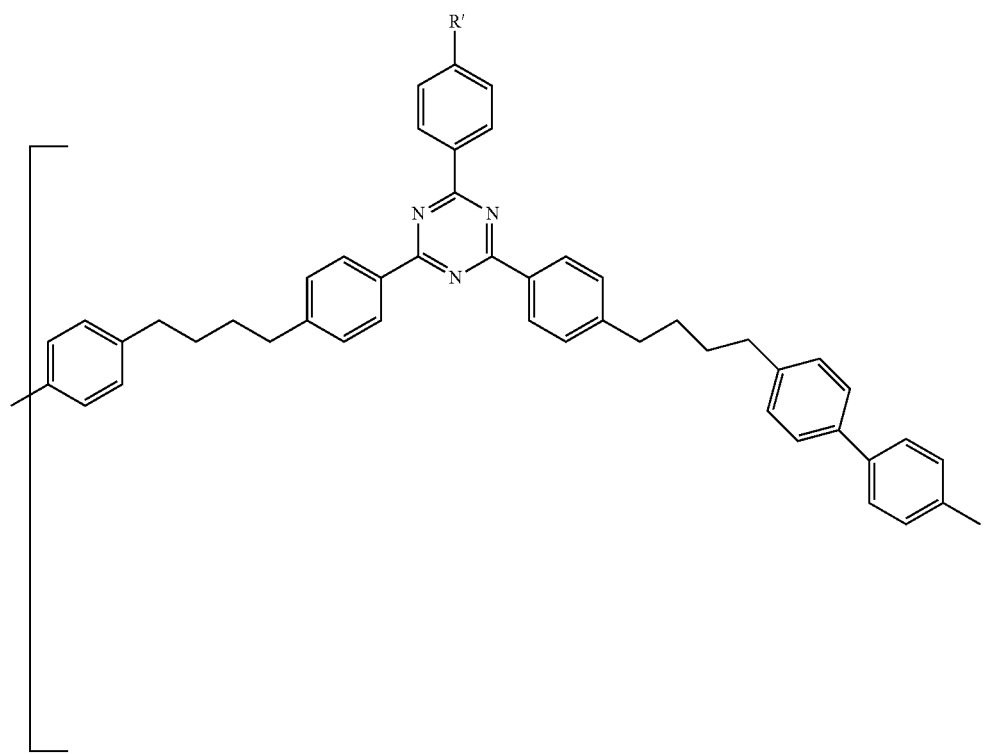

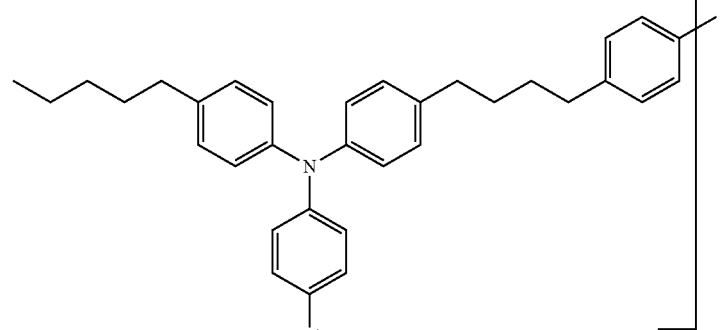
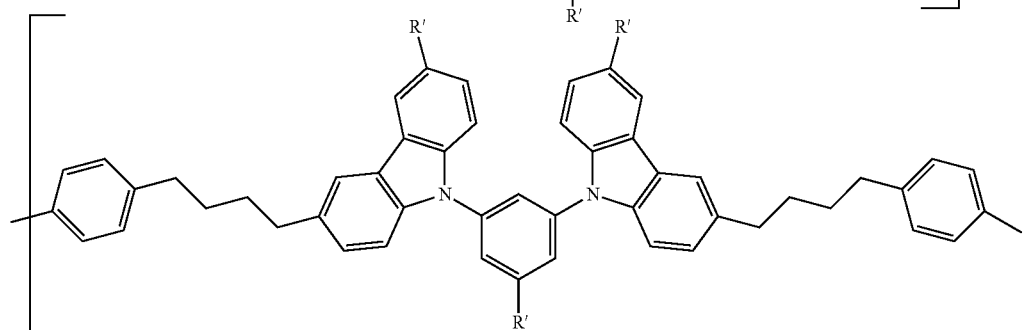
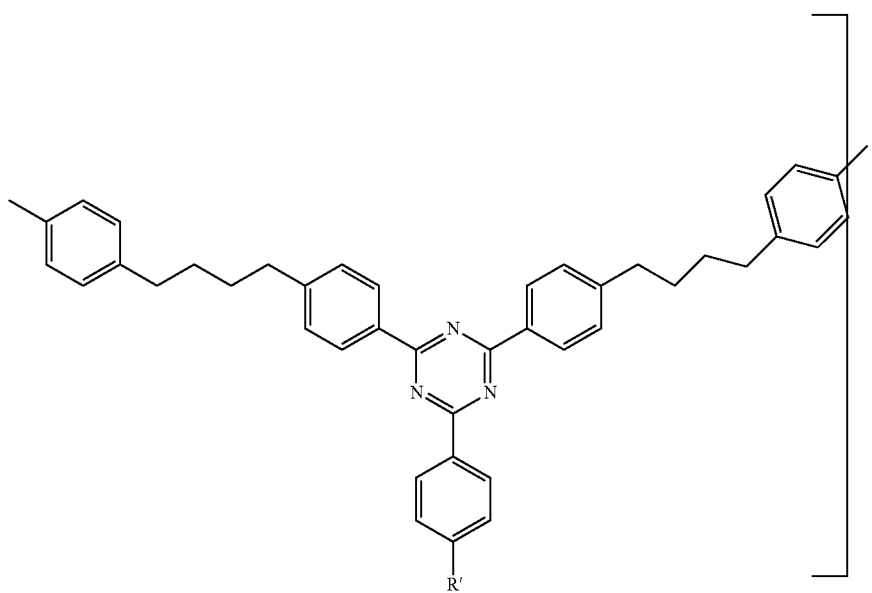

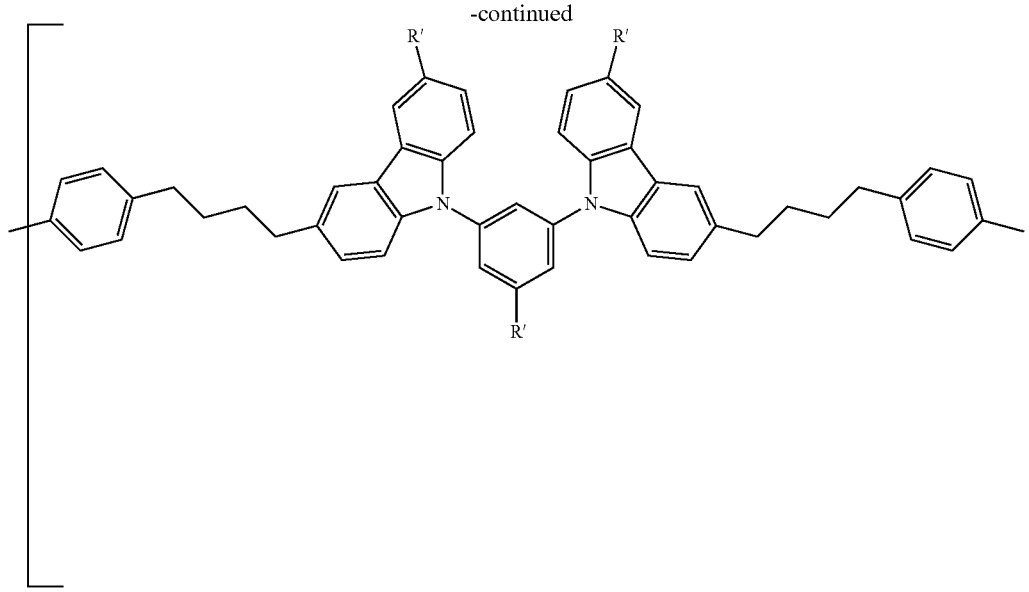

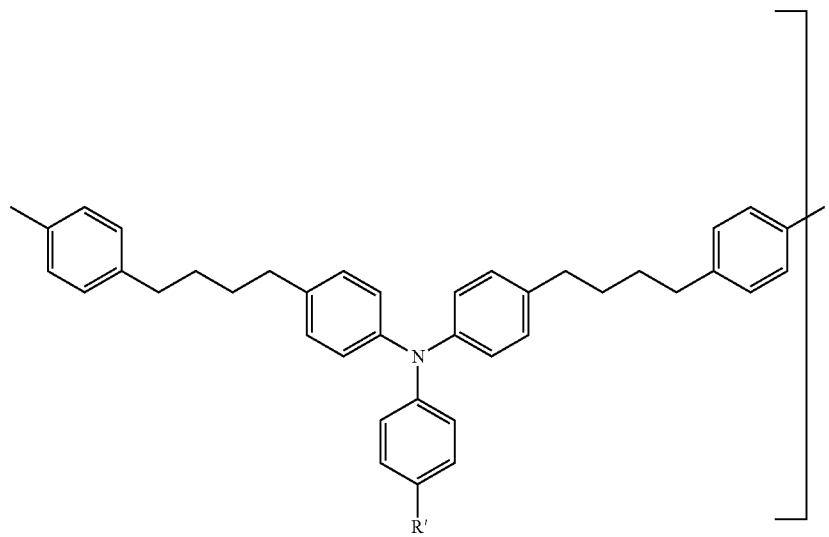

Other co-repeat units include optionally substituted (hetero)arylene groups, in particular phenylene repeat units substituted with one or more R' groups, in particular one or more alkyl groups. Co-repeat units optionally carry substituents at a ring carbon atom adjacent to at least one of the linking atoms of the repeat units. (Hetero)arylene co-repeat units may be linked through any position. For example, phenylene repeat units may be para (1,4) linked, meta (1,3) linked or ortho (1,2) linked. The choice of linking positions may affect the degree of conjugation of the co-repeat unit to adjacent repeat units.

Exemplary combinations of (Ar)q of the repeat unit of formula (I) and optionally substituted phenylene co-repeat units include the following:

| (Ar)q | Co-monomer |
|---|---|
| 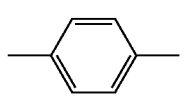 | 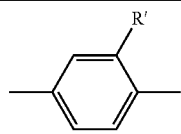 |

-continued

| | |
|---|---|
| 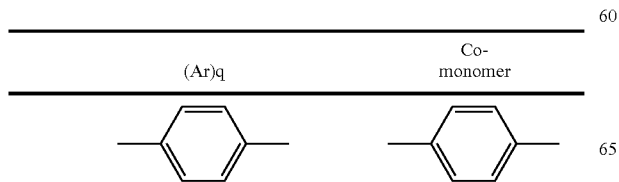 | 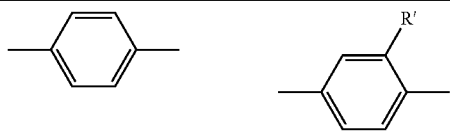 |
| | 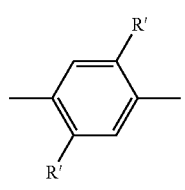 |
| | 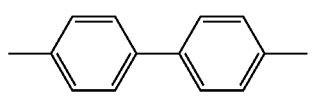 |
| | 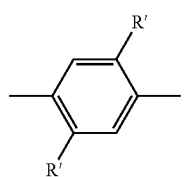 |

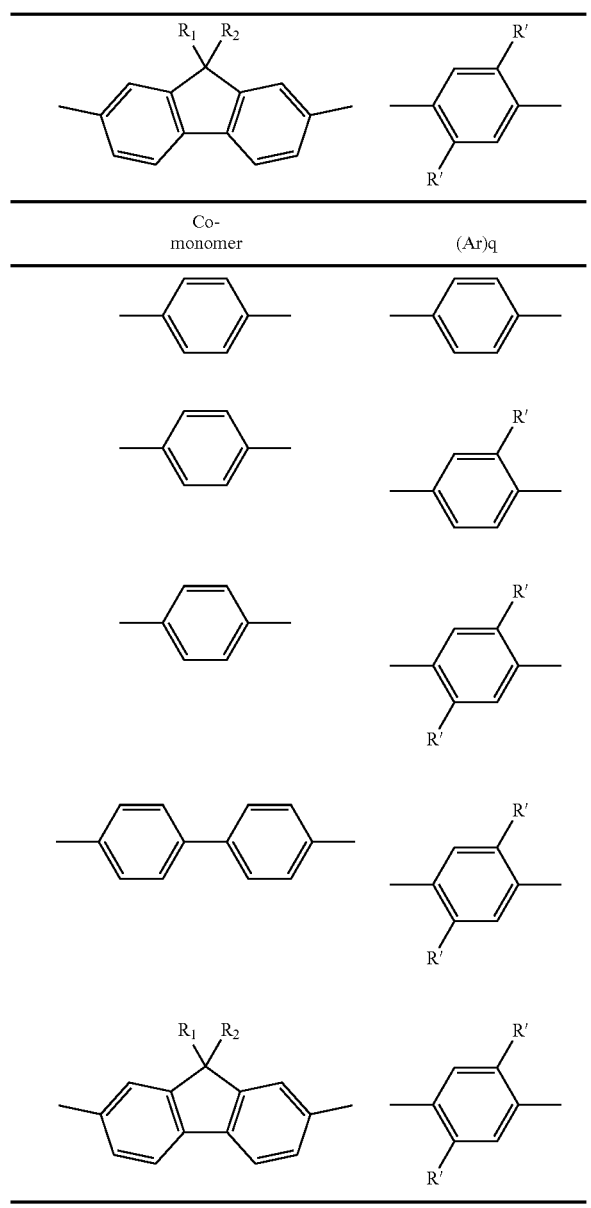

The presence of substituents R' on the co-repeat unit, in particular on one or more atoms of the co-repeat unit adjacent to the linking atom of the co-repeat unit, may serve to create steric hindrance with the adjacent repeat unit, resulting in a twist along the polymer backbone that reduces conjugation along the backbone by reducing the amount of pi orbital overlap between adjacent repeat units that are not in the same plane. This can serve to prevent extended conjugation between (Ar)q and co-repeat units and thereby avoid a reduction in excited state energy levels as a result of this extended conjugation.

In the same way, the terminal Ar of an (Ar)q group of a repeat unit of formula (I) may be substituted with one or more substituents R' in order to create a twist in either homopolymers or copolymers comprising that repeat unit.

A further co-repeat unit, suitable for use in combination with any of the aforementioned groups Ar(q), includes the following:

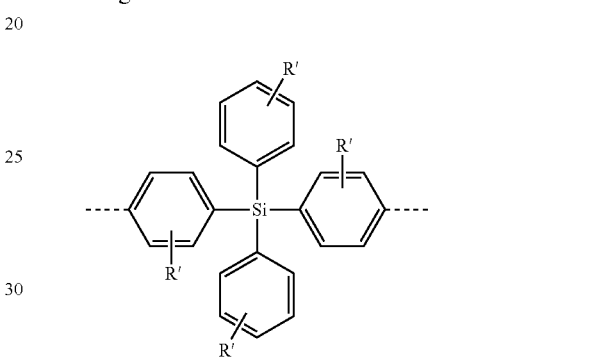

wherein R' is as described above. In this case, the Si atom breaks conjugation across the repeat unit. Other repeat units comprising conjugation-breaking atoms in the polymer backbone may likewise be used.

Although specific combinations of (Ar)q groups and co-repeat units are illustrated above, it will be appreciated that any combination may be used so long as the resultant polymer has the properties required for use with the other materials of the OLED it is to be used in, in particular $T_1$ and/or $S_1$ levels.

Exemplary polymers comprising a repeat unit of formula (I) and a co-repeat unit include the following. It will be appreciated that the copolymer may comprise one or more further co-repeat units.

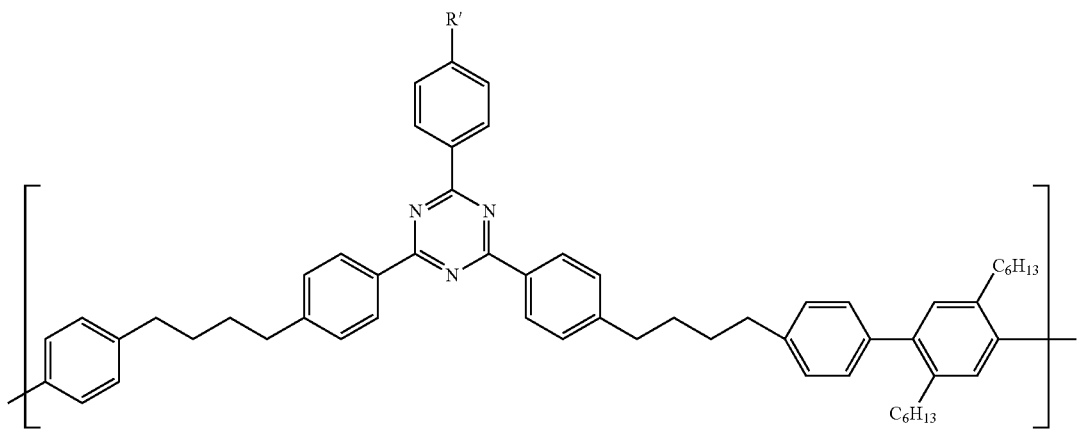

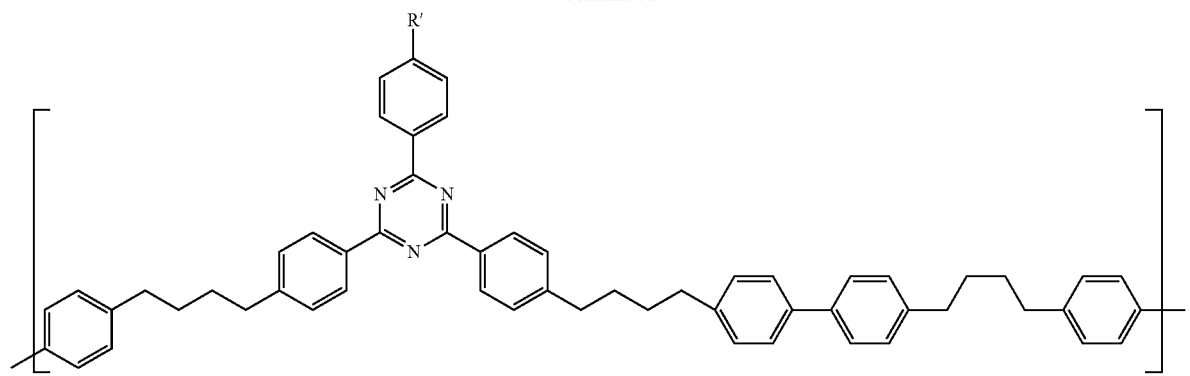
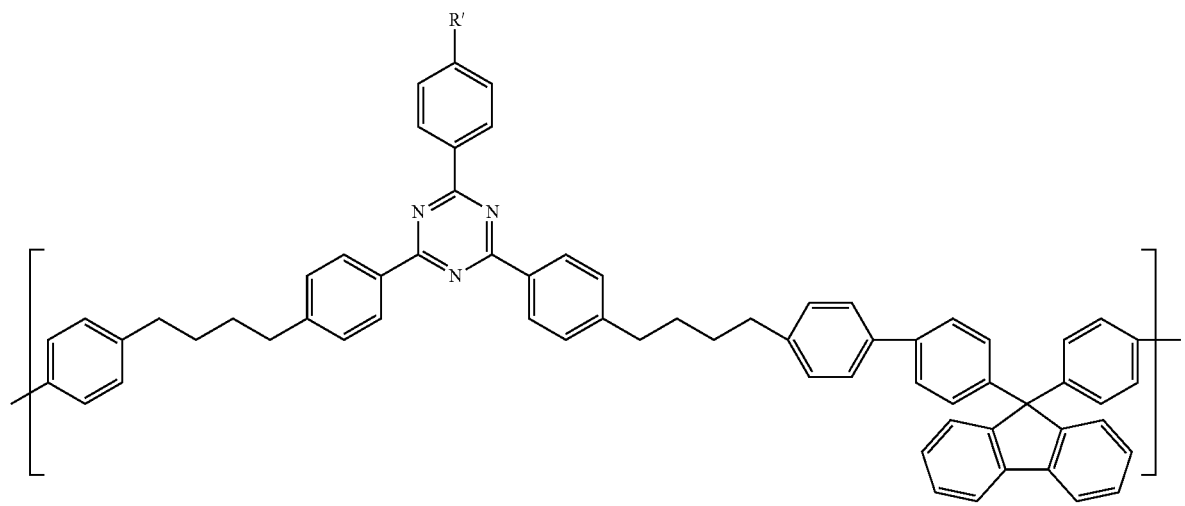
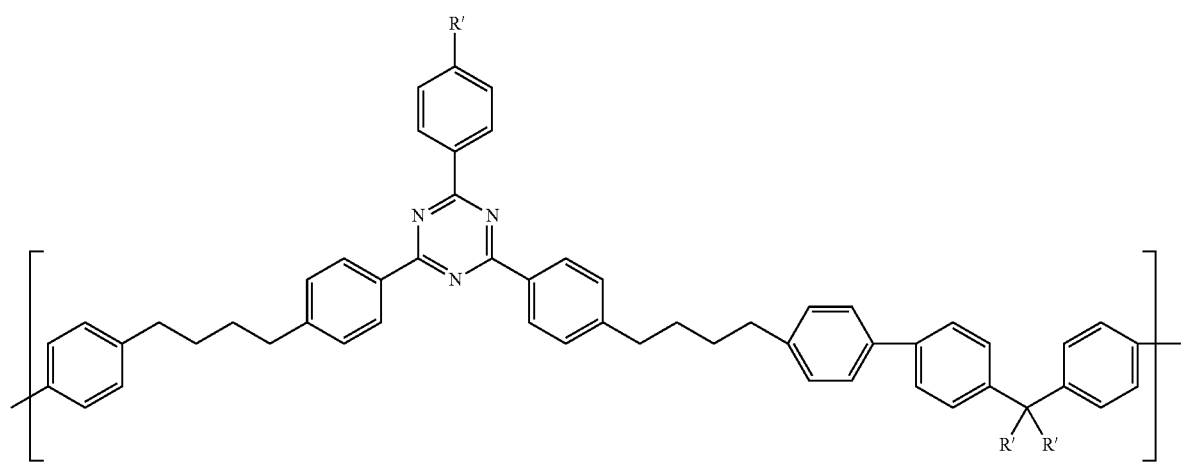

-continued
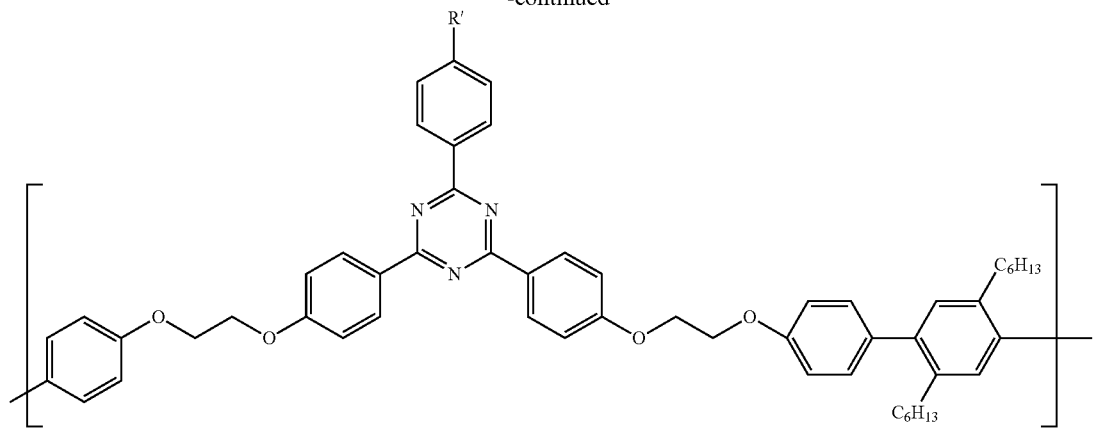
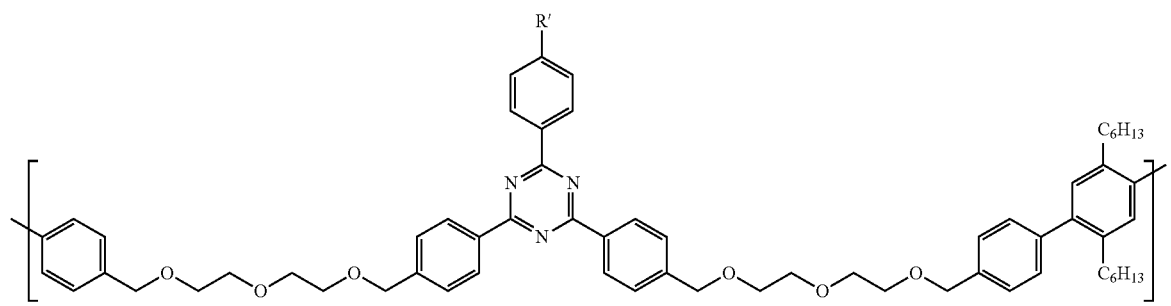
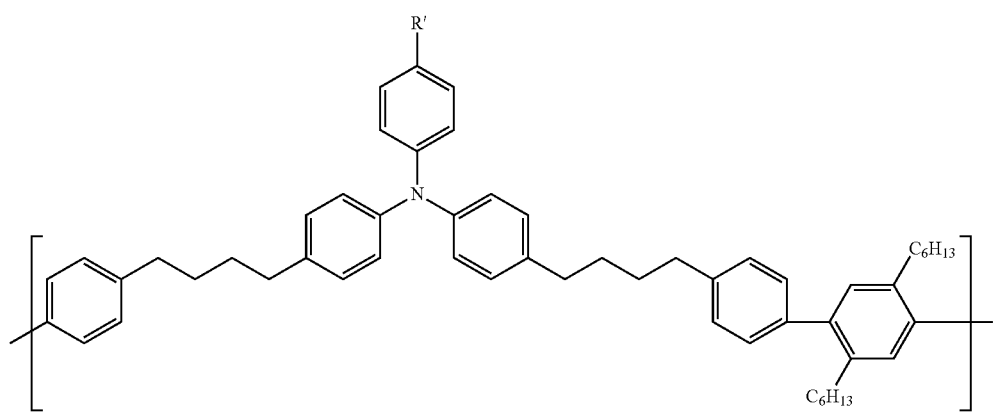
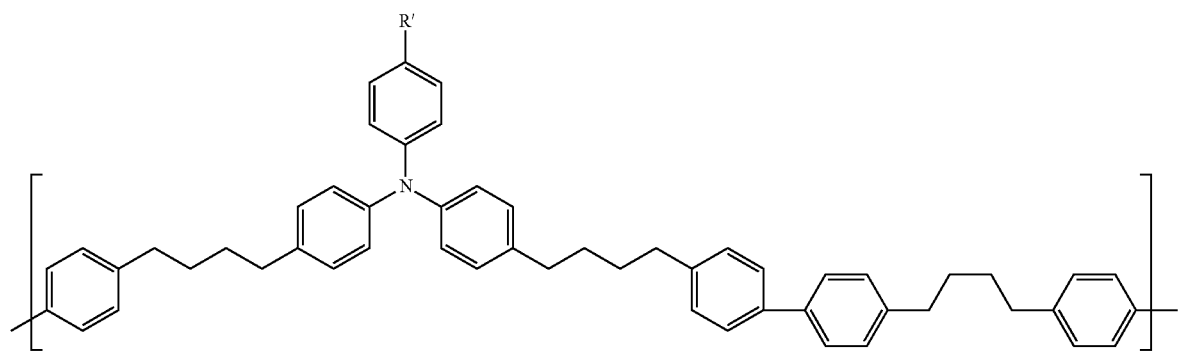

-continued
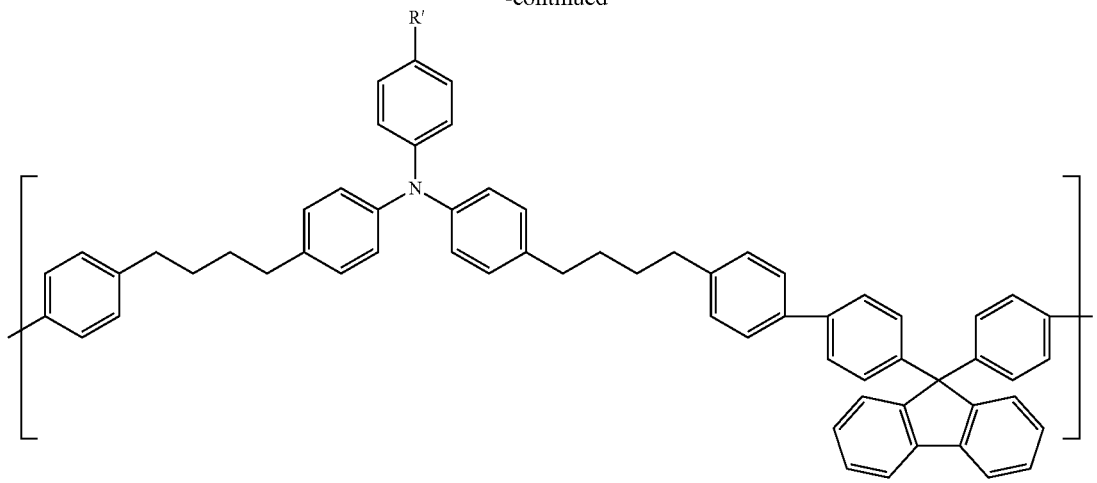
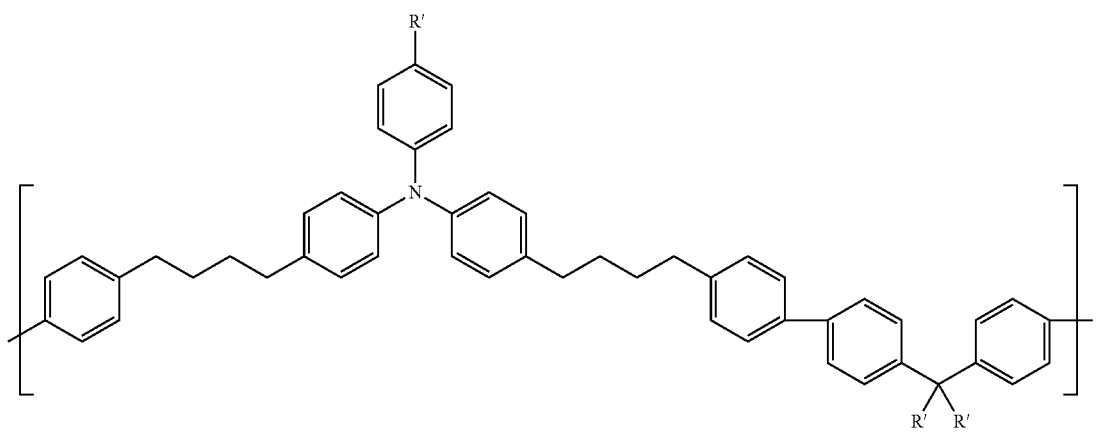
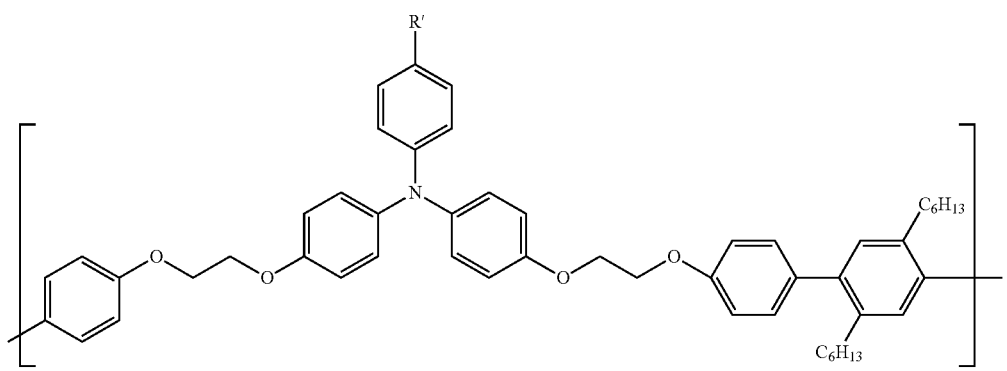
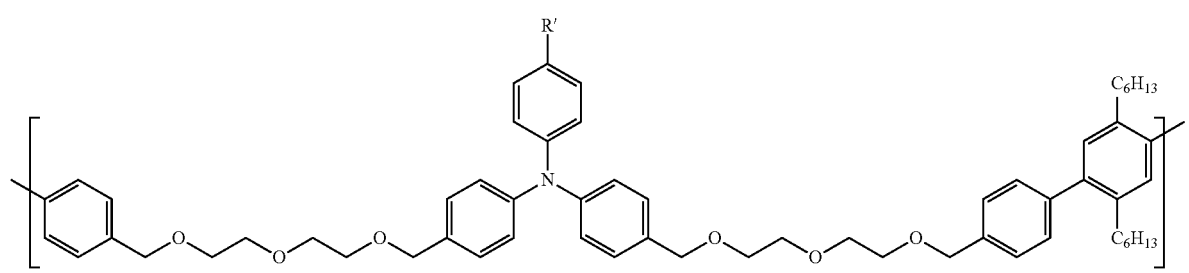

-continued
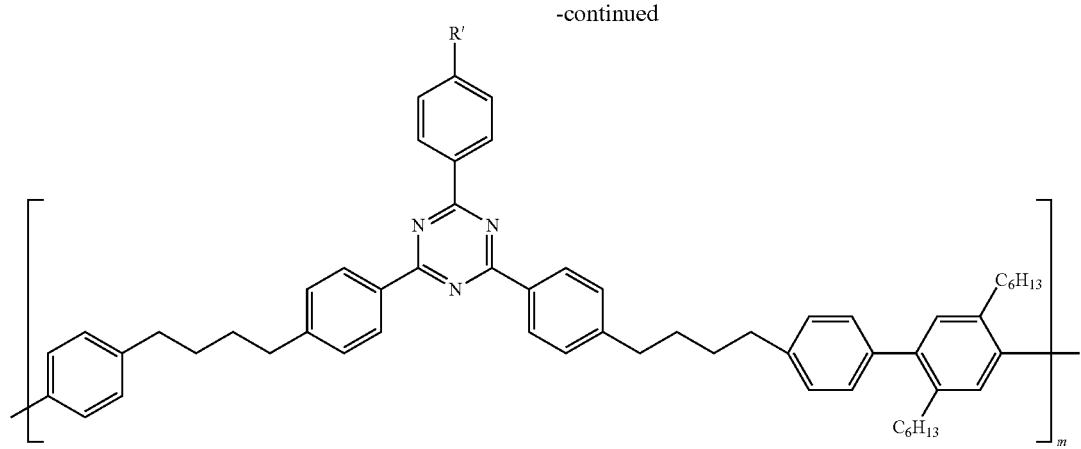
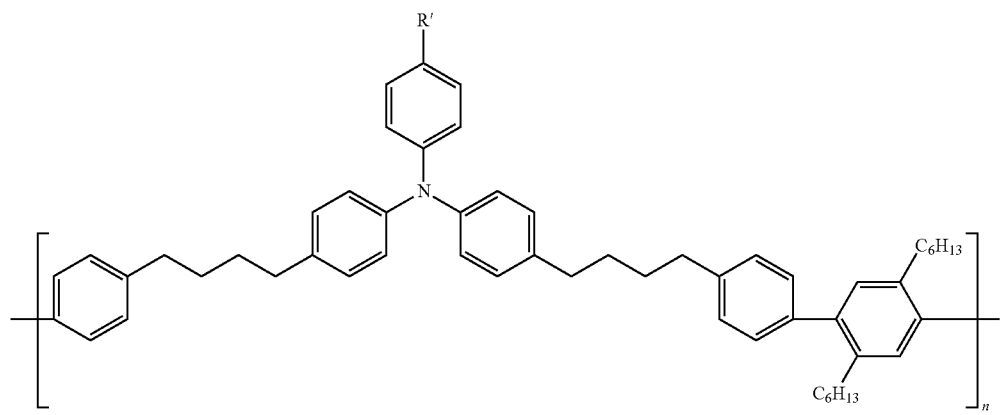
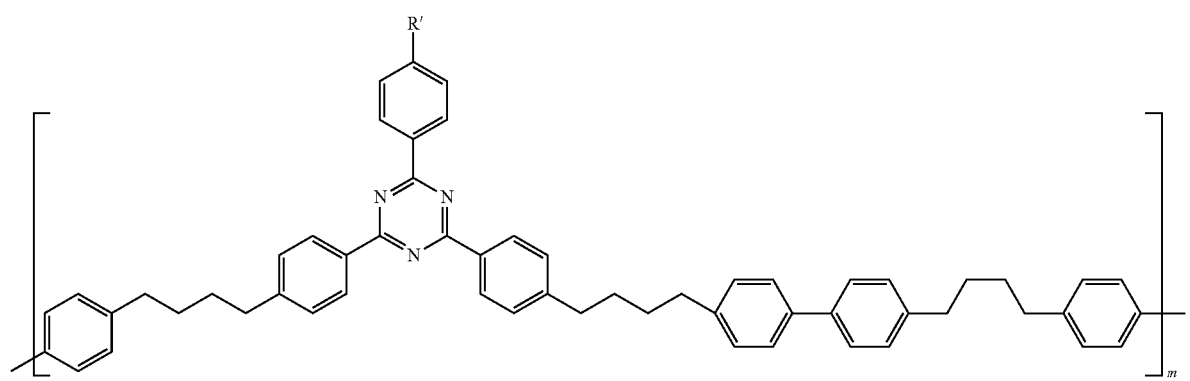
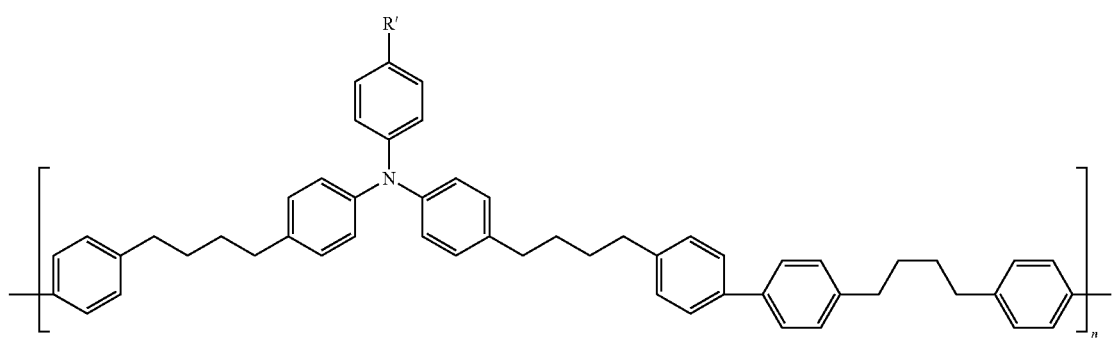

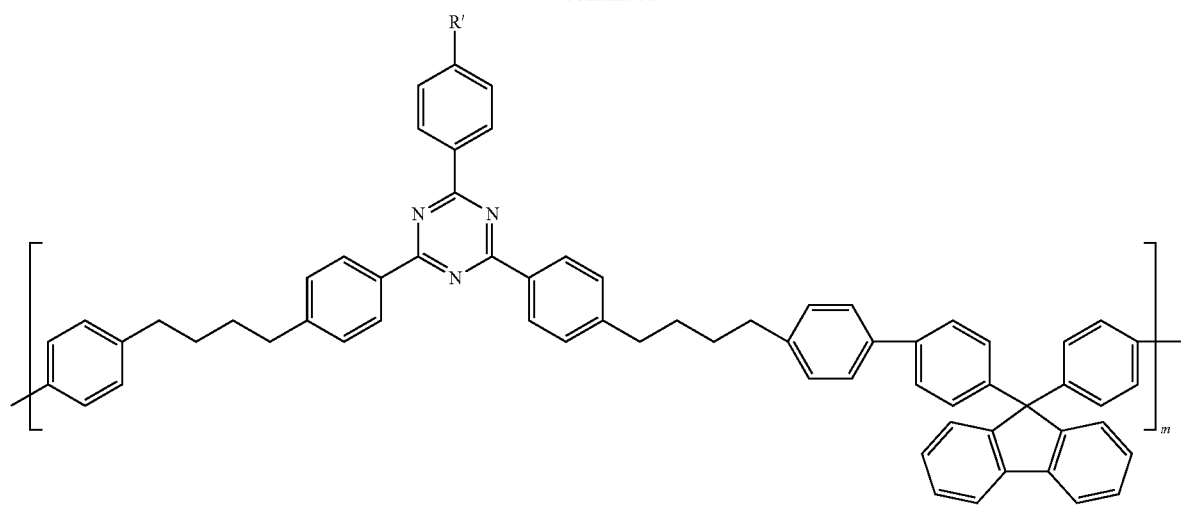
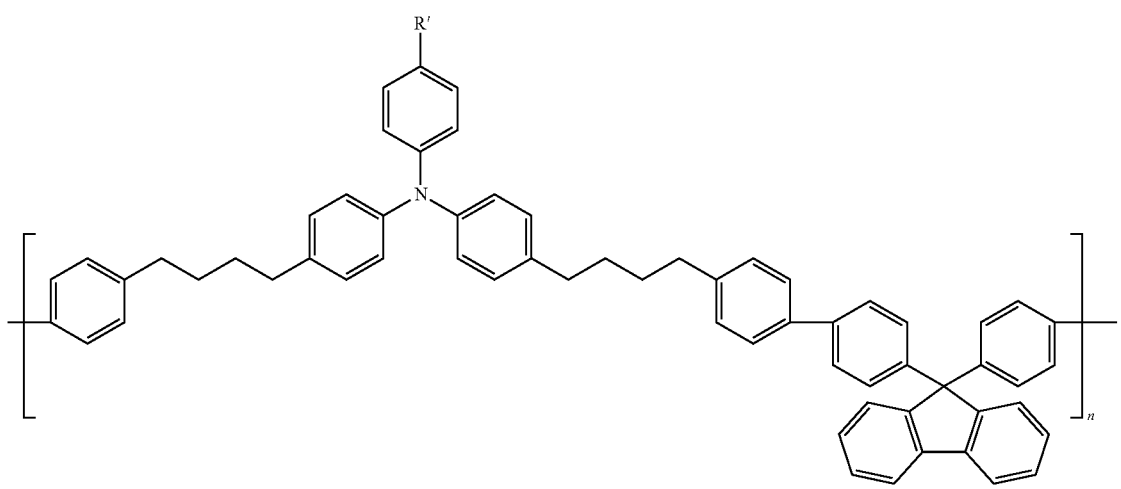
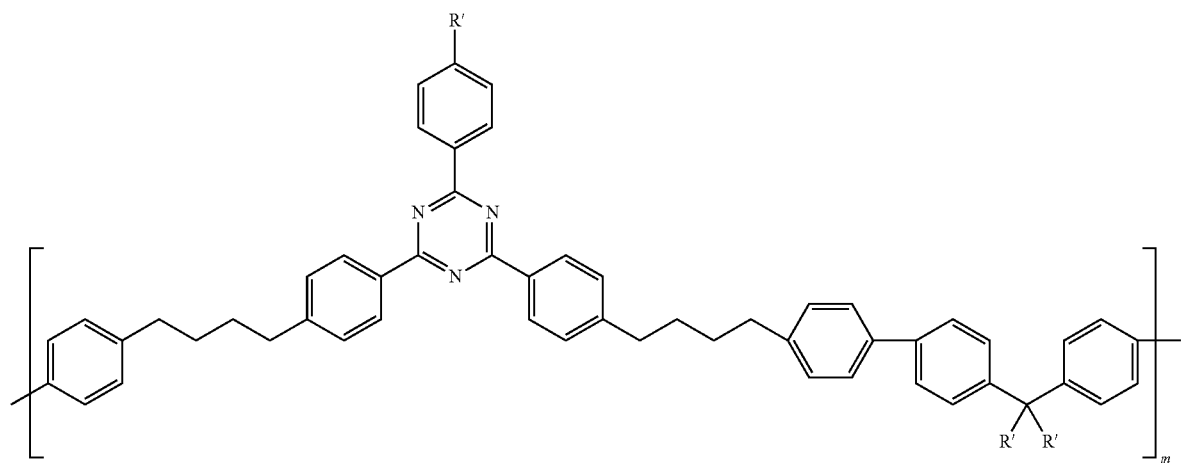

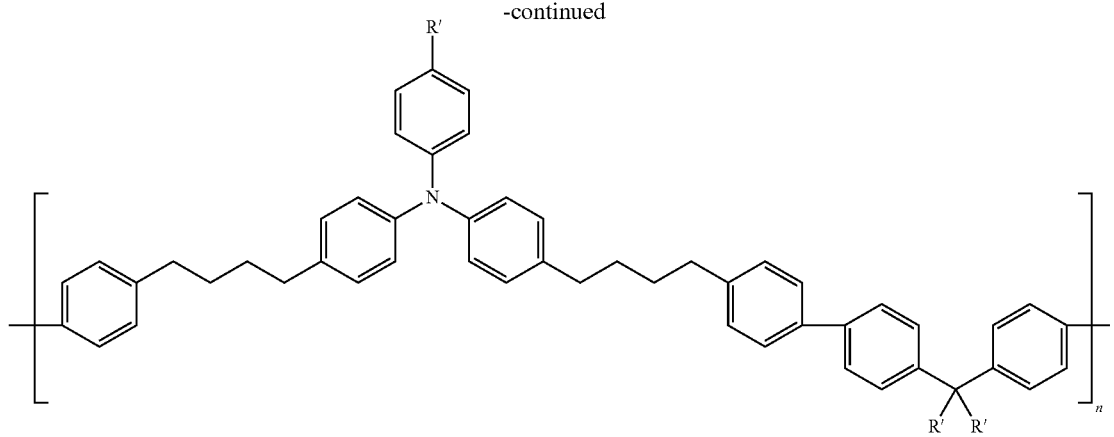
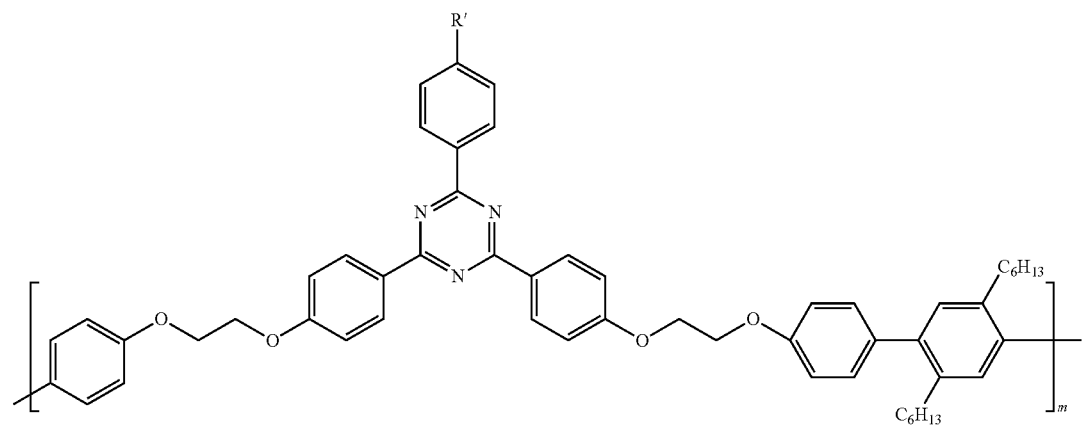
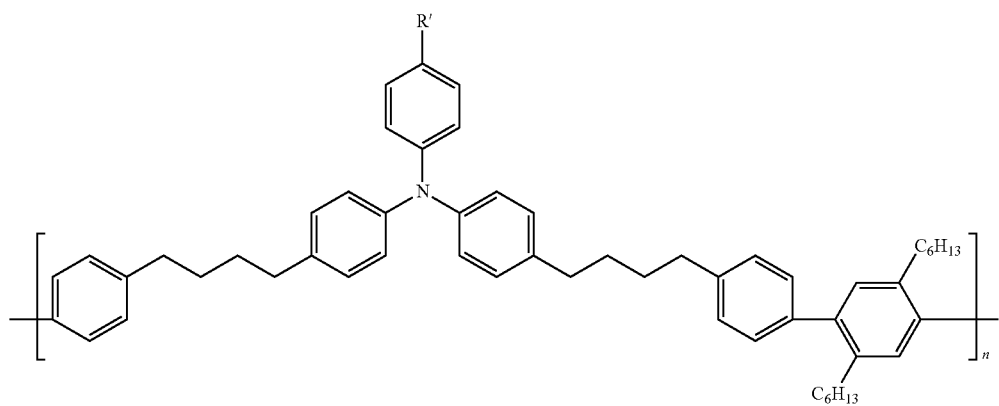
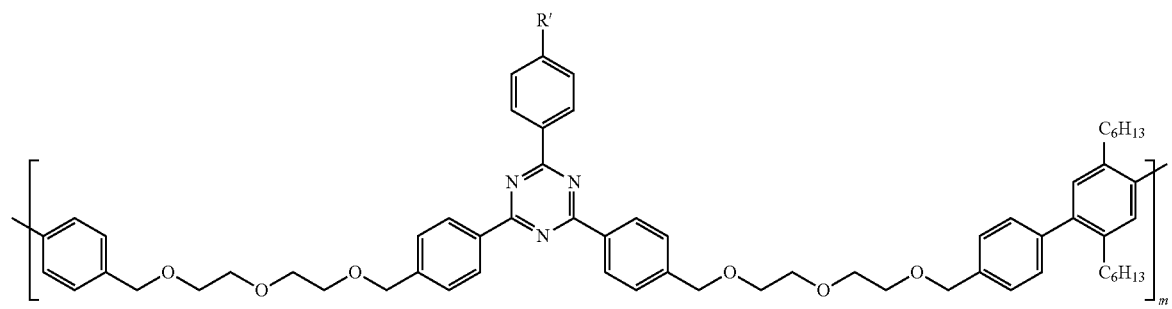

-continued

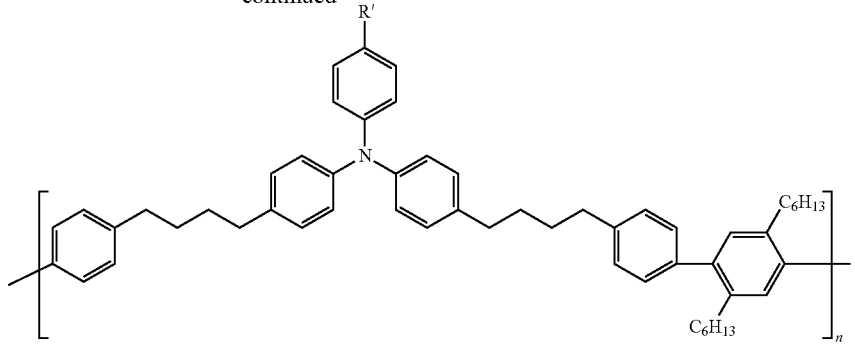

Light-Emitting Dopants

Materials that may be used as fluorescent or phosphorescent light-emitting dopants with the polymers of the invention include metal complexes comprising optionally substituted complexes of formula (III):

$$ML^1_q L^2_r L^3_s \qquad (III)$$

wherein M is a metal; each of $L^1$, $L^2$ and $L^3$ is a coordinating group; q is an integer; r and s are each independently 0 or an integer; and the sum of $(a \cdot q)+(b \cdot r)+(c \cdot s)$ is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals are particularly suitable for emission from triplet excited states. These metals form organometallic complexes with carbon or nitrogen donors such as porphyrin or bidentate ligands of formula (IV):

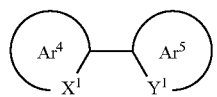

(IV)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

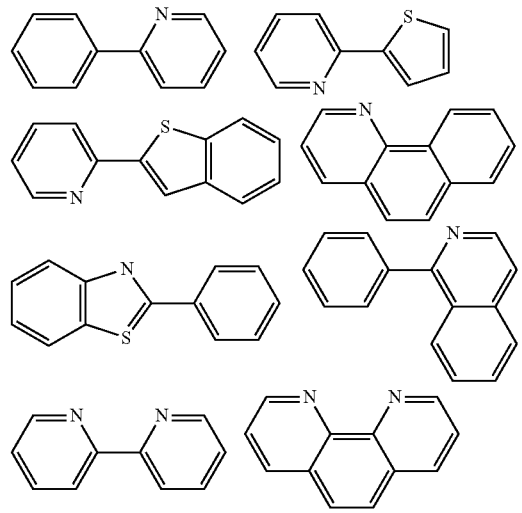

Each of $Ar^4$ and $Ar^5$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

The polymer of the invention and the light-emitting dopant may be physically mixed. Alternatively, the light-emitting dopant may be chemically bound to the polymer. The light-emitting dopant may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

This binding may result in more efficient transfer of excitons from the host polymer to the light emitting dopant because it may provide intramolecular exciton transfer pathways unavailable to a corresponding mixed system.

Moreover, binding may be beneficial for processing reasons. For example, if the light emitting dopant has low solubility then binding it to a soluble polymer allows the light emitting dopant to be carried in solution by the charge transporting material, enabling device fabrication using solution processing techniques. Furthermore, binding the light emitting dopant to the polymer may prevent phase separation effects in solution-processed devices that may be detrimental to device performance.

More than one light-emitting dopant may be used. For example, red, green and blue light-emitting dopants may be used to obtain white light emission. The polymer of the invention may also emit light, in particular blue light, that may be combined with emission from one or more further dopants to achieve white light.

A white light-emitting OLED may have a CIE x coordinate equivalent to that emitted by a black body at a temperature in the range of 2500-9000K, optionally in the range of 2700-4500K, and a CIE y coordinate within 0.05, optionally within 0.025, of the CIE y co-ordinate of said light emitted by a black body.

A blue light-emitter may have a photoluminescent spectrum with a peak at less than 480 nm, such as in the range of 400 nm up to less than 490 nm.

A green light-emitter may have a photoluminescent spectrum with a peak in the range of 490-560 nm.

An red light-emitter may have a photoluminescent spectrum with a peak in the range of greater than 560 nm-610 nm, optionally in the range 590-610 nm.

Light-Emitting Layer

In the case where an OLED comprises a hole transporting polymer according to the invention and/or an electron transporting layer according to the invention, the light-emitting layer is not necessarily a polymer according to the invention. In this case, exemplary light-emitting materials include small molecule, polymeric and dendrimeric materials, and compositions thereof. Suitable light-emitting polymers for use in layer 3 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

Hole Injection Layers

A conductive hole injection layer, which may be formed from a conductive organic or inorganic material, may be provided between the anode 2 and the light-emitting layer 3 to assist hole injection from the anode into the layer or layers of semiconducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Charge Transporting Layers

A hole transporting layer may be provided between the anode and the light-emitting layer. Likewise, an electron transporting layer may be provided between the cathode and the light-emitting layer.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between anode 2 and light-emitting layer 3 preferably has a HOMO level of less than or equal to 5.8 eV, more preferably around 4.8-5.6 eV. HOMO levels may be measured by cyclic voltammetry, for example.

If present, an electron transporting layer located between light-emitting layer 3 and cathode 4 preferably has a LUMO level of around 3-2 eV, more preferably of around 3-2.5 eV For example, a layer of a silicon monoxide or silicon dioxide or other thin dielectric layer having thickness in the range of 0.2-2 nm is provided between light-emitting layer 3 and layer 4.

A hole transporting layer may contain a polymer comprising hole transporting repeat units of formula (I); likewise, an electron transporting layer may contain a polymer comprising electron transporting repeat units of formula (I).

Alternatively, if the polymer is not present in a charge transporting layer then other materials with suitably high singlet or triplet level can be used in hole and/or electron transport layers. Particularly suitable are hole transport materials comprising a high singlet or triplet level backbone repeat unit, such as alkyl-substituted phenylene repeat units, in particular 2- and/or 5-alkyl substituted 1,4-phenylene repeat units, for example disclosed in Kreyenschmidt et al, Macromolecules 1998, 31, 1099-1103 and a hole transport unit, for example:

Comparative Example 1

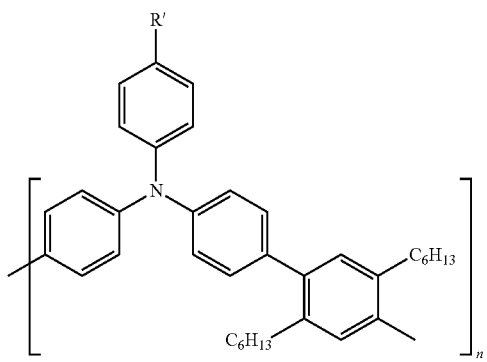

Optionally, the polymer may also contain one or more cross-linkable groups, for example benzocyclobutane groups or terminal olefins disclosed in, for example, WO 2005/049689 or oxetane groups. Cross-linkable groups may be bound to any of the repeat units of the polymer and more than one type of cross-linkable group may be present.

Suitable small molecule electron transport materials are disclosed in Shirota and Kageyama, Chem. Rev. 2007, 107, 953-1010 and references therein. Polymeric electron transport materials preferably comprise a high triplet level backbone monomer and electron transport unit as disclosed in, for example, US 2010/013377, for example:

Comparative Example 2

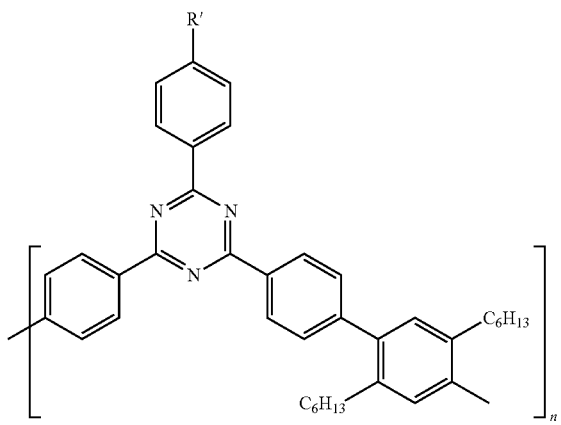

Cathode

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprise a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

OLEDs tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

Light-emitting layer 3, and/or charge-transporting layer(s), where present, may be deposited by any process, including vacuum evaporation and deposition from a solution in a solvent. In the case where the polymer comprises arylene groups, in particular arylene groups substituted with alkyl groups such as alkylphenylenes or alkylfluorenes, suitable solvents for solution deposition include mono- or poly-alkyl, alkoxy and halobenzenes such as toluene, xylene, anisole, chlorobenzene, dichlorobenzene and similar. Particularly preferred solution deposition techniques including printing and coating techniques, preferably spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

If multiple layers of an OLED are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

EXAMPLES

Monomer Example 1a

Intermediate compound 1 was prepared according to the following method:

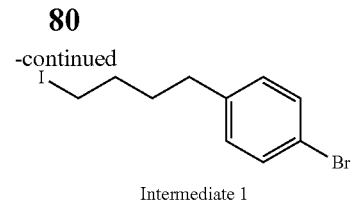

Intermediate 1

Under nitrogen, 38 g (161 mmol) 1,4-dibromobenzene in 500 ml anhydrous THF was cooled to <−70° C. 64 ml (161 mmol) n-BuLi (2.5 M in hexane) was added drop-wise at <−70° C. The reaction mixture was stirred as this temperature for 4 h. 50 g (161 mmol) 1,4-diiodobutane in 70 ml anhydrous was added drop-wise at <−70° C. The reaction was left to warm to RT over night. After quenching with 150 ml DI water, all volatiles were removed under reduced pressure. 500 ml hexane was added. After phase separation the organic layer was dried over $MgSO_4$ and all volatiles removed under reduced pressure to yield a brownish liquid containing desired product and a dibromo-byproduct. To convert bromo to iodo groups, 24 g (161 mmol) sodium iodide was dissolved in 240 ml acetone. The crude Intermediate 1 was dissolved in approx. 20 ml acetone and added. After heating to 65° C. for 20 min the mixture was cooled to RT, ether and water added. After phase separation, the organic layer was dried over $MSO_4$ and all volatiles removed under reduced pressure. The crude was purified via column chromatography (silica, 100% hexane). After high vacuum distillation, Intermediate 1 was obtained in 32% yield, 17.6 g.

Monomer 1a was prepared according to the following method:

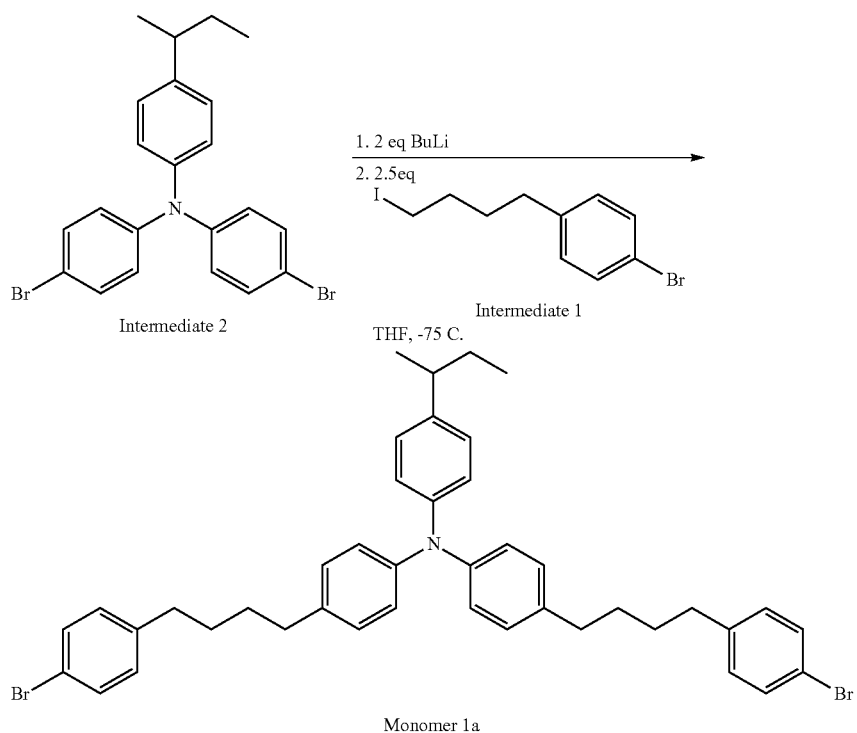

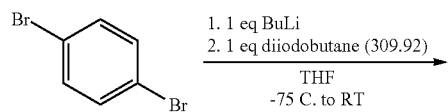

Under nitrogen, 2 g (4.36 mmol) Intermediate 2 in 30 ml anhydrous THF was cooled to <−70° C. 3.7 ml (9.15 mmol) n-BuLi (2.5 M in hexane) was added drop-wise at <−70° C. After 4.5 h at this temperature Intermediate 1 in 15 ml anhydrous THF was added drop-wise. The reaction mixture was left to warm to RT over night. After quenching with DI water, all volatiles were removed under reduced pressure. Ether was added and after phase separation the organic layer was dried over MgSO$_4$. Removal of all volatiles yielded a brown oil. Repeated column chromatography (silica, toluene/hexane 1:1) yielded Monomer 1a, 0.6 g, pure by GCMS.
Monomer 1 can be synthesised via an alternative route:
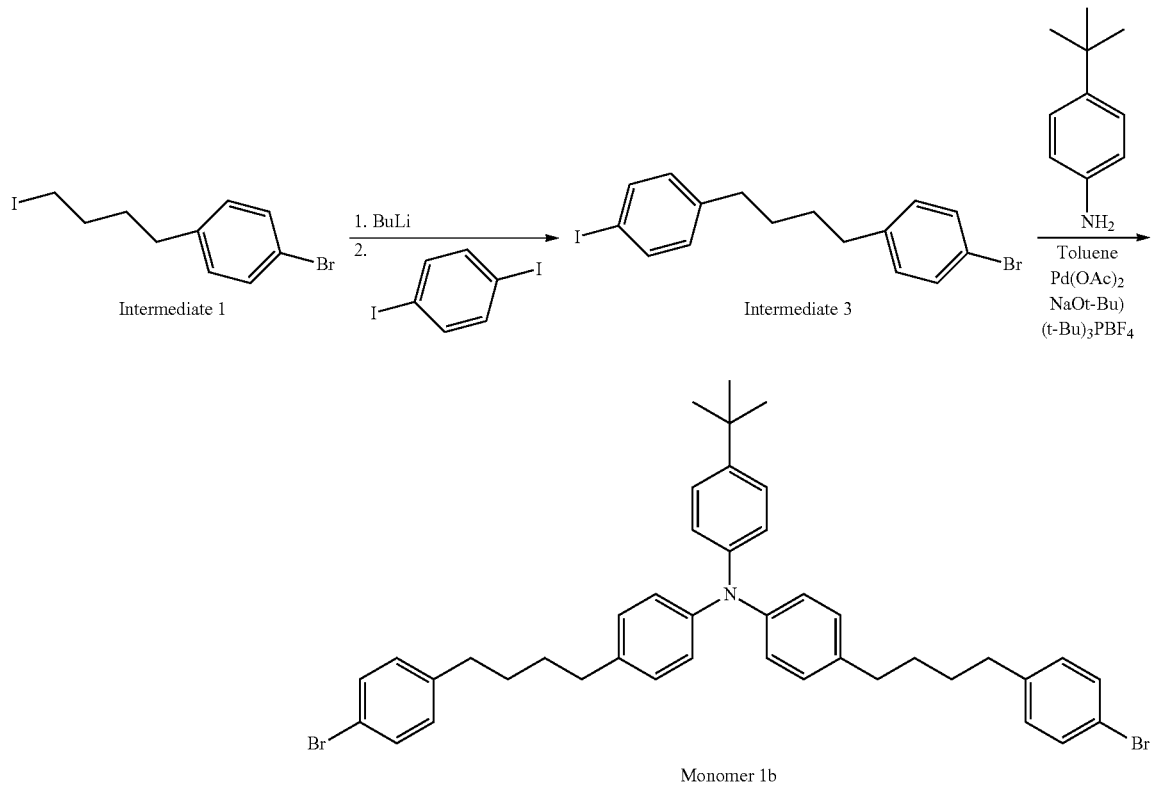
Monomer 1b
Monomer 2
Monomer 2 was prepared according to the following method:
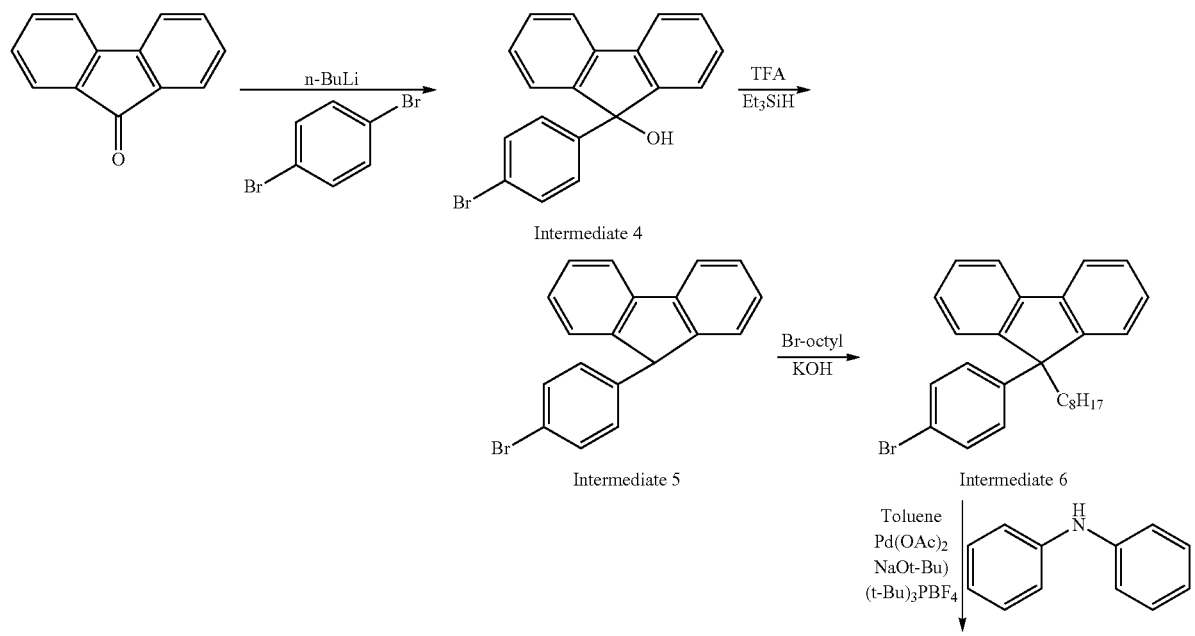

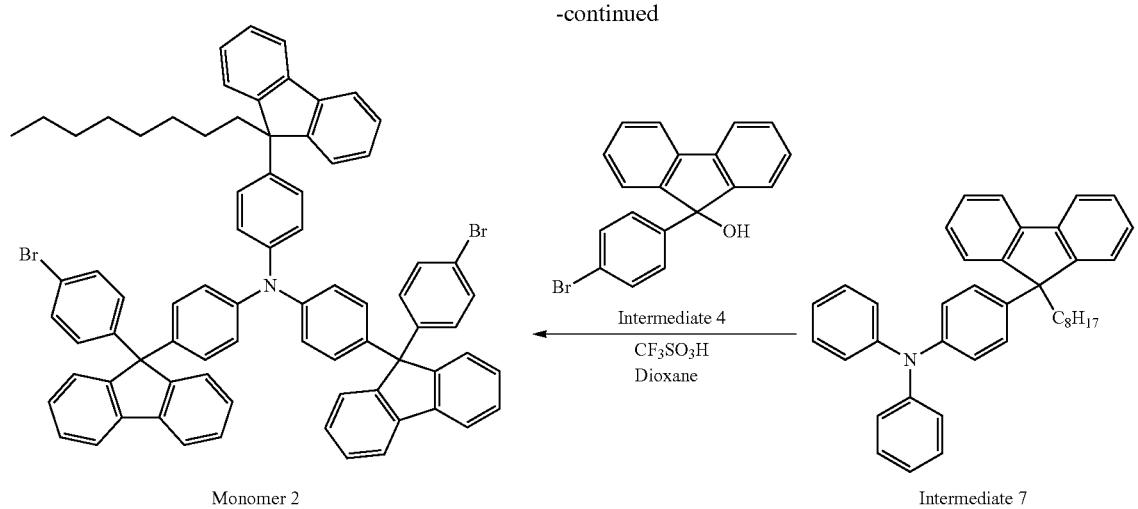

Monomer 2

Intermediate 7

Synthesis of Intermediate 4

To a stirred solution of 1,4-dibromobenzene (100 g, 424 mmol) in anhydrous THF (2 L) was added dropwise n-Butyllithium (2.5 M, 170 mL, 445 mmol) at −78° C. under nitrogen. After stirring at −78° C. for 4 h, then fluorenone (76.4 g, 424 mmol) was added portionwise. The resulting mixture was allowed to warm to room temperature overnight. The reaction was cooled to 0° C. and then quenched with water (250 mL), concentrated in-vacuo and diluted with diethyl ether (150 mL). The aqueous layer was extracted with diethyl ether (3×150 mL). The combined organic layer was washed with brine, dried (MgSO$_4$) and concentrated to give a pale brown oil. To this oil was added hexane (50 mL) and stirred at room temperature for 4 h, by which time a white solid precipitate had formed. The solid was filtered, washed with more hexane and dried under vacuum to give the product as a white solid (95% by GCMS, 104 g).

Synthesis of Intermediate 5

To a mixture of Intermediate 4 (70.5 g, 208 mmol) and triethylsilane (73 mL, 416 mmol) was treated with trifluoroacetic acid (160 mL) at 0° C. under nitrogen. The mixture was allowed to warm to room temperature overnight and then quenched with water (500 mL). The solid precipitate was filtered and the aqueous extracted with hexane (3×100 mL). The combined organic layer was washed with potassium phosphate solution (10% wt, 2×300 mL), dried (MgSO$_4$) and concentrated in-vacuo. The concentrated crude reaction was added dropwise to dichloromethane (250 mL) to give a solid precipitate. The resulting solid was filtered and dried under vacuum to give Intermediate 5 as a white solid (48.3 g, 72%).

Synthesis of Intermediate 6

A mixture of Intermediate 5 (48 g, 149 mmol), potassium hydroxide (40% wt, 373 mmol) and aliquant (0.60 g, 1.5 mmol) was treated with bromoctane (43.2 g, 223.6 mmol) under nitrogen. The resulting mixture was heated at 85° C. for 24 h with stirring under nitrogen. The reaction was quenched by adding water (150 mL) and then dichloromethane (200 mL). The aqueous layer was extracted with dichloromethane. The combined organic layer was washed with brine, dried ((MgSO$_4$) and concentrated to give Intermediate 6 as a yellow oil in 93% yield (60 g, 90% pure by GCMS).

Synthesis of Intermediate 7

Diphenylamine (27.6 g, 163 mmol) and Intermediate 6 (70 g, 162 mmol) were dissolved in toluene (1.5 L) and nitrogen was bubbled through the solution for 1 h. To this solution was added palladium acetate (0.73 g, 0.32 mmol) and tri-tert-butylphosphonium tetrafluoroborate (0.94 g, 0.32 mmol). The mixture was stirred for 15 minutes under nitrogen before sodium-tert-butoxide (23.4 g, 0.24 mmol) was added. The resulting mixture was refluxed for 18 h by which time tlc (8:1 hexane/ethyl acetate) analysis showed reaction had gone to completion. The reaction was cooled to room temperature and water (500 mL) was added. The crude reaction was passed through celite (12 cm diameter, 12 cm celite) washed with toluene (2 L) and filtrate concentrated in-vacuo to give an oil. The oil was dissolved in hexane (500 mL) and passed through silica plug (12 cm diameter sinter funnel, 12 cm silica) eluting with hexane (2 L) and then 10:1 hexane/ethyl acetate (1 L). The filtrate was concentrate under vacuum to give Intermediate 7 as pale yellow oil in 55% yield (47 g, >98% pure by GCMS).

Synthesis of Monomer 2

To a stirred solution of Intermediate 4 (16.7 g, 49.4 mmol) and Intermediate 7 (12.9 g, 24.7 mmol) in anhydrous dioxane (300 mL) was added dropwise trifluoromethane sulfonic acid (5.8 mL, 66.1 mmol) under nitrogen. The mixture was heated at 80° C. for 3 h and then cooled to room temperature and then added dropwise to methanol (3 L) to give a solid precipitate. The solid was filtered, washed with methanol and dried under vacuum (91% pure by HPLC). The solid was further purified by column chromatography using 20% dichloromethane in hexane as the eluting solvent to give 15 g of product at 98% purity by HPLC. Repeated recrystallisation in n-butylacetate (100 mL) increased purity to 99% by HPLC. Traces of n-butylacetate were removed by recrystallisation in 10:1 methanol/dichloromethane to give the product as a white solid in 20% yield (5.5 g, 99% purity by HPLC).

Monomer 3

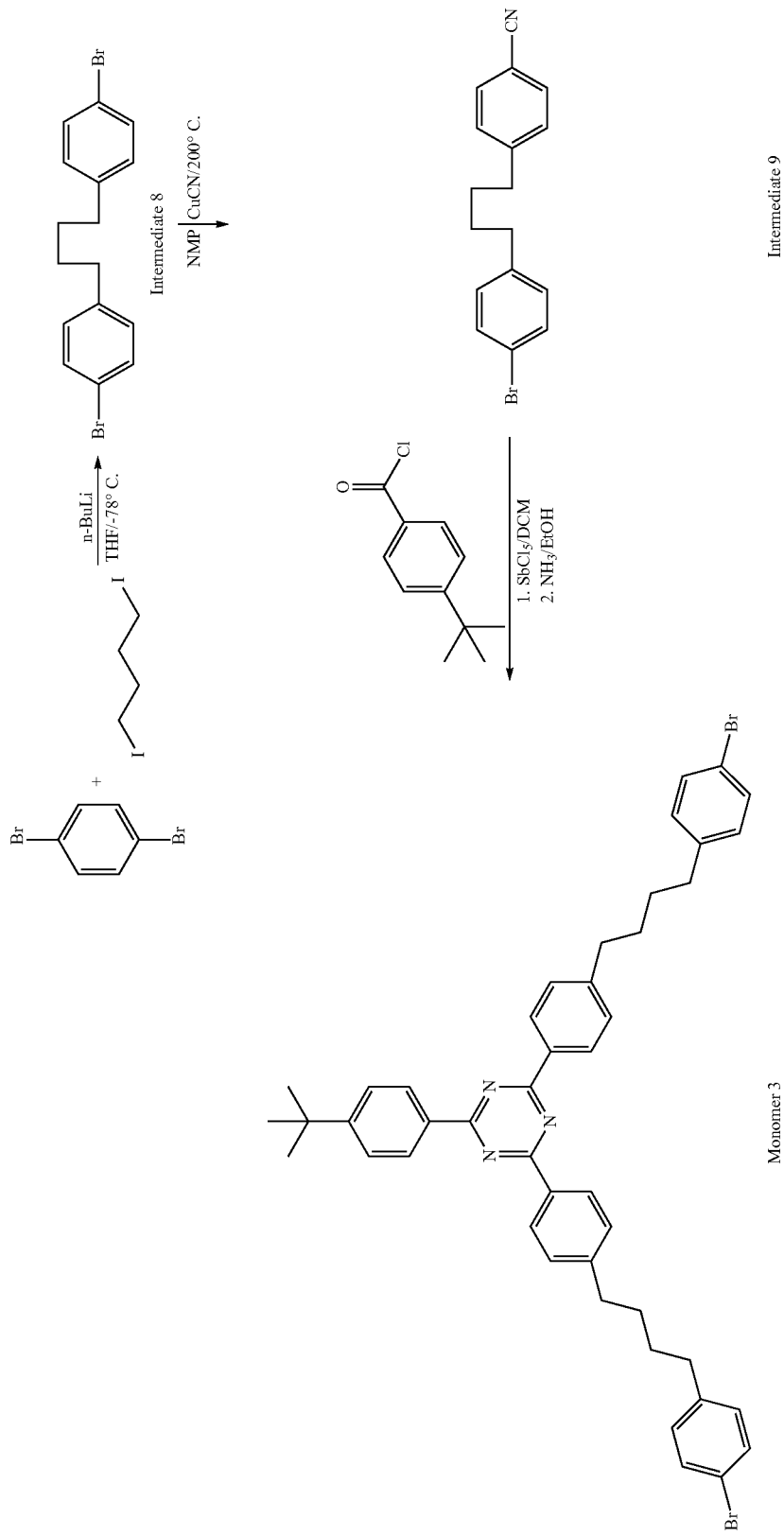

Synthesis of Intermediate 8

To a stirred solution of 1,4-dibromobenzene (506.7 g, 2.15 mol) in tetrahydrofuran (3 L) was added dropwise a solution of n-butyllithium (2.5 M in hexane) at −78° C. under nitrogen. The resulting mixture was allowed to warm to room temperature overnight and quenched with water (300 mL). The crude reaction mixture was concentrated in vacuo to give a residue that was taken up in diethyl ether/water (3:1, 400 mL). The aqueous layer was extracted with diethyl ether (3×100) and the combined organic extracts was washed with brine, dried (MgSO$_4$) and concentrated in vacuo to give oil that solidified to give a yellow crystals overnight. The solid was triturated with methanol (200 mL) overnight, filtered and dried under vacuum. The solid was purified further by vacuum sublimation (140° C., 10$^{-3}$ mbar) to give the product as a white solid (98% pure by GCMS, 65 g).

Synthesis of Intermediate 9

A mixture of Intermediate 8 (50.1 g, 136.1 mmol) and copper cyanide (12.2 g, 136.1 mmol) in N-methylpyrridinone (135 mL) was bubbled through nitrogen gas for 30 minutes. The resulting mixture was heated at 200° C. for 6 h and then cooled to room temperature. The reaction was diluted with diethyl ether (200 mL) and water (100 mL). The brown solid precipitate was filtered and washed with diethyl ether (200 mL). The combined filtrate was transferred in to a separating funnel, the organic layer separated and the aqueous extracted with ether (3×100 mL). The combined organic layer was washed with brine, dried (MgSO$_4$) and concentrated in vacuo to give a brown solid that was purified by column chromatography eluting with 5% ethyl acetate in hexane to give a white solid. This material was sublimed in vacuo at 180° C. to give the product in more than 99% purity by GCMS (12.4 g).

Synthesis of Monomer 3

To a stirred solution of tert-butylbenzoylchloride (3.9 g, 19.6 mmol) and Intermediate 9 (12.3 g, 39.1 mmol) in dichloromethane (80 mL) was added dropwise antimony pentachloride (5.9 g, 19.6 mmol) at 0° C. under nitrogen. The resulting mixture was stirred at this temperature for 30 minutes, then at room temperature for 2 h and finally at 45° C. for 9 h. The reaction was transferred in to a dropping funnel via cannula and added dropwise to a solution of ethanol in ammonia (2 M) at 0° C. The crude reaction was concentrated under vacuum to give a solid that was Soxhlet extracted in hexane overnight. The hexane layer concentrated to give a solid that was purified by column chromatography using hexane/dichloromethane (3:1) as eluent to give a white solid. This material was recrystallised four times from n-butylacetate/methanol (1:1) to give the product in 98% purity by HPLC (5.6 g).

Monomer 4

Monomer 4 could be prepared according to the following method:

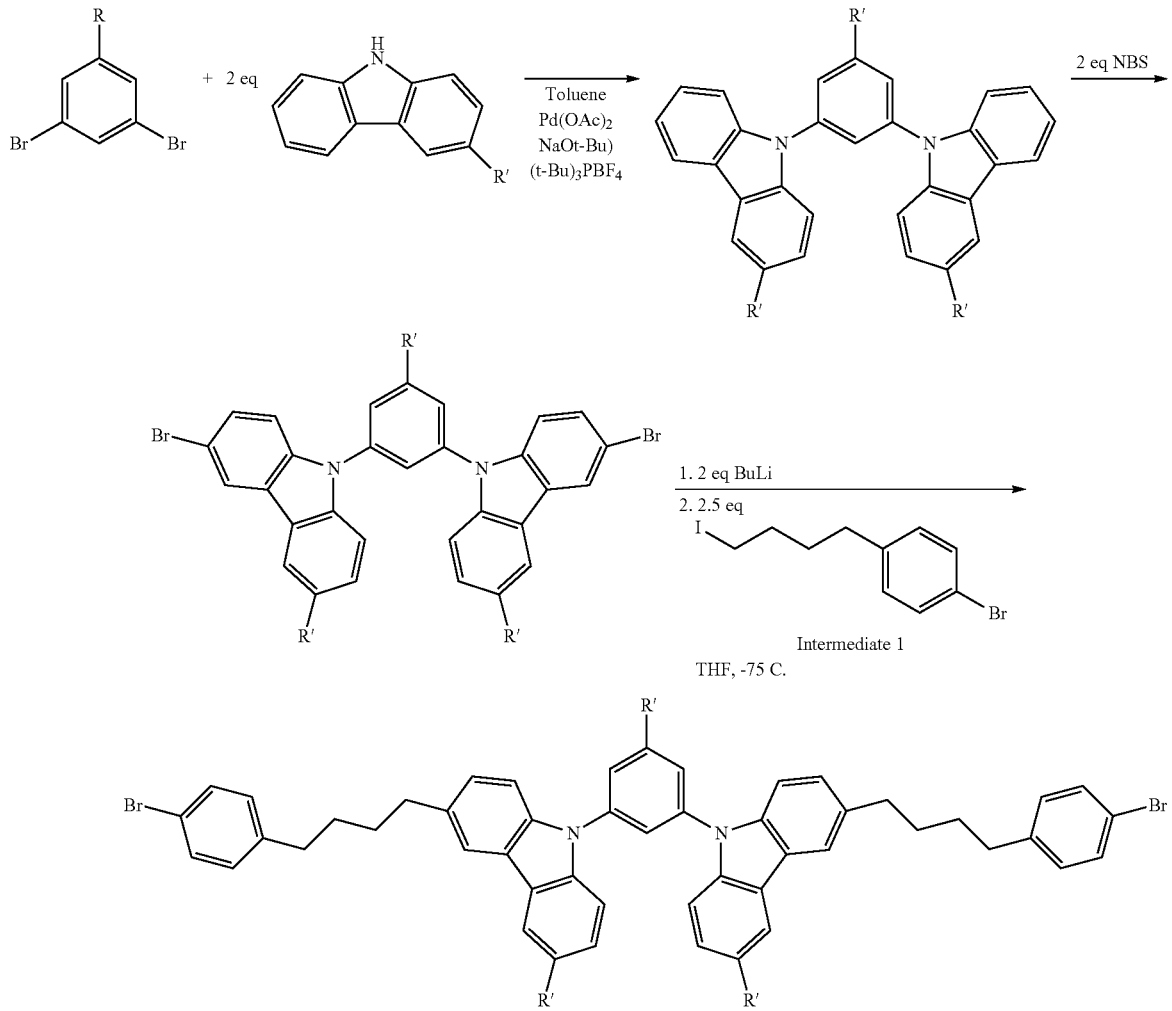

Polymer Examples
Polymers were formed by polymerisation of monomers 1-11.
Monomers
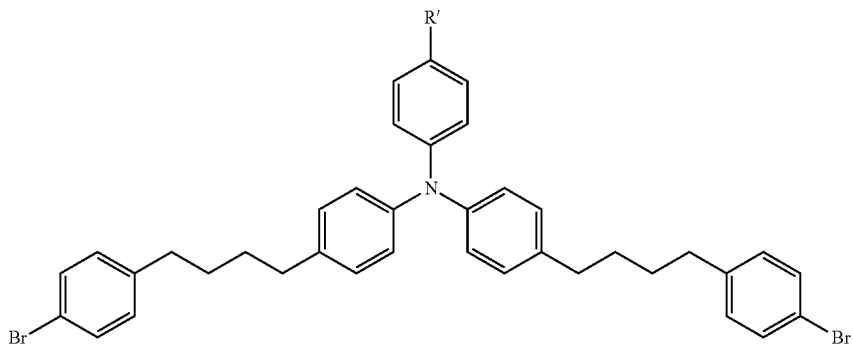
Monomer 1a: R' = sec-butyl
Monomer 1b: R' = tert-butyl
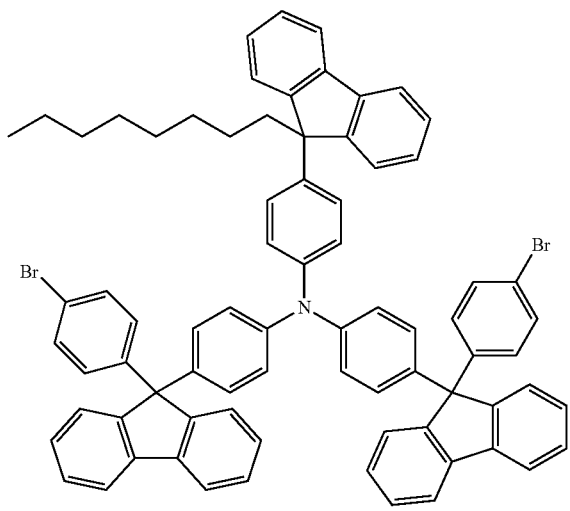
Monomer 2
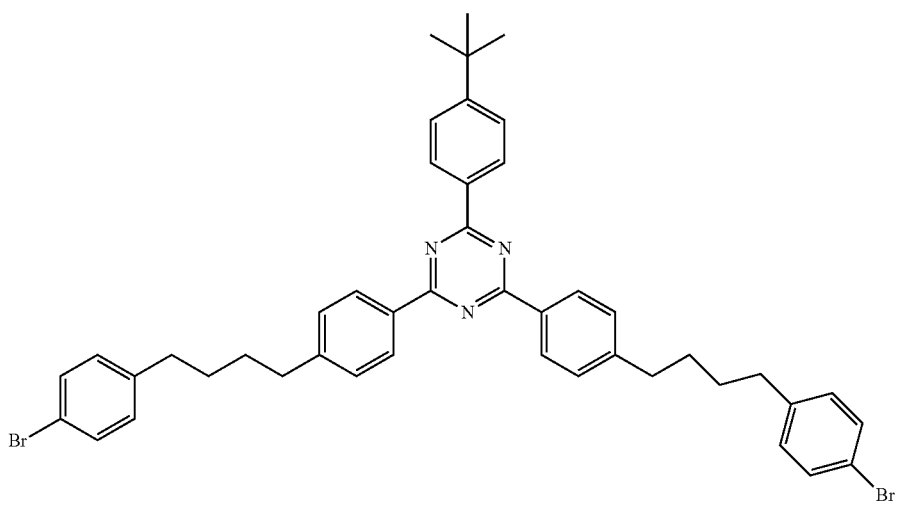
Monomer 3

Monomer 4
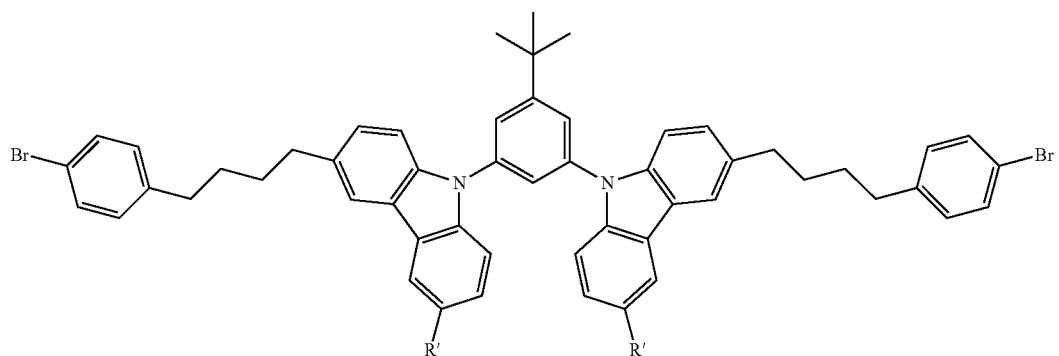
Monomer 5
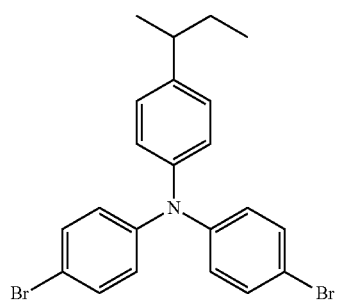
Monomer 6
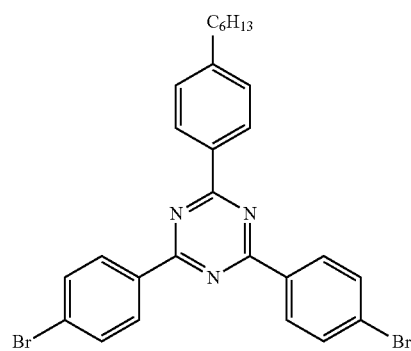
Monomer 7
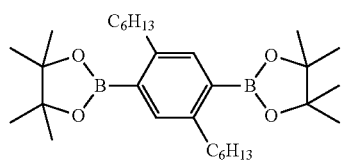
Monomer 8
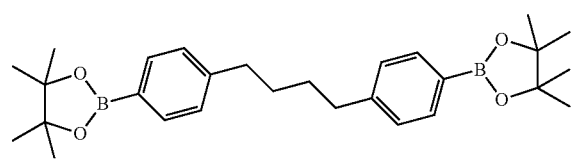
Monomer 9
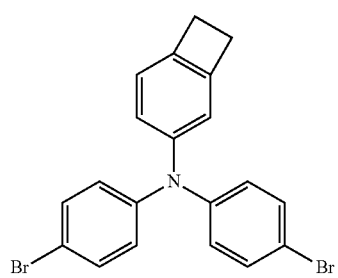
Monomer 10
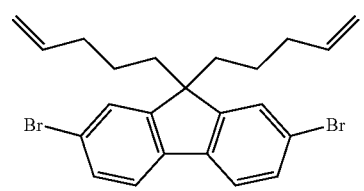
Monomer 11
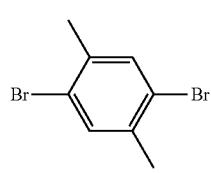

Monomers were polymerised by Suzuki polymerisation according to the method described in WO 00/53656.

Table 1 summarises compositions and molecular weight characteristics (GPC, relative to polystyrene standard).

Samples were prepared by dissolving 2 mg of polymer in 6 ml GPC grade THF (stabilised with 250 ppm BHT). Injection volume was 200 μl (injection loop), flowrate 1 ml/min, oven temperature 35° C. for separation 3×5 μm Mixed B PLgel 300 by 7.5 mm columns with 5 μm Guard column were used. All GPC data quoted are relative to narrow polystyrene standards (used as received by Polymer Laboratories).

TABLE 1

POLYMER COMPOSITIONS AND GPC DATA
(RELATIVE TO POLYSTYRENE STANDARD)

| Name | Composition | | GPC | | | |
|---|---|---|---|---|---|---|
| | Monomer A | Monomer B | Mw | Mp | Mn | Pd |
| Comparative example 1 | 50% Monomer 5 | 50% Monomer 7 | 315,000 | 327,000 | 45,000 | 7.03 |
| Polymer 1 | 50% Monomer 2 | 50% Monomer 8 | 38,000 | 41,000 | 13,000 | 3.05 |
| Comparative example 2 | 50% Monomer 6 | 50% Monomer 7 | 262,000 | 286,000 | 48,700 | 5.39 |
| Polymer 2 | 50% Monomer 3 | 50% Monomer 7 | 73,100 | 73,400 | 15,500 | 4.72 |

Table 2 summarises PLQY data of a blend of emitter in polymer (5% w/w emitter).

Emitters

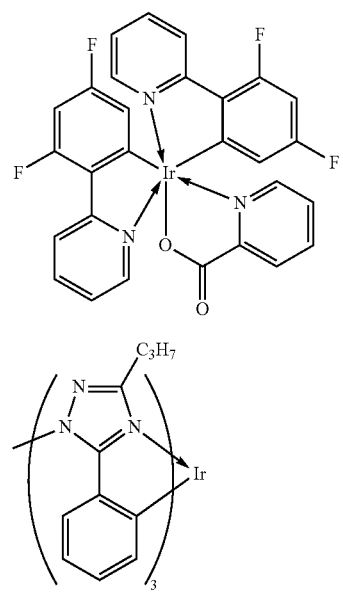

Emitter 1

Emitter 2

Figure 2:
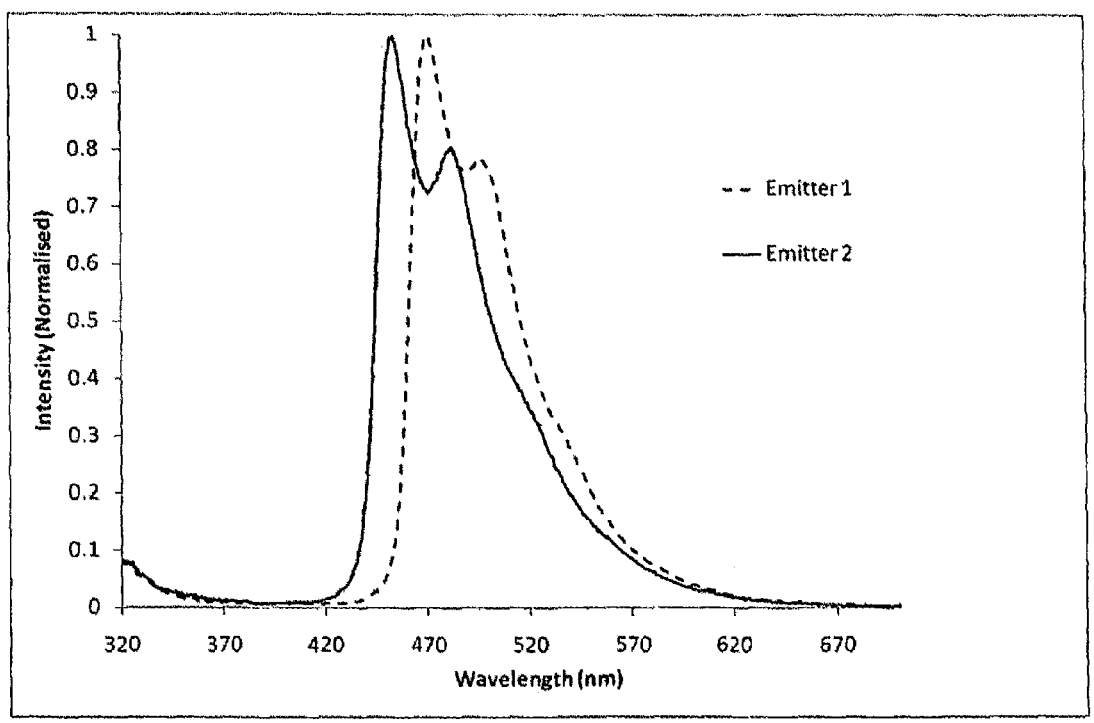
FIG. 2 illustrates the photoluminescence spectra of two blue-light emitting phosphorescent materials.

Emitter 2 has a deeper blue colour (i.e. shorter peak wavelength) than Emitter 1, as illustrated by the photoluminescence spectra of FIG. 2, and accordingly has a higher $T_1$ level than Emitter 1.

Emitter 1 was used as received from American Dye Source Ltd., Emitter 2 was prepared as described in Shih-Chun Lo et al., Chem. Mater. 2006, 18, 5119-5129.

For PLQY measurements films were spun from a suitable solvent (for example alkylbenzene, halobenzene, alkoxybenzene) on quartz disks to achieve transmittance values of 0.3-0.4. Measurements were performed under nitrogen in an integrating sphere connected to Hamamatsu C9920-02 with Mercury lamp E7536 and a monochromator for choice of exact wavelength.

As can be seen significantly higher PL efficiencies can be achieved for Emitter 1 in Polymer 1 relative to Comparative Example 1 and in Polymer 2 relative to Comparative Example 2.

With a deeper blue emitter, Emitter 2, quenching is observed for blends in Polymer 1 but not for Polymer 2, which has a higher triplet level than Comparative Example 1 and 2.

TABLE 2

PLQY DATA (BLEND OF 5% W/W EMITTER IN POLYMER)

| Polymer | Emitter | Excitation | PLQY/% | CIE X | CIE Y |
|---|---|---|---|---|---|
| Comparative example 1 | Emitter 1 | 325 | 11 | 0.166 | 0.232 |
| Polymer 1 | Emitter 1 | 310 | 62 | 0.160 | 0.355 |
| Comparative Example 2 | Emitter 1 | 330 | 13 | 0.170 | 0.314 |
| Polymer 2 | Emitter 1 | 305 | 71 | 0.157 | 0.339 |
| Comparative example 1 | Emitter 2 | 310 | 4 | 0.181 | 0.193 |
| Polymer 1 | Emitter 2 | 310 | 17 | 0.164 | 0.246 |
| Comparative example 2 | Emitter 2 | 330 | 5 | 0.287 | 0.416 |
| Polymer 2 | Emitter 2 | 300 | 56 | 0.157 | 0.214 |

General Device Structure

A device having the following structure was formed:

ITO/HIL/HTL/EL/MF/Al wherein ITO represents an indium-tin oxide anode; HIL is a hole-injection layer formed from a hole injection material available from Plextronics, Inc; HTL is a hole transport layer, for example those of Comparative Example 1 or a polymer of formula (I); EL is an light-emitting layer comprising a polymer as described in the polymer examples; MF is a metal fluoride; and the bilayer of MF/Al forms a cathode for the device. A layer of silver may be formed over the bilayer.

General Device Process

A substrate carrying ITO was cleaned using UV/Ozone. The hole injection layer was formed by spin-coating an aqueous formulation of a hole-injection material available from Plextronics, Inc. A hole transporting layer HT1 or HT2 was formed to a thickness of 20 nm by spin-coating and crosslinked by heating. A light-emitting layer was formed by depositing a light-emitting formulation to a thickness of 75 nm by spin-coating from o-xylene solution. A cathode was formed by evaporation of a first layer of a metal fluoride to a thickness of about 2 nm, a second layer of aluminium to a thickness of about 200 nm and an optional third layer of silver.

Table 3 summarises compositions and Table 4 molecular weight characteristics (GPC, relative to polystyrene standard).

TABLE 3

POLYMER COMPOSITIONS

| Name | Composition | | | |
|---|---|---|---|---|
| HT1 (Comparative) | 50% Monomer 7 | 35% Monomer 5 | 10% Monomer 9 | 5% Monomer 10 |
| HT2 (Inventive) | 50% Monomer 1b | 35% Monomer 5 | 10% Monomer 9 | 5% Monomer 10 |
| Polymer 2 (Inventive) | 50% Monomer 3 | 50% Monomer 7 | | |
| Polymer 3 (Comparative) | 50% Monomer 7 | 28.5% Monomer 6 | 21.5% Monomer 11 | |

TABLE 4

GPC DATA (RELATIVE TO POLYSTYRENE STANDARD)

| | GPC/Dalton | | | |
|---|---|---|---|---|
| Name | Mw | Mp | Mn | Pd |
| HT1 | 205,000 | 166,000 | 43,000 | 4.78 |
| HT2 | 147,000 | 118,000 | 15,000 | 10.08 |
| Polymer 2 | 230,000 | 170,000 | 17,800 | 12.40 |
| Polymer 3 | 343,000 | 319,000 | 78,000 | 4.42 |

Emitters Used in Device Example:

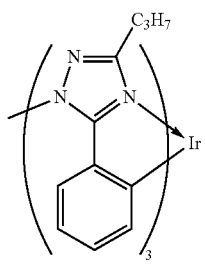

Emitter 2

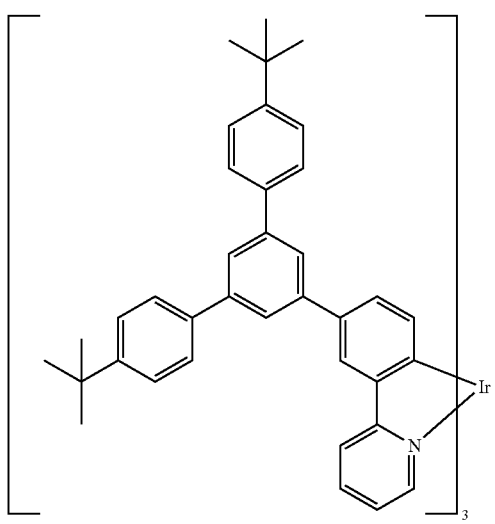

Emitter 3

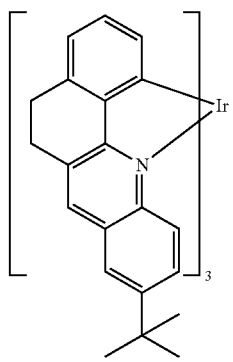

Emitter 4

Emitter 2 is a blue emitter, Emitter 3 is a green emitter, Emitter 4 is an orange-red emitter.

Device Example 1

A blue light-emitting OLED was fabricated as described in the General Device Process above. HT2 was used as the hole transport layer, and the light-emitting layer was formed from a blend of Polymer 2 and Emitter 2. For the purpose of comparison, Comparative Device 1 was formed in the same way except that Polymer 2 was replaced with the comparative polymer, Polymer 3. The composition of the emissive layer of Device Example 1 and Comparative Device 1 is shown in Table 5 below.

TABLE 5

| | Composition of the emissive layer (wt %) | | |
|---|---|---|---|
| | Polymer 3 (Comparative) | Polymer 2 (Inventive) | Emitter 2 |
| Comparative Device 1 | 80 | | 20 |
| Inventive Device Example 1 | | 80 | 20 |

Device results are set out below in Table 6. It can be seen that external quantum efficiency (EQE), candela per ampere efficiency and lumen per watt efficiency of Inventive Device Example 1 are all higher than Comparative Device Example 1. The triplet level of Polymer 2 is higher, thereby causing less quenching of phosphorescent blue emission of Emitter 2.

TABLE 6

| | Device performance at 1,000 cd/m² | | | | At 400 cd/m² | |
|---|---|---|---|---|---|---|
| | EQE (%) | Efficiency (Cd/A) | Efficiency (Lm/W) | Drive Voltage (V) | CIE (x, y) | LT50 (h) |
| Comparative Device Example 1 | 3.1 | 7.4 | 3.3 | 7.2 | 0.209, 0.379 | 0.5 |
| Inventive Device Example 1 | 13.0 | 19.6 | 7.4 | 8.3 | 0.151, 0.205 | 0.4 |

Device Example 2

A blue light-emitting OLED was fabricated as described in the General Device Process above. The hole transporting layer was formed by spin-coating inventive hole transporting polymer HT2. The composition of the emissive layer is shown in Table 7 below. For the purpose of comparison, a Comparative Device 2 was formed in the same way, except that polymer HT2 was replaced with comparative polymer HT1.

TABLE 7

| | Composition of the emissive layer (wt %) | |
|---|---|---|
| | Polymer 2 | Emitter 2 |
| Comparative Device 2 | 80 | 20 |
| Device Example 2 | 80 | 20 |

Device results are set out below in Table 8. It can be seen that external quantum efficiency (EQE), candela per ampere efficiency and lumen per watt efficiency of Device Example 2 are all higher than Comparative Device 2. The triplet level of inventive polymer HT2 is higher, thereby causing less quenching of phosphorescent blue emission.

TABLE 8

| | Device performance at 1,000 cd/m² | | | | At 400 cd·m² | |
|---|---|---|---|---|---|---|
| | EQE (%) | Efficiency (Cd/A) | Efficiency (Lm/W) | Drive Voltage (V) | CIE (x, y) | LT50 (h) |
| Comparative Device 2 | 10.8 | 15.7 | 6.5 | 7.6 | 0.148, 0.199 | 0.8 |
| Inventive Device Example 2 | 12.2 | 18.4 | 6.9 | 8.3 | 0.150, 0.200 | 0.4 |

Device Examples 3 and 4

White light-emitting OLED were fabricated as described in the General Device Process above. The composition of the hole transporting and emissive layers are shown in Table 9 below. For the purpose of comparison, a Comparative Device 3 was formed in the same way as Device Example 4, except that inventive polymer HT2 was replaced with comparative polymer HT1.

TABLE 9

| | Hole transport layer | Composition of the emissive layer (wt %) | | | | |
|---|---|---|---|---|---|---|
| | | PVK | ET1 | Polymer 2 | Emitter 2 | Emitter 3 | Emitter 4 |
| Comparative Device 3 | HT1 | 68.3 | 20 | | 10 | 0.9 | 0.8 |
| Device Example 3 | HT2 | | | 78.2 | 20 | 1.0 | 0.8 |
| Device Example 4 | HT1 | | | 78.2 | 20 | 1.0 | 0.8 |

PVK and ETL1 are as Illustrated Below:

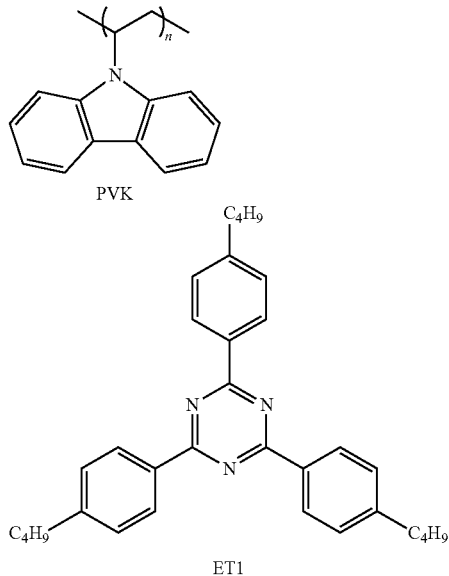

PVK (Sigma-Aldrich, Mw 1,734,000) was further purified by precipitation from chlorobenzene into methanol. ET1 was synthesised following the general procedure disclosed in WO 2008/025997.

Device results are set out below in Table 10. It can be seen that external quantum efficiency (EQE), candela per ampere efficiency and lumen per watt efficiency of Inventive Device Example 3 and 4 are all higher than Comparative Device Example 3

The operating voltage of devices comprising Polymer 2 is significantly lower compared to the prior art, resulting in a significant increase in lumen per watt efficiency.

TABLE 10

| | Device performance at 1,000 cd/m² | | | | |
|---|---|---|---|---|---|
| | EQE (%) | Efficiency (Cd/A) | Efficiency (Lm/W) | Drive Voltage (V) | CIE (x, y) | LT50 (h) |
| Comparative Device 3 | 13.1 | 30.9 | 11.0 | 8.8 | 0.460, 0.431 | 4.1 |
| Device Example 3 | 14.1 | 34.0 | 14.4 | 7.5 | 0.442, 0.423 | 1.0 |
| Device Example 4 | 15.2 | 37.0 | 17.4 | 6.6 | 0.462, 0.434 | 3.4 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising a polymer and at least one phosphorescent light-emitting dopant, the polymer comprising a repeat unit of formula (I):

$$—(Ar)_q\text{-Sp-CT-Sp-}(Ar)_q— \quad (I)$$

wherein CT represents a conjugated charge-transporting group; each Ar independently represents an optionally substituted aryl or heteroaryl group; q is at least 1; and each Sp independently represents a spacer group forming a break in conjugation between Ar and CT.

2. A composition according to claim 1 wherein CT represents a hole-transporting group.

3. A composition according to claim 2 wherein CT represents an optionally substituted arylamine group.

4. A composition according to claim 3 wherein CT represents an optionally substituted repeat unit V:

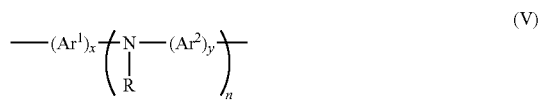

wherein $Ar^1$ and $Ar^2$ in each occurrence are independently selected from optionally substituted aryl or heteroaryl groups, n is greater than or equal to 1, R in each occurrence is the same or different and is H or a substituent, x and y are each independently 1, 2 or 3 and any of $Ar^1$, $Ar^2$ and R may be linked by a direct bond or a divalent linking group.

5. A composition according to claim 4 wherein n is 1 or 2 and R is a substituent.

6. A composition according to claim 1 wherein CT represents an electron-transporting group.

7. A composition according to claim 6 wherein CT comprises a heteroaryl group.

8. A composition according to claim 7 wherein CT represents a compound of formula (II): formula (II):

$$—(Ar^1)_r\text{-Het-}(Ar^2)_r— \quad (II)$$

wherein $Ar^1$ and $Ar^2$ in each occurrence are independently selected from optionally substituted aryl or heteroaryl groups; r is at least 1, and Het represents an optionally substituted heteroaryl group with high electron affinity and high ionisation potential.

9. A composition according to claim 8 wherein r is 1-3.

10. A composition according to claim 8 wherein Het represents triazine or oxadiazole.

11. A composition according to claim 1 wherein each Sp independently represents an alkyl chain wherein one or more non-adjacent C atoms may be replaced with O, S, N, C=O and —COO— and wherein one or more H atoms may be replaced with F, and wherein one or more non-terminal carbon atoms in the alkyl chain may be replaced with optionally substituted arylene or heteroarylene.

12. A composition according to claim 1 wherein each (Ar)q independently represents optionally substituted phenylene, fluorene or pyridine.

13. A composition according to claim 1 wherein the polymer comprises a repeat unit of formula (Ia):

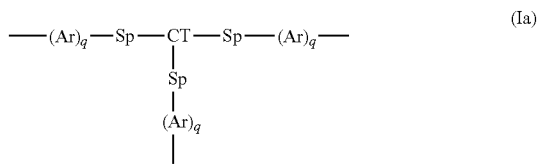

14. A composition according to claim 1 wherein the polymer comprises a repeat unit having at least three linking positions, the repeat unit not being a repeat unit according to formula (I).

15. A composition according to claim 1 wherein the at least one light-emitting phosphorescent dopant is chemically bound to the polymer.

16. A composition according to claim 1 wherein the at least one light-emitting phosphorescent dopant is bound in the main chain of the polymer or bound as a side group or end group of the polymer.

17. A composition comprising a solvent and a composition according to claim 1.

18. An organic light-emitting device comprising an anode, a cathode and a light-emitting layer between the anode and cathode, wherein the light-emitting layer comprises a composition according to claim 1.

19. An organic light-emitting device comprising an anode, a cathode, a light-emitting layer between the anode and cathode, and at least one charge transporting layer between the anode and cathode, wherein the at least one charge transporting layer comprises a composition according to claim 1.

20. A method of forming an organic light-emitting device comprising an anode, a cathode and a light-emitting layer between the anode and cathode, wherein the light-emitting layer comprises a composition according to claim 1, the method comprising the steps of depositing the composition and evaporating the solvent.

21. A composition according to claim 1 wherein CT represents a hole transporting group having an electron affinity of 2.9 eV or lower and an ionization potential of 5.8 eV or lower.

22. A composition according to claim 1 wherein CT represents an electron transporting group having an electron affinity of 3.0 eV or higher and an ionization potential of 5.8 eV or higher.

* * * * *